(12) United States Patent  
Nemecek

(10) Patent No.: US 7,774,190 B1
(45) Date of Patent: *Aug. 10, 2010

(54) SLEEP AND STALL IN AN IN-CIRCUIT EMULATION SYSTEM

(75) Inventor: Craig Nemecek, Seattle, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 1038 days.

This patent is subject to a terminal disclaimer.

(21) Appl. No.: 09/989,777

(22) Filed: Nov. 19, 2001

(51) Int. Cl.
*G06F 9/45* (2006.01)
(52) U.S. Cl. .......................................... 703/23; 714/28
(58) Field of Classification Search .................. 703/23, 703/28, 26; 709/224; 714/28; 716/224
See application file for complete search history.

(56) References Cited

U.S. PATENT DOCUMENTS

| | | |
|---|---|---|
| 3,600,690 A | 8/1971 | White |
| 3,725,804 A | 4/1973 | Langan |
| 3,740,588 A | 6/1973 | Stratton et al. |
| 3,810,036 A | 5/1974 | Bloedom |
| 3,831,113 A | 8/1974 | Ahmed |
| 3,845,328 A | 10/1974 | Hollingsworth |
| 3,940,760 A | 2/1976 | Brokaw |
| 4,061,987 A | 12/1977 | Nagahama |
| 4,134,073 A | 1/1979 | MacGregor |
| 4,138,671 A | 2/1979 | Comer et al. |
| 4,176,258 A | 11/1979 | Jackson ........................ 714/30 |
| 4,250,464 A | 2/1981 | Schade, Jr. |
| 4,272,760 A | 6/1981 | Prazak et al. |
| 4,283,713 A | 8/1981 | Philipp |
| 4,326,135 A | 4/1982 | Jarrett et al. |
| 4,344,067 A | 8/1982 | Lee |
| 4,380,083 A | 4/1983 | Andersson et al. |
| 4,438,404 A | 3/1984 | Philipp |
| 4,475,151 A | 10/1984 | Philipp |

(Continued)

FOREIGN PATENT DOCUMENTS

DE 19710829 A1 9/1998

(Continued)

OTHER PUBLICATIONS

Harrison, C.G. et al. "Xilinx FPGA Design in a Group Environment Using VHDL and Synthesis Tools". Colloquim on Digital Sytem Design Using Synthesis Techniques. Feb. 15, 1996. pp. 5/1-5/4.*

(Continued)

*Primary Examiner*—Paul L Rodriguez
*Assistant Examiner*—Mary C Jacob

(57) ABSTRACT

A method and apparatus for performing sleep and stall operations in a system that includes a device under test and that includes an emulator device that operates to perform a sequence of instructions in lock-step fashion with the device under test. When a first signal is received at the device under test, the device under test initiates the sleep function and turns off its clocks. When the clocks are turned off, the emulator device discontinues execution of the sequence of instructions. When the sleep function has been completed by the device under test a second signal is sent to the emulator device. Execution of the sequence of instructions is resumed when the number of clock signals received at the emulator device since the second signal was received equals a predetermined value.

24 Claims, 8 Drawing Sheets

U.S. PATENT DOCUMENTS

| | | | |
|---|---|---|---|
| 4,497,575 A | 2/1985 | Philipp | |
| 4,608,502 A | 8/1986 | Dijkmans et al. | |
| 4,656,603 A | 4/1987 | Dunn | |
| 4,670,838 A | 6/1987 | Kawata | |
| 4,689,740 A | 8/1987 | Moelands et al. | |
| 4,692,718 A | 9/1987 | Roza et al. | |
| 4,701,907 A | 10/1987 | Collins | |
| 4,727,541 A | 2/1988 | Mori et al. | |
| 4,736,097 A | 4/1988 | Philipp | |
| 4,740,966 A | 4/1988 | Goad | |
| 4,755,766 A | 7/1988 | Metz | |
| 4,757,534 A | 7/1988 | Matyas et al. | 705/56 |
| 4,773,024 A | 9/1988 | Faggin et al. | |
| 4,794,558 A | 12/1988 | Thompson | |
| 4,802,103 A | 1/1989 | Faggin et al. | |
| 4,802,119 A | 1/1989 | Heene et al. | |
| 4,809,345 A | 2/1989 | Tabata et al. | |
| 4,812,684 A | 3/1989 | Yamagiwa et al. | |
| 4,827,401 A | 5/1989 | Hrustich et al. | |
| 4,833,418 A | 5/1989 | Quintus et al. | |
| 4,868,525 A | 9/1989 | Dias | |
| 4,876,534 A | 10/1989 | Mead et al. | |
| 4,878,200 A | 10/1989 | Asghar et al. | |
| 4,879,461 A | 11/1989 | Philipp | |
| 4,885,484 A | 12/1989 | Gray | |
| 4,907,121 A | 3/1990 | Hrassky | |
| 4,935,702 A | 6/1990 | Mead et al. | |
| 4,939,637 A | 7/1990 | Pawloski | |
| 4,942,540 A | 7/1990 | Black et al. | |
| 4,947,169 A | 8/1990 | Smith et al. | |
| 4,953,928 A | 9/1990 | Anderson et al. | |
| 4,962,342 A | 10/1990 | Mead et al. | |
| 4,964,074 A | 10/1990 | Suzuki et al. | |
| 4,969,087 A | 11/1990 | Tanagawa et al. | |
| 4,970,408 A | 11/1990 | Hanke et al. | |
| 4,972,372 A | 11/1990 | Ueno | |
| 4,977,381 A | 12/1990 | Main | |
| 4,980,652 A | 12/1990 | Tarusawa et al. | |
| 4,999,519 A | 3/1991 | Kitsukawa et al. | |
| 5,043,674 A | 8/1991 | Bonaccio et al. | |
| 5,049,758 A | 9/1991 | Mead et al. | |
| 5,050,168 A | 9/1991 | Paterson | |
| 5,053,949 A | 10/1991 | Allison et al. | |
| 5,055,827 A | 10/1991 | Philipp | |
| 5,059,920 A | 10/1991 | Anderson et al. | |
| 5,068,622 A | 11/1991 | Mead et al. | |
| 5,073,759 A | 12/1991 | Mead et al. | |
| 5,083,044 A | 1/1992 | Mead et al. | |
| 5,088,822 A | 2/1992 | Warren | |
| 5,095,284 A | 3/1992 | Mead | |
| 5,097,305 A | 3/1992 | Mead et al. | |
| 5,107,146 A | 4/1992 | El-Ayat | |
| 5,107,149 A | 4/1992 | Platt et al. | |
| 5,109,261 A | 4/1992 | Mead et al. | |
| 5,119,038 A | 6/1992 | Anderson et al. | |
| 5,120,996 A | 6/1992 | Mead et al. | |
| 5,122,800 A | 6/1992 | Philipp | |
| 5,126,685 A | 6/1992 | Platt et al. | |
| 5,127,103 A | 6/1992 | Hill et al. | 714/45 |
| 5,128,871 A | 7/1992 | Schmitz | |
| 5,136,188 A | 8/1992 | Ha et al. | |
| 5,140,197 A | 8/1992 | Grider | |
| 5,142,247 A | 8/1992 | Lada et al. | |
| 5,144,582 A | 9/1992 | Steele | |
| 5,146,106 A | 9/1992 | Anderson et al. | |
| 5,150,079 A | 9/1992 | Williams et al. | |
| 5,155,836 A | 10/1992 | Jordan et al. | |
| 5,159,292 A | 10/1992 | Canfield et al. | |
| 5,159,335 A | 10/1992 | Veneruso | |
| 5,160,899 A | 11/1992 | Anderson et al. | |
| 5,161,124 A | 11/1992 | Love | |
| 5,165,054 A | 11/1992 | Platt et al. | |
| 5,166,562 A | 11/1992 | Allen et al. | |
| 5,175,884 A | 12/1992 | Suarez | |
| 5,179,531 A | 1/1993 | Yamaki | |
| 5,198,817 A | 3/1993 | Walden et al. | |
| 5,200,751 A | 4/1993 | Smith | |
| 5,202,687 A | 4/1993 | Distinti | 341/158 |
| 5,204,549 A | 4/1993 | Platt et al. | |
| 5,206,582 A | 4/1993 | Ekstedt et al. | |
| 5,220,512 A | 6/1993 | Watkins et al. | |
| 5,230,000 A | 7/1993 | Mozingo et al. | |
| 5,235,617 A | 8/1993 | Mallard, Jr. | |
| 5,241,492 A | 8/1993 | Girardeau, Jr. | |
| 5,243,554 A | 9/1993 | Allen et al. | |
| 5,245,262 A | 9/1993 | Moody et al. | |
| 5,248,843 A | 9/1993 | Billings | |
| 5,248,873 A | 9/1993 | Allen et al. | |
| 5,258,760 A | 11/1993 | Moody et al. | |
| 5,260,592 A | 11/1993 | Mead et al. | |
| 5,260,979 A | 11/1993 | Parker et al. | |
| 5,270,963 A | 12/1993 | Allen et al. | |
| 5,276,407 A | 1/1994 | Mead et al. | |
| 5,276,890 A | 1/1994 | Arai | |
| 5,280,199 A | 1/1994 | Itakura | |
| 5,280,202 A | 1/1994 | Chan et al. | |
| 5,289,023 A | 2/1994 | Mead | |
| 5,303,329 A | 4/1994 | Mead et al. | |
| 5,304,955 A | 4/1994 | Atriss et al. | |
| 5,305,017 A | 4/1994 | Gerpheide | |
| 5,305,312 A | 4/1994 | Fornek et al. | |
| 5,307,381 A | 4/1994 | Ahuja | |
| 5,313,618 A | 5/1994 | Pawloski | |
| 5,317,202 A | 5/1994 | Waizman | |
| 5,319,370 A | 6/1994 | Signore et al. | |
| 5,319,771 A | 6/1994 | Takeda | |
| 5,321,828 A | 6/1994 | Phillips et al. | 703/28 |
| 5,324,958 A | 6/1994 | Mead et al. | |
| 5,325,512 A | 6/1994 | Takahashi | 703/28 |
| 5,329,471 A | 7/1994 | Swoboda et al. | |
| 5,331,215 A | 7/1994 | Allen et al. | |
| 5,331,315 A | 7/1994 | Crosette | |
| 5,331,571 A | 7/1994 | Aronoff et al. | 364/490 |
| 5,334,952 A | 8/1994 | Maddy et al. | |
| 5,336,936 A | 8/1994 | Allen et al. | |
| 5,339,213 A | 8/1994 | O'Callaghan | |
| 5,339,262 A | 8/1994 | Rostoker et al. | |
| 5,341,267 A | 8/1994 | Whitten et al. | |
| 5,345,195 A | 9/1994 | Cordoba et al. | |
| 5,349,303 A | 9/1994 | Gerpheide | |
| 5,355,097 A | 10/1994 | Scott et al. | |
| 5,357,626 A | 10/1994 | Johnson et al. | 714/33 |
| 5,361,290 A | 11/1994 | Akiyama | |
| 5,371,524 A | 12/1994 | Lewis et al. | |
| 5,371,860 A | 12/1994 | Mura et al. | |
| 5,371,878 A | 12/1994 | Coker | 703/28 |
| 5,374,787 A | 12/1994 | Miller et al. | |
| 5,378,935 A | 1/1995 | Korhonen et al. | |
| 5,381,515 A | 1/1995 | Platt et al. | |
| 5,384,467 A | 1/1995 | Plimon et al. | |
| 5,384,745 A | 1/1995 | Konishi et al. | |
| 5,384,910 A | 1/1995 | Torres | |
| 5,392,784 A | 2/1995 | Gudaitis | |
| 5,394,522 A | 2/1995 | Sanchez-Frank et al. | |
| 5,396,245 A | 3/1995 | Rempfer | |
| 5,398,261 A | 3/1995 | Marbot | |
| 5,399,922 A | 3/1995 | Kiani et al. | |
| 5,408,194 A | 4/1995 | Steinbach et al. | |
| 5,414,308 A | 5/1995 | Lee et al. | |
| 5,414,380 A | 5/1995 | Floyd et al. | |
| 5,416,895 A | 5/1995 | Anderson et al. | |
| 5,422,823 A | 6/1995 | Agrawal et al. | |
| 5,424,689 A | 6/1995 | Gillig et al. | |
| 5,426,378 A | 6/1995 | Ong | |

| Patent No. | Date | Inventor(s) | Class |
|---|---|---|---|
| 5,426,384 A | 6/1995 | May | |
| 5,428,319 A | 6/1995 | Marvin et al. | |
| 5,430,395 A | 7/1995 | Ichimaru | |
| 5,430,687 A | 7/1995 | Hung et al. | |
| 5,430,734 A | 7/1995 | Gilson | |
| 5,432,476 A | 7/1995 | Tran | |
| 5,438,672 A | 8/1995 | Dey | |
| 5,440,305 A | 8/1995 | Signore et al. | |
| 5,451,887 A | 9/1995 | El-Avat et al. | |
| 5,455,525 A | 10/1995 | Ho et al. | |
| 5,455,731 A | 10/1995 | Parkinson | |
| 5,455,927 A | 10/1995 | Huang | |
| 5,457,410 A | 10/1995 | Ting | |
| 5,457,479 A | 10/1995 | Cheng | |
| 5,463,591 A | 10/1995 | Aimoto et al. | |
| 5,479,603 A | 12/1995 | Stone et al. | |
| 5,479,643 A | 12/1995 | Bhaskar et al. | |
| 5,479,652 A | 12/1995 | Dreyer et al. | |
| 5,481,471 A | 1/1996 | Naglestad et al. | |
| 5,488,204 A | 1/1996 | Mead et al. | |
| 5,491,458 A | 2/1996 | McCune | |
| 5,493,246 A | 2/1996 | Anderson | |
| 5,493,723 A | 2/1996 | Beck et al. | 703/28 |
| 5,495,077 A | 2/1996 | Miller et al. | |
| 5,495,593 A | 2/1996 | Elmer et al. | |
| 5,495,594 A | 2/1996 | MacKenna et al. | |
| 5,499,192 A | 3/1996 | Knapp et al. | |
| 5,517,198 A | 5/1996 | McEwan | |
| 5,519,854 A | 5/1996 | Watt | |
| 5,521,529 A | 5/1996 | Agrawal et al. | |
| 5,530,444 A | 6/1996 | Tice et al. | |
| 5,530,673 A | 6/1996 | Tobita et al. | |
| 5,530,813 A | 6/1996 | Paulsen et al. | |
| 5,537,057 A | 7/1996 | Leong et al. | |
| 5,541,878 A | 7/1996 | LeMoncheck et al. | |
| 5,543,588 A | 8/1996 | Bisset et al. | |
| 5,543,590 A | 8/1996 | Gillespie et al. | |
| 5,543,591 A | 8/1996 | Gillespie et al. | |
| 5,544,067 A | 8/1996 | Rostoker et al. | |
| 5,544,311 A | 8/1996 | Harenberg et al. | |
| 5,546,433 A | 8/1996 | Tran et al. | |
| 5,546,562 A | 8/1996 | Patel | 703/14 |
| 5,552,725 A | 9/1996 | Ray et al. | |
| 5,552,748 A | 9/1996 | O'Shaughnessy | |
| 5,554,951 A | 9/1996 | Gough | |
| 5,555,452 A | 9/1996 | Callaway et al. | |
| 5,555,907 A | 9/1996 | Philipp | |
| 5,557,762 A | 9/1996 | Okuaki et al. | |
| 5,559,502 A | 9/1996 | Schutte | |
| 5,559,996 A | 9/1996 | Fujioka | 703/23 |
| 5,563,526 A | 10/1996 | Hastings et al. | |
| 5,563,529 A | 10/1996 | Seltzer et al. | |
| 5,564,010 A | 10/1996 | Henry et al. | |
| 5,564,108 A | 10/1996 | Hunsaker et al. | |
| 5,565,658 A | 10/1996 | Gerpheide et al. | |
| 5,566,702 A | 10/1996 | Philipp | |
| 5,572,665 A * | 11/1996 | Nakabayashi | 714/28 |
| 5,572,719 A | 11/1996 | Biesterfeldt | |
| 5,574,678 A | 11/1996 | Gorecki | |
| 5,574,852 A | 11/1996 | Bakker et al. | |
| 5,574,892 A | 11/1996 | Christensen | 703/28 |
| 5,579,353 A | 11/1996 | Parmenter et al. | |
| 5,587,945 A | 12/1996 | Lin et al. | |
| 5,587,957 A | 12/1996 | Kowalczyk et al. | 365/230.03 |
| 5,590,354 A | 12/1996 | Klapproth et al. | 714/30 |
| 5,594,388 A | 1/1997 | O'Shaughnessy et al. | |
| 5,594,734 A | 1/1997 | Worsley et al. | |
| 5,594,890 A | 1/1997 | Yamaura et al. | |
| 5,600,262 A | 2/1997 | Kolze | |
| 5,604,466 A | 2/1997 | Dreps et al. | |
| 5,608,892 A | 3/1997 | Wakerly | |
| 5,614,861 A | 3/1997 | Harada | |
| 5,625,316 A | 4/1997 | Chambers et al. | |
| 5,629,857 A | 5/1997 | Brennan | |
| 5,629,891 A | 5/1997 | LeMoncheck et al. | |
| 5,630,052 A | 5/1997 | Shah | 714/38 |
| 5,630,057 A | 5/1997 | Hait | |
| 5,630,102 A | 5/1997 | Johnson et al. | 703/28 |
| 5,631,577 A | 5/1997 | Freidin et al. | |
| 5,633,766 A | 5/1997 | Hase et al. | |
| 5,642,295 A | 6/1997 | Smayling | |
| 5,646,544 A | 7/1997 | Iadanza | |
| 5,646,901 A | 7/1997 | Sharpe-Geisler et al. | |
| 5,648,642 A | 7/1997 | Miller et al. | |
| 5,651,035 A | 7/1997 | Tozun | |
| 5,663,900 A | 9/1997 | Bhandari et al. | 364/578 |
| 5,663,965 A | 9/1997 | Seymour | |
| 5,664,199 A | 9/1997 | Kuwahara | |
| 5,670,915 A | 9/1997 | Cooper et al. | |
| 5,673,198 A | 9/1997 | Lawman et al. | |
| 5,675,825 A | 10/1997 | Dreyer et al. | |
| 5,677,691 A | 10/1997 | Hosticka et al. | |
| 5,680,070 A | 10/1997 | Anderson et al. | |
| 5,682,032 A | 10/1997 | Philipp | |
| 5,684,434 A | 11/1997 | Mann et al. | |
| 5,684,952 A | 11/1997 | Stein | |
| 5,686,844 A | 11/1997 | Hull et al. | |
| 5,689,195 A | 11/1997 | Cliff et al. | |
| 5,689,196 A | 11/1997 | Schutte | |
| 5,691,664 A | 11/1997 | Anderson et al. | |
| 5,691,898 A | 11/1997 | Rosenberg et al. | 700/85 |
| 5,694,063 A | 12/1997 | Burlison et al. | |
| 5,696,952 A | 12/1997 | Pontarelli | |
| 5,699,024 A | 12/1997 | Manlove et al. | |
| 5,703,871 A | 12/1997 | Pope et al. | |
| 5,706,453 A | 1/1998 | Cheng et al. | |
| 5,708,798 A | 1/1998 | Lynch et al. | |
| 5,710,906 A | 1/1998 | Ghosh et al. | |
| 5,712,969 A | 1/1998 | Zimmermann et al. | |
| 5,724,009 A | 3/1998 | Collins et al. | |
| 5,727,170 A | 3/1998 | Mitchell et al. | |
| 5,729,704 A | 3/1998 | Stone et al. | |
| 5,730,165 A | 3/1998 | Philipp | |
| 5,732,277 A | 3/1998 | Kodosky et al. | |
| 5,734,272 A | 3/1998 | Belot et al. | |
| 5,734,334 A | 3/1998 | Hsieh et al. | |
| 5,737,557 A | 4/1998 | Sullivan | |
| 5,737,760 A | 4/1998 | Grimmer et al. | |
| 5,745,011 A | 4/1998 | Scott | |
| 5,748,048 A | 5/1998 | Moyal | |
| 5,748,875 A | 5/1998 | Tzori | 714/29 |
| 5,752,013 A | 5/1998 | Christensen et al. | 712/227 |
| 5,754,552 A | 5/1998 | Allmond et al. | |
| 5,754,826 A | 5/1998 | Gamal et al. | |
| 5,757,368 A | 5/1998 | Gerpheide et al. | |
| 5,758,058 A | 5/1998 | Milburn | |
| 5,761,128 A | 6/1998 | Watanabe | |
| 5,763,909 A | 6/1998 | Mead et al. | |
| 5,764,714 A | 6/1998 | Stansell et al. | |
| 5,767,457 A | 6/1998 | Gerpheide et al. | |
| 5,774,704 A | 6/1998 | Williams | |
| 5,777,399 A | 7/1998 | Shibuya | |
| 5,781,030 A | 7/1998 | Agrawal et al. | |
| 5,781,747 A | 7/1998 | Kametani | |
| 5,784,545 A | 7/1998 | Anderson et al. | |
| 5,790,957 A | 8/1998 | Heidari | |
| 5,796,183 A | 8/1998 | Hourmand | |
| 5,799,176 A | 8/1998 | Kapusta et al. | |
| 5,802,073 A | 9/1998 | Platt | |
| 5,802,290 A | 9/1998 | Casselman | 709/201 |
| 5,805,792 A | 9/1998 | Swoboda et al. | 714/28 |
| 5,805,897 A | 9/1998 | Glowny | |
| 5,808,883 A | 9/1998 | Hawkes | |
| 5,811,987 A | 9/1998 | Ashmore, Jr. et al. | |
| 5,812,698 A | 9/1998 | Platt et al. | |
| 5,818,254 A | 10/1998 | Agrawal et al. | |

| | | | | | | |
|---|---|---|---|---|---|---|
| 5,818,444 A | 10/1998 | Alimpich et al. | | 5,963,503 A | 10/1999 | Lee |
| 5,819,028 A | 10/1998 | Manghirmalani et al. | | 5,964,893 A | 10/1999 | Circello et al. ................ 714/39 |
| 5,822,387 A | 10/1998 | Mar | | 5,966,027 A | 10/1999 | Kapusta et al. |
| 5,822,531 A | 10/1998 | Gorczyca et al. | | 5,966,532 A | 10/1999 | McDonald et al. |
| 5,828,693 A | 10/1998 | Mays et al. | | 5,968,135 A | 10/1999 | Teramoto et al. |
| 5,838,583 A | 11/1998 | Varadarajan et al. | | 5,969,513 A | 10/1999 | Clark |
| 5,841,078 A | 11/1998 | Miller et al. | | 5,969,632 A | 10/1999 | Diamant et al. |
| 5,841,996 A | 11/1998 | Nolan et al. | | 5,973,368 A | 10/1999 | Pearce et al. |
| 5,844,256 A | 12/1998 | Higashino | | 5,974,235 A | 10/1999 | Nunally et al. |
| 5,848,285 A | 12/1998 | Kapusta et al. | | 5,977,791 A | 11/1999 | Veenstra |
| 5,850,156 A | 12/1998 | Wittman | | 5,978,584 A | 11/1999 | Nishibata et al. ............. 717/134 |
| 5,852,733 A | 12/1998 | Chien et al. | | 5,978,937 A | 11/1999 | Miyamori et al. |
| 5,854,625 A | 12/1998 | Frisch et al. | | 5,982,105 A | 11/1999 | Masters |
| 5,857,109 A | 1/1999 | Taylor | | 5,982,229 A | 11/1999 | Wong et al. |
| 5,861,583 A | 1/1999 | Schediwy et al. | | 5,982,241 A | 11/1999 | Nguyen et al. |
| 5,861,875 A | 1/1999 | Gerpheide | | 5,983,277 A | 11/1999 | Heile et al. |
| 5,864,242 A | 1/1999 | Allen et al. | | 5,986,479 A | 11/1999 | Mohan |
| 5,864,392 A | 1/1999 | Winklhofer et al. | | 5,987,246 A | 11/1999 | Thomsen et al. |
| 5,867,046 A | 2/1999 | Sugasawa | | 5,988,902 A | 11/1999 | Holehan |
| 5,867,399 A | 2/1999 | Rostoker et al. | | 5,994,939 A | 11/1999 | Johnson et al. |
| 5,869,979 A | 2/1999 | Bocchino | | 5,996,032 A | 11/1999 | Baker |
| 5,870,004 A | 2/1999 | Lu | | 5,999,725 A | 12/1999 | Barbier et al. ................ 703/28 |
| 5,870,309 A | 2/1999 | Lawman | | 6,002,268 A | 12/1999 | Sasaki et al. |
| 5,870,345 A | 2/1999 | Stecker | | 6,002,398 A | 12/1999 | Wilson |
| 5,872,464 A | 2/1999 | Gradinariu | | 6,003,054 A | 12/1999 | Oshima et al. |
| 5,874,958 A | 2/1999 | Ludolph | | 6,003,133 A | 12/1999 | Moughanni et al. |
| 5,875,293 A | 2/1999 | Bell et al. | | 6,005,814 A | 12/1999 | Mulholland et al. |
| 5,877,656 A | 3/1999 | Mann et al. | | 6,005,904 A | 12/1999 | Knapp et al. |
| 5,878,425 A | 3/1999 | Redpath | | 6,008,685 A | 12/1999 | Kunst |
| 5,880,411 A | 3/1999 | Gillespie et al. | | 6,008,703 A | 12/1999 | Perrott et al. |
| 5,880,598 A | 3/1999 | Duong | | 6,009,270 A | 12/1999 | Mann ........................ 717/128 |
| 5,883,623 A | 3/1999 | Cseri | | 6,009,496 A | 12/1999 | Tsai |
| 5,886,582 A | 3/1999 | Stansell | | 6,011,407 A | 1/2000 | New |
| 5,889,236 A | 3/1999 | Gillespie et al. | | 6,012,835 A | 1/2000 | Thompson et al. |
| 5,889,723 A | 3/1999 | Pascucci | | 6,014,135 A | 1/2000 | Fernandes |
| 5,889,936 A | 3/1999 | Chan | | 6,014,509 A | 1/2000 | Furtek et al. |
| 5,889,988 A | 3/1999 | Held ........................ 718/103 | | 6,016,554 A | 1/2000 | Skrovan et al. ............... 741/25 |
| 5,894,226 A | 4/1999 | Koyama | | 6,016,563 A | 1/2000 | Fleisher ..................... 714/725 |
| 5,894,243 A | 4/1999 | Hwang | | 6,018,559 A | 1/2000 | Azegami et al. |
| 5,894,565 A | 4/1999 | Furtek et al. | | 6,023,422 A | 2/2000 | Allen et al. |
| 5,895,494 A | 4/1999 | Scalzi et al. | | 6,023,565 A | 2/2000 | Lawman et al. |
| 5,896,068 A | 4/1999 | Moyal | | 6,026,134 A | 2/2000 | Duffy et al. |
| 5,896,330 A | 4/1999 | Gibson | | 6,026,501 A | 2/2000 | Hohl et al. |
| 5,898,345 A | 4/1999 | Namura et al. | | 6,028,271 A | 2/2000 | Gillespie et al. |
| 5,900,780 A | 5/1999 | Hirose et al. | | 6,028,959 A | 2/2000 | Wang et al. |
| 5,901,062 A | 5/1999 | Burch et al. | | 6,031,365 A | 2/2000 | Sharpe-Geisler |
| 5,903,718 A | 5/1999 | Marik | | 6,032,268 A | 2/2000 | Swoboda et al. |
| 5,905,398 A | 5/1999 | Todsen et al. | | 6,034,538 A | 3/2000 | Abramovici ................. 326/38 |
| 5,911,059 A * | 6/1999 | Profit, Jr. ..................... 703/23 | | 6,037,807 A | 3/2000 | Wu et al. |
| 5,914,465 A | 6/1999 | Allen et al. | | 6,038,551 A | 3/2000 | Barlow et al. |
| 5,914,633 A | 6/1999 | Comino et al. | | 6,041,406 A | 3/2000 | Mann |
| 5,914,708 A | 6/1999 | LaGrange et al. | | 6,043,695 A | 3/2000 | O'Sullivan |
| 5,917,356 A | 6/1999 | Casal et al. | | 6,043,719 A | 3/2000 | Lin et al. |
| 5,920,310 A | 7/1999 | Faggin et al. | | 6,049,223 A | 4/2000 | Lytle et al. |
| 5,923,264 A | 7/1999 | Lavelle et al. | | 6,049,225 A | 4/2000 | Huang et al. |
| 5,926,566 A | 7/1999 | Wang et al. | | 6,051,772 A | 4/2000 | Cameron et al. |
| 5,929,710 A | 7/1999 | Bien | | 6,052,035 A | 4/2000 | Nolan et al. |
| 5,930,150 A | 7/1999 | Cohen et al. | | 6,052,524 A | 4/2000 | Pauna |
| 5,933,023 A | 8/1999 | Young | | 6,057,705 A | 5/2000 | Wojewoda et al. |
| 5,933,356 A | 8/1999 | Rostoker et al. | | 6,058,263 A * | 5/2000 | Voth ........................... 703/25 |
| 5,933,816 A | 8/1999 | Zeanah et al. | | 6,058,452 A | 5/2000 | Rangasayee et al. |
| 5,935,266 A | 8/1999 | Thurnhofer et al. | | 6,061,511 A | 5/2000 | Martantz et al. |
| 5,939,904 A | 8/1999 | Fetterman et al. | | 6,066,961 A | 5/2000 | Lee et al. |
| 5,939,949 A | 8/1999 | Olgaard et al. | | 6,070,003 A | 5/2000 | Gove et al. |
| 5,941,991 A | 8/1999 | Kageshima | | 6,072,803 A | 6/2000 | Allmond et al. |
| 5,942,733 A | 8/1999 | Allen et al. | | 6,075,941 A | 6/2000 | Itoh et al. ..................... 717/128 |
| 5,943,052 A | 8/1999 | Allen et al. | | 6,079,985 A | 6/2000 | Wohl et al. |
| 5,945,878 A | 8/1999 | Westwick et al. | | 6,081,140 A | 6/2000 | King |
| 5,949,632 A | 9/1999 | Barreras, Sr. et al. | | 6,094,730 A | 7/2000 | Lopez et al. ................. 714/28 |
| 5,952,888 A | 9/1999 | Scott | | 6,097,211 A | 8/2000 | Couts-Martin et al. |
| 5,959,871 A | 9/1999 | Pierzchala et al. | | 6,097,432 A | 8/2000 | Mead et al. |
| 5,963,075 A | 10/1999 | Hiiragizawa | | 6,101,457 A | 8/2000 | Barch et al. |
| 5,963,105 A | 10/1999 | Nguyen | | 6,101,617 A | 8/2000 | Burckhartt et al. |

| | | |
|---|---|---|
| 6,104,217 A | 8/2000 | Magana |
| 6,104,325 A | 8/2000 | Liaw et al. |
| 6,107,769 A | 8/2000 | Saylor et al. |
| 6,107,826 A | 8/2000 | Young et al. ............... 326/41 |
| 6,107,882 A | 8/2000 | Gabara et al. |
| 6,110,223 A | 8/2000 | Southgate et al. |
| 6,111,431 A | 8/2000 | Estrada |
| 6,112,264 A | 8/2000 | Beasley et al. |
| 6,121,791 A | 9/2000 | Abbott |
| 6,121,805 A | 9/2000 | Thamsirianunt et al. |
| 6,121,965 A | 9/2000 | Kenny et al. |
| 6,125,416 A | 9/2000 | Warren |
| 6,130,548 A | 10/2000 | Koifman |
| 6,130,551 A | 10/2000 | Agrawal et al. |
| 6,130,552 A | 10/2000 | Jefferson et al. |
| 6,133,773 A | 10/2000 | Garlepp et al. |
| 6,134,181 A | 10/2000 | Landry |
| 6,134,516 A | 10/2000 | Wang et al. |
| 6,137,308 A | 10/2000 | Nayak |
| 6,140,853 A | 10/2000 | Lo |
| 6,141,376 A | 10/2000 | Shaw |
| 6,141,764 A | 10/2000 | Ezell |
| 6,144,327 A | 11/2000 | Distinti et al. ............... 341/126 |
| 6,148,104 A | 11/2000 | Wang et al. |
| 6,148,441 A | 11/2000 | Woodward |
| 6,149,299 A | 11/2000 | Aslan et al. |
| 6,150,866 A | 11/2000 | Eto et al. |
| 6,154,064 A | 11/2000 | Proebsting |
| 6,157,024 A | 12/2000 | Chapdelaine et al. |
| 6,157,270 A | 12/2000 | Tso |
| 6,161,199 A | 12/2000 | Szeto et al. ............... 714/30 |
| 6,166,367 A | 12/2000 | Cho |
| 6,166,960 A | 12/2000 | Marneweck et al. |
| 6,167,077 A | 12/2000 | Ducaroir |
| 6,167,559 A | 12/2000 | Furtek et al. |
| 6,169,383 B1 | 1/2001 | Johnson |
| 6,172,571 B1 | 1/2001 | Moyal et al. |
| 6,173,419 B1 | 1/2001 | Barnett ............... 714/28 |
| 6,175,914 B1 | 1/2001 | Mann |
| 6,175,949 B1 | 1/2001 | Gristede et al. |
| 6,181,163 B1 | 1/2001 | Agrawal et al. |
| 6,183,131 B1 | 2/2001 | Holloway et al. |
| 6,185,127 B1 | 2/2001 | Myers et al. |
| 6,185,450 B1 | 2/2001 | Seguine et al. |
| 6,185,522 B1 | 2/2001 | Bakker ............... 703/28 |
| 6,185,703 B1 | 2/2001 | Guddat et al. |
| 6,185,732 B1 | 2/2001 | Mann et al. |
| 6,188,228 B1 | 2/2001 | Philipp |
| 6,188,241 B1 | 2/2001 | Gauthier et al. |
| 6,188,381 B1 | 2/2001 | van der Wal et al. |
| 6,188,391 B1 | 2/2001 | Seely et al. |
| 6,188,975 B1 | 2/2001 | Gay |
| 6,191,603 B1 | 2/2001 | Muradali et al. |
| 6,191,660 B1 | 2/2001 | Mar et al. |
| 6,191,998 B1 | 2/2001 | Reddy et al. |
| 6,192,431 B1 | 2/2001 | Dabral et al. |
| 6,198,303 B1 | 3/2001 | Rangasayee |
| 6,201,407 B1 | 3/2001 | Kapusta et al. |
| 6,201,829 B1 | 3/2001 | Schneider |
| 6,202,044 B1 | 3/2001 | Tzori ............... 703/28 |
| 6,204,687 B1 | 3/2001 | Schultz et al. |
| 6,205,574 B1 | 3/2001 | Dellinger et al. |
| 6,208,572 B1 | 3/2001 | Adams et al. |
| 6,211,708 B1 | 4/2001 | Klemmer |
| 6,211,715 B1 | 4/2001 | Terauchi |
| 6,211,741 B1 | 4/2001 | Dalmia |
| 6,215,352 B1 | 4/2001 | Sudo |
| 6,219,729 B1 | 4/2001 | Keats et al. |
| 6,222,528 B1 | 4/2001 | Gerpheide et al. |
| 6,223,144 B1 | 4/2001 | Barnett et al. ............... 703/22 |
| 6,223,147 B1 | 4/2001 | Bowers |
| 6,223,272 B1 | 4/2001 | Coehlo et al. ............... 712/1 |
| RE37,195 E | 5/2001 | Kean |
| 6,225,866 B1 | 5/2001 | Kubota et al. |
| 6,236,242 B1 | 5/2001 | Hedberg |
| 6,236,275 B1 | 5/2001 | Dent |
| 6,236,278 B1 | 5/2001 | Olgaard |
| 6,236,593 B1 | 5/2001 | Hong et al. |
| 6,239,389 B1 | 5/2001 | Allen et al. |
| 6,239,798 B1 | 5/2001 | Ludolph et al. |
| 6,240,375 B1 | 5/2001 | Sonoda |
| 6,246,258 B1 | 6/2001 | Lesea |
| 6,246,410 B1 | 6/2001 | Bergeron et al. |
| 6,249,167 B1 | 6/2001 | Oguchi et al. |
| 6,249,447 B1 | 6/2001 | Boylan et al. |
| 6,253,754 B1 | 7/2001 | Ward |
| 6,262,717 B1 | 7/2001 | Donohue et al. |
| 6,263,302 B1 | 7/2001 | Hellestrand et al. |
| 6,263,339 B1 | 7/2001 | Hirsch |
| 6,263,484 B1 | 7/2001 | Yang |
| 6,271,679 B1 | 8/2001 | McClintock et al. |
| 6,272,646 B1 | 8/2001 | Rangasayee et al. |
| 6,275,117 B1 | 8/2001 | Abugharbieh et al. |
| 6,278,568 B1 | 8/2001 | Cloke et al. |
| 6,280,391 B1 | 8/2001 | Olson et al. |
| 6,281,753 B1 | 8/2001 | Corsi et al. |
| 6,282,547 B1 | 8/2001 | Hirsch |
| 6,282,551 B1 | 8/2001 | Anderson et al. |
| 6,286,127 B1 | 9/2001 | King et al. |
| 6,288,707 B1 | 9/2001 | Philipp |
| 6,289,300 B1 | 9/2001 | Brannick et al. ............... 703/28 |
| 6,289,478 B1 | 9/2001 | Kitagaki |
| 6,289,489 B1 | 9/2001 | Bold et al. |
| 6,292,028 B1 | 9/2001 | Tomita |
| 6,294,932 B1 | 9/2001 | Watarai |
| 6,294,962 B1 | 9/2001 | Mar |
| 6,298,320 B1 | 10/2001 | Buckmaster et al. ............... 703/28 |
| 6,304,014 B1 | 10/2001 | England et al. |
| 6,304,101 B1 | 10/2001 | Nishihara |
| 6,304,790 B1 | 10/2001 | Nakamura et al. |
| 6,307,413 B1 | 10/2001 | Dalmia et al. |
| 6,310,521 B1 | 10/2001 | Dalmia |
| 6,310,611 B1 | 10/2001 | Caldwell |
| 6,311,149 B1 | 10/2001 | Ryan et al. |
| 7,406,674 B1 | 10/2001 | Ogami et al. |
| 6,314,530 B1 | 11/2001 | Mann |
| 6,320,184 B1 | 11/2001 | Winklhofer et al. |
| 6,320,282 B1 | 11/2001 | Caldwell |
| 6,321,369 B1 | 11/2001 | Heile et al. |
| 6,323,846 B1 | 11/2001 | Westerman et al. |
| 6,324,628 B1 | 11/2001 | Chan |
| 6,326,859 B1 | 12/2001 | Goldman et al. |
| 6,332,137 B1 | 12/2001 | Hori et al. |
| 6,332,201 B1 | 12/2001 | Chin et al. |
| 6,337,579 B1 | 1/2002 | Mochida |
| 6,338,109 B1 | 1/2002 | Snyder et al. |
| 6,339,815 B1 | 1/2002 | Feng et al. |
| 6,342,907 B1 | 1/2002 | Petty et al. |
| 6,345,383 B1 | 2/2002 | Ueki |
| 6,347,395 B1 | 2/2002 | Payne et al. ............... 716/18 |
| 6,351,789 B1 | 2/2002 | Green |
| 6,353,452 B1 | 3/2002 | Hamada et al. |
| 6,355,980 B1 | 3/2002 | Callahan |
| 6,356,862 B2 | 3/2002 | Bailey ............... 703/16 |
| 6,356,958 B1 | 3/2002 | Lin |
| 6,356,960 B1 | 3/2002 | Jones et al. |
| 6,359,950 B2 | 3/2002 | Gossmann et al. |
| 6,362,697 B1 | 3/2002 | Pulvirenti |
| 6,366,174 B1 | 4/2002 | Berry et al. |
| 6,366,300 B1 | 4/2002 | Ohara et al. |
| 6,366,874 B1 | 4/2002 | Lee et al. |
| 6,366,878 B1 | 4/2002 | Grunert ............... 703/28 |
| 6,369,660 B1 | 4/2002 | Wei |
| 6,371,878 B1 | 4/2002 | Bowen |
| 6,373,954 B1 | 4/2002 | Malcolm et al. |
| 6,374,370 B1 | 4/2002 | Bockhaus et al. ............... 714/39 |

| | | |
|---|---|---|
| 6,377,009 B1 | 4/2002 | Philipp |
| 6,377,575 B1 | 4/2002 | Mullaney et al. |
| 6,377,646 B1 | 4/2002 | Sha |
| 6,380,811 B1 | 4/2002 | Zarubinsky et al. |
| 6,380,929 B1 | 4/2002 | Platt |
| 6,380,931 B1 | 4/2002 | Gillespie et al. |
| 6,384,947 B1 | 5/2002 | Ackerman et al. |
| 6,385,742 B1 | 5/2002 | Kirsh et al. .................. 714/39 |
| 6,388,109 B1 | 5/2002 | Schwarz et al. |
| 6,388,464 B1 | 5/2002 | Lacey et al. |
| 6,396,302 B2 | 5/2002 | New et al. |
| 6,396,657 B1 | 5/2002 | Sun et al. |
| 6,397,232 B1 | 5/2002 | Cheng-Hung et al. |
| 6,404,204 B1 | 6/2002 | Farruggia et al. |
| 6,404,445 B1 | 6/2002 | Galea et al. |
| 6,407,953 B1 | 6/2002 | Cleeves |
| 6,408,432 B1 | 6/2002 | Herrmann et al. |
| 6,411,665 B1 | 6/2002 | Chan et al. |
| 6,411,974 B1 | 6/2002 | Graham et al. |
| 6,414,671 B1 | 7/2002 | Gillespie et al. |
| 6,421,698 B1 | 7/2002 | Hong |
| 6,425,109 B1 | 7/2002 | Choukalos et al. |
| 6,429,882 B1 | 8/2002 | Abdelnur et al. |
| 6,430,305 B1 | 8/2002 | Decker |
| 6,433,645 B1 | 8/2002 | Mann et al. |
| 6,434,187 B1 | 8/2002 | Beard |
| 6,437,805 B1 | 8/2002 | Sojoodi et al. |
| 6,438,565 B1 | 8/2002 | Ammirato et al. |
| 6,438,735 B1 | 8/2002 | McElvain et al. |
| 6,438,738 B1 | 8/2002 | Elayda |
| 6,441,073 B1 | 8/2002 | Tanaka et al. |
| 6,445,211 B1 | 9/2002 | Saripella |
| 6,449,628 B1 | 9/2002 | Wasson |
| 6,449,755 B1 | 9/2002 | Beausang et al. |
| 6,452,437 B1 | 9/2002 | Takeuchi et al. |
| 6,452,514 B1 | 9/2002 | Philipp |
| 6,453,175 B2 | 9/2002 | Mizell et al. |
| 6,453,461 B1 | 9/2002 | Chaiken |
| 6,456,304 B1 | 9/2002 | Angiulo et al. |
| 6,457,355 B1 | 10/2002 | Philipp |
| 6,457,479 B1 | 10/2002 | Zhuang et al. |
| 6,460,172 B1 | 10/2002 | Insenser Farre et al. ....... 716/17 |
| 6,463,488 B1 | 10/2002 | San Juan |
| 6,466,036 B1 | 10/2002 | Philipp |
| 6,466,078 B1 | 10/2002 | Stiff |
| 6,466,898 B1 * | 10/2002 | Chan ........................ 703/17 |
| 6,473,069 B1 | 10/2002 | Gerpheide |
| 6,477,691 B1 | 11/2002 | Bergamashi/Rab et al. |
| 6,480,921 B1 | 11/2002 | Mansoorian et al. |
| 6,483,343 B1 | 11/2002 | Faith et al. |
| 6,487,700 B1 | 11/2002 | Fukushima ................... 716/4 |
| 6,489,899 B1 | 12/2002 | Ely et al. |
| 6,490,213 B1 | 12/2002 | Mu et al. |
| 6,492,834 B1 | 12/2002 | Lytle et al. |
| 6,498,720 B2 | 12/2002 | Glad |
| 6,499,134 B1 | 12/2002 | Buffet et al. |
| 6,499,359 B1 | 12/2002 | Washeleski et al. |
| 6,504,403 B2 | 1/2003 | Bangs et al. |
| 6,507,214 B1 | 1/2003 | Snyder |
| 6,507,215 B1 | 1/2003 | Piasecki et al. |
| 6,507,857 B1 | 1/2003 | Yalcinalp |
| 6,509,758 B2 | 1/2003 | Piasecki et al. |
| 6,512,395 B1 | 1/2003 | Lacey et al. |
| 6,516,428 B2 | 2/2003 | Wenzel et al. ................. 714/28 |
| 6,522,128 B1 | 2/2003 | Ely et al. |
| 6,523,416 B2 | 2/2003 | Takagi et al. |
| 6,525,593 B1 | 2/2003 | Mar |
| 6,529,791 B1 | 3/2003 | Takagi |
| 6,530,065 B1 | 3/2003 | McDonald et al. |
| 6,534,970 B1 | 3/2003 | Ely et al. |
| 6,535,200 B2 | 3/2003 | Philipp |
| 6,535,946 B1 | 3/2003 | Bryant et al. |
| 6,536,028 B1 | 3/2003 | Katsioulas et al. |
| 6,539,534 B1 | 3/2003 | Bennett |
| 6,542,025 B1 | 4/2003 | Kutz et al. |
| 6,542,844 B1 | 4/2003 | Hanna |
| 6,553,057 B1 | 4/2003 | Sha et al. |
| 6,554,469 B1 | 4/2003 | Thomson et al. |
| 6,557,164 B1 | 4/2003 | Faustini |
| 6,559,685 B2 | 5/2003 | Green |
| 6,560,306 B1 | 5/2003 | Duffy et al. |
| 6,560,699 B1 | 5/2003 | Konkle |
| 6,563,391 B1 | 5/2003 | Mar |
| 6,564,179 B1 | 5/2003 | Belhaj ........................ 703/26 |
| 6,566,961 B2 | 5/2003 | Dasgupta et al. |
| 6,567,426 B1 | 5/2003 | van Hook et al. |
| 6,567,932 B2 | 5/2003 | Edwards et al. |
| 6,570,557 B1 | 5/2003 | Westerman et al. |
| 6,571,331 B1 | 5/2003 | Henry et al. |
| 6,574,590 B1 | 6/2003 | Kershaw et al. |
| 6,574,739 B1 | 6/2003 | Kung et al. |
| 6,575,373 B1 | 6/2003 | Nakano |
| 6,577,258 B2 | 6/2003 | Ruha et al. |
| 6,578,174 B2 | 6/2003 | Zizzo |
| 6,580,329 B2 | 6/2003 | Sander |
| 6,581,191 B1 | 6/2003 | Schubert et al. ................. 716/4 |
| 6,587,093 B1 | 7/2003 | Shaw et al. |
| 6,587,995 B1 | 7/2003 | Duboc et al. |
| 6,588,004 B1 | 7/2003 | Southgate et al. |
| 6,590,422 B1 | 7/2003 | Dillon |
| 6,590,517 B1 | 7/2003 | Swanson |
| 6,591,369 B1 | 7/2003 | Edwards et al. |
| 6,592,626 B1 | 7/2003 | Bauchot et al. |
| 6,594,799 B1 | 7/2003 | Robertson et al. |
| 6,597,212 B1 | 7/2003 | Wang et al. |
| 6,597,824 B2 | 7/2003 | Newberg et al. |
| 6,598,178 B1 | 7/2003 | Yee et al. |
| 6,600,346 B1 | 7/2003 | Macaluso |
| 6,600,351 B2 | 7/2003 | Bisanti et al. |
| 6,600,575 B1 | 7/2003 | Kohara |
| 6,601,189 B1 | 7/2003 | Edwards et al. |
| 6,601,236 B1 | 7/2003 | Curtis |
| 6,603,330 B1 | 8/2003 | Snyder |
| 6,603,348 B1 | 8/2003 | Preuss et al. |
| 6,604,179 B2 | 8/2003 | Volk et al. |
| 6,606,731 B1 | 8/2003 | Baum et al. |
| 6,608,472 B1 | 8/2003 | Kutz et al. |
| 6,610,936 B2 | 8/2003 | Gillespie et al. |
| 6,611,220 B1 | 8/2003 | Snyder |
| 6,611,276 B1 | 8/2003 | Muratori et al. |
| 6,611,856 B1 | 8/2003 | Liao et al. |
| 6,611,952 B1 | 8/2003 | Prakash et al. |
| 6,613,098 B1 | 9/2003 | Sorge et al. |
| 6,614,260 B1 | 9/2003 | Welch et al. |
| 6,614,320 B1 | 9/2003 | Sullam et al. |
| 6,614,374 B1 | 9/2003 | Gustavsson et al. |
| 6,614,458 B1 | 9/2003 | Lambert et al. |
| 6,617,888 B2 | 9/2003 | Volk |
| 6,618,854 B1 * | 9/2003 | Mann ........................ 717/124 |
| 6,621,356 B2 | 9/2003 | Gotz et al. |
| 6,624,640 B2 | 9/2003 | Lund et al. |
| 6,625,765 B1 | 9/2003 | Krishnan |
| 6,628,163 B2 | 9/2003 | Dathe et al. |
| 6,631,508 B1 | 10/2003 | Williams |
| 6,634,008 B1 | 10/2003 | Dole |
| 6,636,096 B2 | 10/2003 | Schaffer et al. |
| 6,637,015 B1 | 10/2003 | Ogami et al. |
| 6,639,586 B2 | 10/2003 | Gerpheide |
| 6,642,857 B1 | 11/2003 | Schediwy et al. |
| 6,643,151 B1 | 11/2003 | Nebrigic et al. |
| 6,643,810 B2 | 11/2003 | Whetsel |
| 6,649,924 B1 | 11/2003 | Philipp et al. |
| 6,650,581 B2 | 11/2003 | Hong et al. |
| 6,658,498 B1 | 12/2003 | Carney et al. |
| 6,658,633 B2 | 12/2003 | Devins et al. |
| 6,661,288 B2 | 12/2003 | Morgan et al. |

| Patent No. | Date | Inventor(s) | Class |
|---|---|---|---|
| 6,661,410 B2 | 12/2003 | Casebolt et al. | |
| 6,664,978 B1 | 12/2003 | Kekic et al. | |
| 6,664,991 B1 | 12/2003 | Chew et al. | |
| 6,667,642 B1 | 12/2003 | Moyal | |
| 6,667,740 B2 | 12/2003 | Ely et al. | |
| 6,670,852 B1 | 12/2003 | Hauck | |
| 6,673,308 B2 | 1/2004 | Hino et al. | |
| 6,677,814 B2 | 1/2004 | Low et al. | |
| 6,677,932 B1 | 1/2004 | Westerman | |
| 6,678,645 B1 | 1/2004 | Rajsuman et al. | |
| 6,678,877 B1 | 1/2004 | Perry et al. | |
| 6,680,632 B1 | 1/2004 | Meyers et al. | |
| 6,680,731 B2 | 1/2004 | Gerpheide et al. | |
| 6,681,280 B1 | 1/2004 | Miyake et al. | |
| 6,681,359 B1 | 1/2004 | Au et al. | |
| 6,683,462 B2 | 1/2004 | Shimizu | |
| 6,683,930 B1 | 1/2004 | Dalmia | |
| 6,686,787 B2 | 2/2004 | Ling | |
| 6,686,860 B2 | 2/2004 | Gulati et al. | |
| 6,690,224 B1 | 2/2004 | Moore | |
| 6,697,754 B1 | 2/2004 | Alexander | |
| 6,701,340 B1 | 3/2004 | Gorecki | |
| 6,701,487 B1 | 3/2004 | Ogami et al. | |
| 6,701,508 B1 | 3/2004 | Bartz et al. | |
| 6,704,381 B1 | 3/2004 | Moyal et al. | |
| 6,704,879 B1 | 3/2004 | Parrish | |
| 6,704,889 B2 | 3/2004 | Veenstra et al. | |
| 6,704,893 B1 | 3/2004 | Bauwens et al. | |
| 6,705,511 B1 | 3/2004 | Dames et al. | |
| 6,711,226 B1 | 3/2004 | Williams et al. | |
| 6,711,731 B2 | 3/2004 | Weiss | |
| 6,713,897 B2 | 3/2004 | Caldwell | |
| 6,714,066 B2 | 3/2004 | Gorecki et al. | |
| 6,714,817 B2 | 3/2004 | Daynes et al. | |
| 6,715,132 B1 | 3/2004 | Bartz et al. | |
| 6,717,474 B2 | 4/2004 | Chen et al. | |
| 6,718,294 B1 | 4/2004 | Bortfeld | 703/20 |
| 6,718,520 B1 | 4/2004 | Merryman et al. | |
| 6,718,533 B1 | 4/2004 | Schneider et al. | |
| 6,724,220 B1 | 4/2004 | Snyder et al. | |
| 6,728,900 B1 | 4/2004 | Meli | |
| 6,728,902 B2 | 4/2004 | Kaiser et al. | |
| 6,730,863 B1 | 5/2004 | Gerpheide et al. | |
| 6,731,552 B2 | 5/2004 | Perner | |
| 6,732,068 B2 | 5/2004 | Sample et al. | |
| 6,732,347 B1 | 5/2004 | Camilieri et al. | |
| 6,738,858 B1 | 5/2004 | Fernald et al. | |
| 6,744,323 B1 | 6/2004 | Moyal et al. | |
| 6,748,569 B1 | 6/2004 | Brooke et al. | |
| 6,750,852 B2 | 6/2004 | Gillespie et al. | |
| 6,750,889 B1 | 6/2004 | Livingston et al. | |
| 6,754,765 B1 | 6/2004 | Chang et al. | |
| 6,754,849 B2 | 6/2004 | Tamura | |
| 6,757,882 B2 | 6/2004 | Chen et al. | |
| 6,765,407 B1 | 7/2004 | Snyder | |
| 6,768,337 B2 | 7/2004 | Kohno et al. | |
| 6,768,352 B1 | 7/2004 | Maher et al. | |
| 6,769,622 B1 | 8/2004 | Tournemille et al. | |
| 6,771,552 B2 | 8/2004 | Fujisawa | |
| 6,774,644 B2 | 8/2004 | Eberlein | |
| 6,781,456 B2 | 8/2004 | Pradhan | |
| 6,782,068 B1 | 8/2004 | Wilson et al. | |
| 6,784,821 B1 | 8/2004 | Lee | |
| 6,785,881 B1 | 8/2004 | Bartz et al. | |
| 6,788,116 B2 | 9/2004 | Cook et al. | |
| 6,788,221 B1 | 9/2004 | Ely et al. | |
| 6,788,521 B2 | 9/2004 | Nishi | |
| 6,791,377 B2 | 9/2004 | Ilchmann et al. | |
| 6,792,584 B1 | 9/2004 | Eneboe et al. | |
| 6,798,218 B2 | 9/2004 | Kasperkovitz | |
| 6,798,299 B1 | 9/2004 | Mar et al. | |
| 6,799,198 B1 | 9/2004 | Huboi et al. | |
| 6,806,771 B1 | 10/2004 | Hildebrant et al. | |
| 6,806,782 B2 | 10/2004 | Motoyoshi et al. | |
| 6,809,275 B1 | 10/2004 | Cheng et al. | |
| 6,809,566 B1 | 10/2004 | Xin-LeBlanc | |
| 6,810,442 B1 | 10/2004 | Lin et al. | 710/22 |
| 6,815,979 B2 | 11/2004 | Ooshita | |
| 6,816,544 B1 | 11/2004 | Bailey et al. | 375/222 |
| 6,819,142 B2 | 11/2004 | Viehmann et al. | |
| 6,823,282 B1 | 11/2004 | Snyder | |
| 6,823,497 B2 | 11/2004 | Schubert et al. | |
| 6,825,689 B1 | 11/2004 | Snyder | |
| 6,825,869 B2 | 11/2004 | Bang | |
| 6,828,824 B2 | 12/2004 | Betz et al. | |
| 6,829,727 B1 | 12/2004 | Pawloski | 714/28 |
| 6,836,169 B2 | 12/2004 | Richmond et al. | |
| 6,839,774 B1 | 1/2005 | Ahn et al. | |
| 6,842,710 B1 | 1/2005 | Gehring et al. | |
| 6,847,203 B1 | 1/2005 | Conti et al. | |
| 6,850,117 B2 | 2/2005 | Weber et al. | |
| 6,850,554 B1 | 2/2005 | Sha | |
| 6,853,598 B2 | 2/2005 | Chevallier | |
| 6,854,067 B1 | 2/2005 | Kutz et al. | |
| 6,856,433 B2 | 2/2005 | Hatano et al. | |
| 6,859,884 B1 | 2/2005 | Sullam | |
| 6,862,240 B2 | 3/2005 | Burgan | |
| 6,864,710 B1 | 3/2005 | Lacey et al. | |
| 6,865,429 B1 | 3/2005 | Schneider et al. | |
| 6,865,504 B2 | 3/2005 | Larson et al | |
| 6,868,500 B1 | 3/2005 | Kutz et al. | |
| 6,871,253 B2 | 3/2005 | Greeff et al. | |
| 6,871,331 B1 | 3/2005 | Bloom et al. | |
| 6,873,203 B1 | 3/2005 | Latham, II et al. | |
| 6,873,210 B2 | 3/2005 | Mulder et al. | |
| 6,880,086 B2 | 4/2005 | Kidder et al. | |
| 6,888,453 B2 | 5/2005 | Lutz et al. | |
| 6,888,538 B2 | 5/2005 | Ely et al. | |
| 6,892,310 B1 | 5/2005 | Kutz et al. | |
| 6,892,322 B1 | 5/2005 | Snyder | |
| 6,893,724 B2 | 5/2005 | Lin et al. | |
| 6,894,928 B2 | 5/2005 | Owen | |
| 6,897,390 B2 | 5/2005 | Caldwell et al. | |
| 6,898,703 B1 | 5/2005 | Ogami et al. | |
| 6,900,663 B1 | 5/2005 | Roper et al. | |
| 6,901,563 B1 | 5/2005 | Ogami et al. | |
| 6,903,402 B2 | 6/2005 | Miyazawa | |
| 6,903,613 B1 | 6/2005 | Mitchell et al. | |
| 6,904,570 B2 | 6/2005 | Foote et al. | |
| 6,910,126 B1 | 6/2005 | Mar et al. | |
| 6,911,857 B1 | 6/2005 | Stiff | |
| 6,917,661 B1 | 7/2005 | Scott et al. | |
| 6,922,821 B1 * | 7/2005 | Nemecek | 716/4 |
| 6,924,668 B2 | 8/2005 | Muller et al. | |
| 6,934,674 B1 | 8/2005 | Douezy et al. | |
| 6,937,075 B2 | 8/2005 | Lim et al. | |
| 6,940,356 B2 | 9/2005 | McDonald et al. | |
| 6,941,336 B1 | 9/2005 | Mar | |
| 6,944,018 B2 | 9/2005 | Caldwell | |
| 6,949,811 B2 | 9/2005 | Miyazawa | |
| 6,949,984 B2 | 9/2005 | Siniscalchi | |
| 6,950,954 B1 | 9/2005 | Sullam et al. | |
| 6,950,990 B2 | 9/2005 | Rajarajan et al. | |
| 6,952,778 B1 | 10/2005 | Snyder | |
| 6,954,511 B2 | 10/2005 | Tachimori | |
| 6,954,904 B2 | 10/2005 | White | |
| 6,956,419 B1 | 10/2005 | Mann et al. | |
| 6,957,180 B1 * | 10/2005 | Nemecek | 703/28 |
| 6,957,242 B1 | 10/2005 | Snyder | |
| 6,963,233 B2 | 11/2005 | Puccio et al. | |
| 6,967,511 B1 | 11/2005 | Sullam | |
| 6,967,960 B1 | 11/2005 | Bross et al. | 370/410 |
| 6,968,346 B2 | 11/2005 | Hekmatpour | |
| 6,969,978 B2 | 11/2005 | Dening | |
| 6,970,844 B1 | 11/2005 | Bierenbaum | |
| 6,973,400 B2 | 12/2005 | Cahill-O'Brien et al. | |

| | | | | | | |
|---|---|---|---|---|---|---|
| 6,975,123 B1 | 12/2005 | Malang et al. | 7,265,633 B1 | 9/2007 | Stiff | |
| 6,980,060 B2 | 12/2005 | Boerstler et al. | 7,266,768 B2 | 9/2007 | Ferlitsch et al. | |
| 6,981,090 B1 | 12/2005 | Kutz et al. | 7,281,846 B2 | 10/2007 | McLeod | |
| 6,988,192 B2 | 1/2006 | Snider | 7,282,905 B2 | 10/2007 | Chen et al. | |
| 6,996,799 B1 | 2/2006 | Cismas et al. | 7,283,151 B2 | 10/2007 | Nihei et al. | |
| 7,005,933 B1 | 2/2006 | Shutt | 7,288,977 B2 | 10/2007 | Stanley | |
| 7,009,444 B1 | 3/2006 | Scott | 7,295,049 B1 | 11/2007 | Moyal et al. | |
| 7,015,735 B2 | 3/2006 | Kimura et al. | 7,298,124 B2 | 11/2007 | Kan et al. | |
| 7,017,145 B2 | 3/2006 | Taylor | 7,301,835 B2 | 11/2007 | Joshi et al. | |
| 7,017,409 B2 | 3/2006 | Zielinski et al. | 7,307,485 B1 | 12/2007 | Snyder et al. | |
| 7,020,854 B2 | 3/2006 | Killian et al. | 7,312,616 B2 | 12/2007 | Snyder | |
| 7,023,215 B2 | 4/2006 | Steenwyk | 7,323,879 B2 | 1/2008 | Kuo et al. | |
| 7,023,257 B1 | 4/2006 | Sullam | 7,342,405 B2 | 3/2008 | Eldridge et al. | |
| 7,024,636 B2 | 4/2006 | Weed | 7,358,714 B2 | 4/2008 | Watanabe et al. | |
| 7,024,654 B2 | 4/2006 | Bersch et al. | 7,367,017 B2 | 4/2008 | Maddocks et al. | |
| 7,026,861 B2 | 4/2006 | Steenwyk | 7,376,001 B2 | 5/2008 | Joshi et al. | |
| 7,030,513 B2 | 4/2006 | Caldwell | 7,376,904 B2 | 5/2008 | Cifra et al. | |
| 7,030,656 B2 | 4/2006 | Lo et al. | 7,386,740 B2 | 6/2008 | Kutz et al. | |
| 7,030,688 B2 | 4/2006 | Dosho et al. | 7,400,183 B1 | 7/2008 | Sivadasan et al. | |
| 7,030,782 B2 | 4/2006 | Ely et al. | 7,421,251 B2 | 9/2008 | Westwick et al. | |
| 7,034,603 B2 | 4/2006 | Brady et al. | 7,466,307 B2 | 12/2008 | Trent, Jr. et al. | |
| 7,042,301 B2 | 5/2006 | Sutardja | 7,542,533 B2 | 6/2009 | Jasa et al. | |
| 7,047,166 B2 | 5/2006 | Dancea | 7,554,847 B2 | 6/2009 | Lee | |
| 7,055,035 B2 | 5/2006 | Allison et al. | 2001/0002129 A1 | 5/2001 | Zimmerman et al. | |
| 7,058,921 B1 | 6/2006 | Hwang et al. | 2001/0010083 A1 | 7/2001 | Satoh | |
| 7,073,158 B2 | 7/2006 | McCubbrey | 2001/0038392 A1 | 11/2001 | Humpleman et al. | |
| 7,076,420 B1 * | 7/2006 | Snyder et al. ............... 703/28 | 2001/0043081 A1 | 11/2001 | Rees | |
| 7,086,014 B1 | 8/2006 | Bartz et al. | 2001/0044927 A1 | 11/2001 | Karniewicz | |
| 7,088,166 B1 | 8/2006 | Reinschmidt et al. | 2001/0045861 A1 | 11/2001 | Bloodworth et al. | |
| 7,089,175 B1 * | 8/2006 | Nemecek et al. ............. 703/28 | 2001/0047509 A1 | 11/2001 | Mason et al. | |
| 7,091,713 B2 | 8/2006 | Erdeiyi et al. | 2002/0010716 A1 | 1/2002 | McCartney et al. | |
| 7,092,980 B1 | 8/2006 | Mar et al. | 2002/0016706 A1 | 2/2002 | Cooke et al. | |
| 7,098,414 B2 | 8/2006 | Caldwell | 2002/0023110 A1 | 2/2002 | Fortin et al. | |
| 7,099,818 B1 * | 8/2006 | Nemecek et al. ............. 703/28 | 2002/0042696 A1 | 4/2002 | Garcia et al. | |
| 7,103,108 B1 | 9/2006 | Beard | 2002/0052729 A1 | 5/2002 | Kyung et al. ............... 703/28 | |
| 7,109,978 B2 | 9/2006 | Gillespie et al. | 2002/0059543 A1 | 5/2002 | Cheng et al. | |
| 7,117,485 B2 | 10/2006 | Wilkinson et al. | 2002/0063688 A1 | 5/2002 | Shaw et al. | |
| 7,119,550 B2 | 10/2006 | Kitano et al. | 2002/0065646 A1 | 5/2002 | Waldie et al. | |
| 7,119,602 B2 | 10/2006 | Davis | 2002/0068989 A1 | 6/2002 | Ebisawa et al. | |
| 7,124,376 B2 | 10/2006 | Zaidi et al. | 2002/0073119 A1 | 6/2002 | Richard | |
| 7,127,630 B1 | 10/2006 | Snyder | 2002/0073380 A1 | 6/2002 | Cooke | |
| 7,129,793 B2 | 10/2006 | Gramegna | 2002/0080186 A1 | 6/2002 | Frederiksen | |
| 7,129,873 B2 | 10/2006 | Kawamura | 2002/0085020 A1 | 7/2002 | Carroll, Jr. | |
| 7,132,835 B1 | 11/2006 | Arcus | 2002/0109722 A1 | 8/2002 | Rogers et al. | |
| 7,133,140 B2 | 11/2006 | Lukacs et al. | 2002/0116168 A1 * | 8/2002 | Kim ........................ 703/28 | |
| 7,133,793 B2 | 11/2006 | Ely et al. | 2002/0121679 A1 | 9/2002 | Bazarjani et al. | |
| 7,138,841 B1 | 11/2006 | Li | 2002/0122060 A1 | 9/2002 | Markel | |
| 7,138,868 B2 | 11/2006 | Sanchez et al. | 2002/0129334 A1 | 9/2002 | Dane et al. | |
| 7,139,530 B2 | 11/2006 | Kusbel | 2002/0133771 A1 | 9/2002 | Barnett | |
| 7,141,968 B2 | 11/2006 | Hibbs et al. | 2002/0133794 A1 | 9/2002 | Kanapathippillai et al. | |
| 7,141,987 B2 | 11/2006 | Hibbs et al. | 2002/0138516 A1 | 9/2002 | Igra | |
| 7,149,316 B1 | 12/2006 | Kutz et al. | 2002/0145433 A1 | 10/2002 | Morrise et al. | |
| 7,150,002 B1 | 12/2006 | Anderson et al. | 2002/0152234 A1 | 10/2002 | Estrada et al. | |
| 7,151,528 B2 | 12/2006 | Taylor et al. | 2002/0152449 A1 | 10/2002 | Lin | |
| 7,152,027 B2 | 12/2006 | Adreade et al. | 2002/0156885 A1 * | 10/2002 | Thakkar ................... 709/224 | |
| 7,154,294 B2 | 12/2006 | Liu et al. | 2002/0156998 A1 | 10/2002 | Casselman ................. 712/227 | |
| 7,161,936 B1 | 1/2007 | Barrass et al. | 2002/0161802 A1 | 10/2002 | Gabrick et al. | |
| 7,162,410 B1 * | 1/2007 | Nemecek et al. ............. 703/28 | 2002/0166100 A1 | 11/2002 | Meding | |
| 7,171,455 B1 | 1/2007 | Gupta et al. | 2002/0174134 A1 | 11/2002 | Goykhman | |
| 7,176,701 B2 | 2/2007 | Wachi et al. | 2002/0174411 A1 | 11/2002 | Feng et al. | |
| 7,180,342 B1 | 2/2007 | Shutt et al. | 2002/0191029 A1 | 12/2002 | Gillespie et al. | |
| 7,185,162 B1 | 2/2007 | Snyder | 2003/0011639 A1 | 1/2003 | Webb | |
| 7,185,321 B1 | 2/2007 | Roe et al. | 2003/0014447 A1 | 1/2003 | White | |
| 7,188,063 B1 | 3/2007 | Snyder | 2003/0025734 A1 | 2/2003 | Boose et al. | |
| 7,193,901 B2 | 3/2007 | Ruby et al. | 2003/0041241 A1 | 2/2003 | Meyer | |
| 7,200,507 B2 | 4/2007 | Chen et al. | 2003/0056071 A1 | 3/2003 | Triece et al. ................ 711/165 | |
| 7,206,733 B1 | 4/2007 | Nemecek | 2003/0058469 A1 | 3/2003 | Buis et al. | |
| 7,212,189 B2 | 5/2007 | Shaw et al | 2003/0061572 A1 | 3/2003 | McClannahan et al. | |
| 7,221,187 B1 | 5/2007 | Snyder et al. | 2003/0062889 A1 | 4/2003 | Ely et al. | |
| 7,227,389 B2 | 6/2007 | Gong et al. | 2003/0080755 A1 | 5/2003 | Kobayashi | |
| 7,236,921 B1 * | 6/2007 | Nemecek et al. ............. 703/28 | 2003/0097640 A1 | 5/2003 | Abrams et al. | |
| 7,250,825 B2 | 7/2007 | Wilson et al. | 2003/0105620 A1 | 6/2003 | Bowen | |
| 7,256,588 B2 | 8/2007 | Howard et al. | 2003/0126947 A1 | 7/2003 | Moore et al. | |

| | | | |
|---|---|---|---|
| 2003/0135842 A1 | 7/2003 | Frey et al. | |
| 2003/0149961 A1 | 8/2003 | Kawai et al. | 717/129 |
| 2003/0229482 A1 | 12/2003 | Cook et al. | |
| 2004/0054821 A1 | 3/2004 | Warren et al. | |
| 2004/0153802 A1 | 8/2004 | Kudo et al. | |
| 2004/0205553 A1 | 10/2004 | Hall et al. | |
| 2004/0205617 A1 | 10/2004 | Light | |
| 2004/0205695 A1 | 10/2004 | Fletcher | |
| 2005/0024341 A1 | 2/2005 | Gillespie et al. | |
| 2005/0143968 A9 | 6/2005 | Odom et al. | |
| 2005/0240917 A1 | 10/2005 | Wu | |
| 2005/0248534 A1 | 11/2005 | Kehlstadt | |
| 2005/0280453 A1 | 12/2005 | Hsieh | |
| 2006/0032680 A1 | 2/2006 | Elias et al. | |
| 2006/0097991 A1 | 5/2006 | Hotelling et al. | |
| 2006/0273804 A1 | 12/2006 | Delorme et al. | |
| 2007/0139074 A1 | 6/2007 | Reblewski | |
| 2008/0095213 A1 | 4/2008 | Lin et al. | |
| 2008/0186052 A1 | 8/2008 | Needham et al. | |
| 2008/0259998 A1 | 10/2008 | Venkataraman et al. | |

FOREIGN PATENT DOCUMENTS

| | | |
|---|---|---|
| EP | 0308583 A1 | 3/1989 |
| EP | 0308583 A2 | 3/1989 |
| EP | 368398 A1 | 5/1990 |
| EP | 0450863 A1 | 10/1991 |
| EP | 0450863 A2 | 10/1991 |
| EP | 0499383 A1 | 8/1992 |
| EP | 0499383 A2 | 8/1992 |
| EP | 0639816 A1 | 2/1995 |
| EP | 0639816 A2 | 2/1995 |
| EP | 117067 A1 | 1/2002 |
| EP | 1205848 A1 | 5/2002 |
| EP | 1191423 A1 | 2/2003 |
| EP | 1191423 A2 | 2/2003 |
| JP | 404083405 A1 | 3/1992 |
| JP | 405055842 A1 | 3/1993 |
| JP | 06021732 A1 | 1/1994 |
| JP | 404095408 A1 | 3/2002 |
| WO | 9532478 A1 | 11/1995 |
| WO | PCT/US96/17305 A1 | 6/1996 |
| WO | PCT/US98/34376 A1 | 8/1998 |
| WO | PCT/US99/09712 A1 | 2/1999 |

OTHER PUBLICATIONS

Microsoft Press Computer User's Dictionary, © 1996. p. 320.*
Dahl et al., "Emulation of the Sparcle Microprocessor With the MIT Virtual Wires Emulation System"; 1994; IEEE; pp. 14-22.
Bauer et al.; "A Reconfigurable Logic Machine for Fast Event-Driven Simulation"; 1998; Design Automation Conference Proceedings; pp. 668-671.
Bursky; "FPGA Combines Multiple Interfaces and Logic"; Electronic Design; vol. 48 No. 20; pp. 74-78 (Oct. 2, 2000).
Anonymous, "WARP Nine Engineering—The IEEE 1284 Experts-F/Port Product Sheet"; undated web page found at http://www.fapo.com/fport.htm.
Anonymous; "F/Port: Fast Parallell Port for the PC: Installation Manual : Release 7.1," circa 1997, available for download from http:///www.fapo.com/fport.htm.
Nam et al. ; "Fast Development of Source-Level Debugging System Using Hardware Emulation"; IEEE 2000; pp. 40-404.
Huang et al.; Iceberg: An Embedded In-Circuit Emulator Synthesizer for Microconttollers, ACM 1999; pp. 580-585.
Khan et al.; "FPGA Architectures for ASIC Hardware Emulators"; IEEE 1993; pp. 336-340.
Oh et al.; "Emulator Environment Based on an FPGA Prototyping Board"; IEEE 21-23; Jun. 2000; pp. 72-77.
Hong et al.; "An FPGA-Based Hardware Emulator for Fast Fault Emulation"; IEEE 1997; pp. 345-348.
Ching et al.; "An In-Circut Emulator for TMS320C25"; IEEE 1994; pp. 51-56.
Pasternak; "In-Circuit-Emulation in ASIC Architecture Core Designs"; IEEE 1989' pp. P6-4.1-P6-4.4.
Melear; "Using Backround Modes for Testing, Debugging and Emulation of Microcontrollers"; IEEE 1997; pp. 90-97.
Walters; "Computer-Aided Prototyping for ASIC-Based Systems"; 1991; IEEE Design & Test of Computers.
Anonymous; "JEEN ™ JTAG Embedded Ice Ethernet Interface"; Aug. 1999; Embedded Performance, Inc.; 3 pages.
Sedory; "A Guide to Debug"; 2004' retrieved on May 20, 2005.
"Microsoft Files Summary Judgement Motions"; Feb. 1999; Microsoft PressPass; retrieved on May 20, 2005 from http:///www.microsoft.com/presspass/press/1999/feb99/Feb99/Calderapr.asp; pp. 1-6.
Anonymous; Using Debug; 1999; Prentice-Hall Publishing; pp. 1-20.
Xerox; MESA Debugger Documentation; Apr. 1979; XEROX Systems Development Department; Version 5.0; pp. 1-30.
Stallman et al.; "Debugging With THR GNU Source-Level Debugger"; Jan. 1994: retrieved on May 2, 2005 from http://www.cs.utah.edu; Stopping and Continuing.
Sreeram Duvvuru and Siamak Arya, "Evaluation of a Branch Target Address Cache", 1995, IEEE, pp. 173-180.
Andrew S. Tanenbaum with contributions from James R. Goodman, "Structured Computer Organization", 1999, Prentice Hall, Fourth Edition, pp. 264-288, 359-362.
Wikipedia- Main Page, retrieved on Mar. 8, 2006 from http://en.wikipedia.org/wiki/Main_Page and http://en.wikipedia.org/wiki/Wikipedia:Introduction.
Wikipedia- Processor register, retrieved on Mar. 7, 2006 from http://en.wikipedia.org/wiki/Processor_register.
Jonathan B. Rosenberg, How Debuggers Work: Algorithms, Data Structures and Architecture. Copyright 1996 by John Wiley & Sons, Inc. Canada, 257 pages.
CYPR-CD00183; "Capturing Test/Emulation and Enabling Real-Time Debugging Using FPGA for In-Circuit Emulation"; Oct. 10, 2001; U.S. Appl. No. 09/975,104; Snyder.
"Cypress Microsystems Unveils Programmable System-On-A-Chip for Embedded Internet, Communications and Consumer Systems"; [online], [retrieved on Nov. 13, 2003]. Retrieved from the Internet<http://www.cypressmicro.com/corporate/CY_Announces_nov_13_2000.html>.
CYPR-CD00185; "Emulator Chip-Board Architecture and Interface"; Oct. 1, 2001; U.S. Appl. No. 09/975,030; Snyder et al.
Sungjoo Yoo et al.; "Fast Hardware-Software Coverification by Optimistic Execution of Real Processor, Proceedings of Design, Automation and Test in Europe Conference and Exhibition"; pp. 663-668, Mar. 2000.
"ICEPIC In-Circuit Emulator—User's Guide", 2000, Microchip Technology Incorporated, Product Manual.
Staffan Nilsson; "In circuit emulators", Mar. 12, 2001; website: http://www.algonet.se/.about.staffann/developer/emulator.htm, archived at http://web.archive.org/web/20010312175339/http://www.algonet.se/.about.staffann/developer/emulator.htm, accessed May 12, 2005.
CYPR-CD00182; "In-System Chip Emulator Architecture", Oct. 10, 2001; U.S. Appl. No. 09/975,115; Snyder, et al.
CYPR-CD00186; "Method for Breaking Execution of Test Code in a Dut and Emulator Chip Essentially Simultaneously and Handling Complex Breakpoint Events"; Oct. 10, 2001; U.S. Appl. No. 09/975,338; Nemecek et al.
"MPLAB—IDE, Simulator, Editor—User's Guide", 2000, Microchip Technology Incorporated, Product Manual.
"PSoC Designer: Integrated Development Environment", User Guide; Revision 1.11; CMS10005A; Last Revised: Jul. 17, 2001; Cypress Microsystems, Inc.
Huang, Chen, Kao, "Reusable embedded in-circuit emulator", 2001, Proceedings of the ASP-DAC 2001, ISBN 0-7803-633-6, pp. 33-34.
Winters; "Using IEEE-1149.1 for in-circuit emulation", Sep. 1994, Proceedings of WESCON '94, ISBN 0-7803-9992-7, pp. 525-528.
"pod-definition by diet.die.net"; retrieved on Nov. 14, 2005 from http://diet.die.net/pod.

"POD-Piece of Data, Plain Old Documentation, Plain Old Dos . . . "; retrieved on Nov. 14, 2005 from http://www.auditmypc.com/acronym/POD.asp.

"POD-Wikipedia, the free encyclopedia"; retrieved on Nov. 14, 2005 from http://en.wikipedia.org/wiki/POD.

Augarten; "The Chip Collection-Introduction-Smithsonian Institute"; "state of the art"; http://smithsonianchips.si.edu/augarten/p24.htm (from 1207), 1970.

Wikipedia.org; "Von Neumann architecture"; retrieved from http://en.wikipedia.org/wiki/Von_Neumann_architecture on Jan. 22, 2007; pp. 1-5 (from 1207).

USPTO Non-Final Office Action Dated May 11, 2005 for U.S. Appl. No. 10/001,477.

USPTO Non-Final Office Action Dated Dec. 6, 2007 for U.S. Appl. No. 10/001,477.

USPTO Notice of Allowance Dated Nov. 10, 2008 for U.S. Appl. No. 10/001,477.

USPTO Final Office Action Dated Feb. 6, 2006 for U.S. Appl. No. 10/002,217.

USPTO Final Office Action Dated Mar. 7, 2007 for U.S. Appl. No. 10/002,217.

USPTO Final Office Action Dated Nov. 17, 2005 for U.S. Appl. No. 10/002,217.

USPTO Non-Final Office Action Dated Apr. 3, 2006 for U.S. Appl. No. 10/002,217.

USPTO Non-Final Office Action Dated May 19, 2005 for U.S. Appl. No. 10/002,217.

USPTO Non-Final Office Action Dated Aug. 3, 2007 for U.S. Appl. No. 10/002,217.

USPTO Non-Final Office Action Dated Oct. 2, 2006 for U.S. Appl. No. 10/002,217.

USPTO Notice of Allowance Dated Jun. 6, 2008 for U.S. Appl. No. 10/002,217.

USPTO Notice of Allowance Dated Oct. 14, 2008 for U.S. Appl. No. 10/002,217.

USPTO Non-Final Rejection Dated Nov. 12, 2008 for U.S. Appl. No. 09/994,600.

USPTO Final Rejection Dated Jun. 30, 2008 for U.S. Appl. No. 10/001,477.

USPTO Final Rejection Dated Jul. 23, 2007 for U.S. Appl. No. 10/001,477.

USPTO Final Rejection Dated Aug. 24, 2006 for U.S. Appl. No. 10/001,477.

USPTO Final Rejection Dated Oct. 24, 2005 for U.S. Appl. No. 10/001,477.

USPTO Non-Final Rejection Dated Jan. 22, 2007 for U.S. Appl. No. 10/001,477.

USPTO Non-Final Rejection Dated Sep. 21, 2005 for U.S. Appl. No. 09/994,601.

USPTO Non-Final Rejection Dated Oct. 4, 2007 for U.S. Appl. No. 09/994,601.

USPTO Non-Final Rejection Dated Nov. 14, 2006 for U.S. Appl. No. 09/994,601.

USPTO Notice of Allowance Dated Dec. 22, 2008 for U.S. Appl. No. 09/994,601.

USPTO Advisory Action Dated May 15, 2006 for U.S. Appl. No. 09/989,778.

USPTO Final Rejection Dated Jan. 8, 2009 for U.S. Appl. No. 09/989,778.

USPTO Final Rejection Dated Feb. 5, 2007 for U.S. Appl. No. 09/989,778.

USPTO Final Rejection Dated Feb. 15, 2006 for U.S. Appl. No. 09/989,778.

USPTO Final Rejection Dated Dec. 20, 2007 for U.S. Appl. No. 09/989,778.

USPTO Non-Final Rejection Dated Mar. 29, 2005 for U.S. Appl. No. 09/989,778.

USPTO Non-Final Rejection Dated Jul. 14, 2008 for U.S. Appl. No. 09/989,778.

USPTO Non-Final Rejection Dated Jul. 19, 2007 for U.S. Appl. No. 09/989,778.

USPTO Non-Final Rejection Dated Jul. 19, 2007 for U.S Appl. No. 09/989,778.

USPTO Non-Final Rejection Dated Sep. 18, 2006 for U.S. Appl. No. 09/989,778.

USPTO Final Rejection Dated Jun. 14, 2005 for U.S. Appl. No. 09/998,848.

USPTO Final Rejection Dated Jul. 25, 2006 for U.S. Appl. No. 09/998,848.

USPTO Final Rejection Dated Aug. 10, 2007 for U.S. Appl. No. 09/998,848.

USPTO Final Rejection Dated Nov. 24, 2008 for U.S. Appl. No. 09/998,848.

USPTO Non-Final Rejection Dated Jan. 26, 2006 for U.S. Appl. No. 09/998,848.

USPTO Non-Final Rejection Dated Jan. 29, 2007 for U.S. Appl. No. 09/998,848.

USPTO Non-Final Rejection Dated Feb. 22, 2008 for U.S. Appl. No. 09/998,848.

USPTO Non-Final Rejection Dated Dec. 21, 2004 for U.S. Appl. No. 0/998,848.

USPTO Final Rejection Dated Jan 11, 2007 for U.S. Appl. No. 09/989,767.

USPTO Final Rejection Dated Jan. 15, 2009 for U.S. Appl. No. 09/989,767.

USPTO Final Rejection Dated Mar 6, 2006 for U.S. Appl. No. 09/989,767.

USPTO Final Rejection Dated Apr. 6, 2005 for U.S. Appl. No. 09/989,767.

USPTO Final Rejection Dated Dec. 27, 2007 for U.S. Appl. No. 09/989,767.

USPTO Non-Final Rejection Dated Jul. 17, 2006 for Application No. 0/989,767.

USPTO Non-Final Rejection Dated Jul. 2, 2007 for U.S. Appl. No. 09/989,767.

USPTO Non-Final Rejection Dated Jul. 24, 2008 for U.S. Appl. No. 09/989,767.

USPTO Non-Final Rejection Dated Oct. 6, 2004 for U.S. Appl. No. 09/989,767.

USPTO Final Rejection Dated Feb. 27, 2007 for U.S. Appl. No. 09/989,771.

USPTO Final Rejection Dated Mar. 28, 2006 for U.S. Appl. No. 09/989,771.

USPTO Final Rejection Dated Apr. 6, 2005 for U.S. Appl. No. 09/989,771.

USPTO Final Rejection Dated Dec. 10, 2008 for U.S. Appl. No. 09/989,771.

USPTO Final Rejection Dated Dec. 27, 2007 for U.S. Appl. No. 09/989,771.

USPTO Non-Final Rejection Dated May 28, 2008 for U.S. Appl. No. 09/989/771.

USPTO Non-Final Rejection Dated Jul. 16, 2007 for U.S. Appl. No. 09/989,771.

USPTO Non-Final Rejection Dated Aug. 23, 2006 for U.S. Appl. No. 09/989,771

USPTO Non-Final Rejection Dated Sep. 12, 2005 for U.S. Appl. No. 09/989,771.

USPTO Non-Final Rejection Dated Sep. 22, 2004 for U.S. Appl. No. 09/989,771.

USPTO Final Rejection Dated Apr. 3, 2007 for U.S. Appl. No. 09/989,765.

USPTO Final Rejection Dated Apr. 4, 2008 for U.S. Appl. No. 09/989,765.

USPTO Final Rejection Dated Apr. 17, 2006 for Application No. 09/989,765.

USPTO Non-Final Rejection Dated Sep. 19, 2007 for U.S. Appl. No. 09/989,765.

USPTO Non-Final Rejection Dated Sep. 26, 2008 for U.S. Appl. No. 09/989,765.

USPTO Non-Final Rejection Dated Oct. 2, 2006 for U.S. Appl. No. 09/989,765.

USPTO Non-Final Rejection Dated Oct. 5, 2005 for U.S. Appl. No. 09/989,765.

USPTO Final Rejection Dated Jul. 9, 2008 for U.S. Appl. No. 09/989,782.

USPTO Final Rejection Dated Jul. 24, 2007 for U.S. Appl. No. 09/989,782.
USPTO Final Rejection Dated Sep. 21, 2006 for U.S. Appl. No. 09/989,782.
USPTO Final Rejection Dated Nov. 3, 2005 for U.S. Appl. No. 09/989,782.
USPTO Non-Final Rejection Dated Jan. 29, 2007 for U.S. Appl. No. 09/989,782.
USPTO Non-Final Rejection Dated Mar. 28, 2006 for Application No. 09989782.
USPTO Non-Final Rejection Dated Apr. 29, 2005 for U.S. Appl. No. 09/989,782.
USPTO Non-Final Rejection Dated Oct. 6, 2004 for U.S. Appl. No. 09/989,782.
USPTO Non-Final Rejection Dated Nov. 26, 2008 for U.S. Appl. No. 09/989,782.
USPTO Notice of Allowance Dated Dec. 22, 2008 for U.S. Appl. No. 10/008,096.
USPTO Final Rejection Dated Jun. 4, 2008 for U.S. Appl. No. 10/001,478.
USPTO Final Rejection Dated Sep. 5, 2006 for U.S. Appl. No. 10/001,478.
USPTO Final Rejection Dated Sep. 17, 2007 for U.S. Appl. No. 10/001,478.
USPTO Final Rejection Dated Oct. 24, 2005 for U.S. Appl. No. 10/001,478.
USPTO Non-Final Rejection Dated Jan. 30, 2008 for U.S. Appl. No. 10/001,478.
USPTO Non-Final Rejection Dated Mar. 15, 2006 for U.S. Appl. No. 10/001,478.
USPTO Non-Final Rejection Dated Apr. 2, 2007 for U.S. Appl. No. 10/001,478.
USPTO Non-Final Rejection Dated May 16, 2005 for U.S. Appl. No. 10/001,478.
USPTO Non-Final Rejection Dated Oct. 20, 2008 for U.S. Appl. No. 10/001,478.
USPTO Notice of Allowance for U.S. Appl. No. 09/992,076 dated Nov. 13, 2008; 15 pages.
USPTO Final Rejection for U.S. Appl. No. 09/994,601 dated May 18, 2007; 17 pages.
USPTO Notice of Allowance for U.S. Appl. No. 09/992,076 dated Nov. 29, 2007; 8 pages.
USPTO Final Rejection for U.S. Appl. No. 09/992,076 dated Jan. 30, 2007; 32 pages.
USPTO Non-Final Rejection for U.S. Appl. No. 09/992,076 dated Aug. 10, 2006; 19 pages.
USPTO Final Rejection for U.S. Appl. No. 09/992,076 dated Mar. 17, 2006; 16 pages.
USPTO Non-Final Rejection for U.S. Appl. No. 09/992,076 dated Nov. 21, 2005; 29 pages.
USPTO Non-Final Rejection for U.S. Appl. No. 09/992,076 dated Jun. 1, 2005; 20 pages.
U.S. Appl. No. 10/803,030: "Programmable Microcontrollable Architecture (Mixed Analog/Digital);" Snyder; 13 pages, Mar. 16, 2004.
U.S. Appl. No. 10/033,027: "Microcontrollable Programmable System on a Chip;" Snyder; 117 pages, Oct. 22, 2001.
USPTO Final Rejection for U.S. Appl. No. 09/994,601 dated Apr. 17, 2008; 24 pages.
Hsieh et al., "Modeling Micro-Controller Peripherals for High-Level Co-Simulation and Synthesis," IEEE, 1997; 4 pages.
Specks et al., "A Mixed Digital-Analog 16B Microcontroller with 0.5MB Flash Memory, On-Chip Power Supply, Physical Newark Interface, and 40V I/O for Automotive Single-Chip Mechatronics," IEEE, Feb. 9, 2000; 1 page.
"PSoC technology complete changes 8-bit MCU system design", Cypress Microsystems, Inc. retrieved from <http>://www.archive.org/web/20010219005250/http://cypressmicro.com- /t...>, Feb. 19, 2001; 21 pages.
"PSoC designer: Integrated development environment, getting started 25-minute tutorial, version 1.0", Cypress Microsystems., Cypress Microsystems, Inc. CMS10006A, Jul. 3, 2001; 25 pages.

Robinson, Gordon D; "Why 1149.1 (JTAG) Really Works", May 1994, Conference Proceedings Electro/94 International, May 10-12, 1994, Combined Volumes; 6 pages.
Monte Mar, Bert Sullam, Eric Blom; "An architecture for a configurable Mixed-signal device", 2003, IEEE Journal of Solid-State Circuits, vol. 3; 4 pages.
Julio Faura et al.; "A Novel Mixed Signal Programmable Device With On-Chip Microprocessor", 1997, IEEE 1997 Custom Integrated Circuits Conference; 4 pages.
USPTO Notice of Allowance for 10/001,477 dated Nov. 10, 2008; 13 pages.
USPTO Final Rejection for 10/001,477 dated Jun. 30, 2008; 19 pages.
USPTO Non-Final Rejection for 10/001,477 dated Dec. 6, 2007; 17 pages.
USPTO Final Rejection for 10/001,477 dated Jul. 23, 2007; 19 pages.
USPTO Non-Final Rejection for 10/001,477 dated Jan. 22, 2007; 17 pages.
USPTO Final Rejection for 10/001,477 dated Aug. 24, 2006; 15 pages.
USPTO Non-Final Rejection for 10/001,477 dated Mar. 2, 2006; 17 pages.
USPTO Final Rejection for U.S. Appl. No. 10/001,477 dated Oct. 24, 2005; 18 pages.
USPTO Non-Final Rejection for U.S. Appl. No. 10/001,477 dated May 11, 2005; 31 pages.
Ito, Sergio Akira and Carro, Luigi; "A Comparison of Microcontrollers Targeted to FPGA-Based Embedded Applications", Sep. 2000, Proceedings of 13th Symposium on Integrated Circuits and Systems Design, Sep. 18-24, 2000; 6 pages.
USPTO Notice of Allowance for U.S. Appl. No. 10/011,214 dated Apr. 11, 2005; 4 pages.
USPTO Final Refection for U.S. Appl. No. 10/011,214 dated Jan. 21, 2005; 8 pages.
USPTO Non-Final Rejection for U.S. Appl. No. 101011,214 dated Aug. 13, 2004, 10 pages.
Hong at al., "Hierarchial System Test by an IEEE 1149.5 MTM-Bus Slave-Module Interface Core," IEEE, 2000; 14 pages.
Haberl et al., "Self Testable Boards with Standard IEEE 1149.5 Module Test and Maintenance (MTM) Bus Interface," IEEE, 1994; 6 pages.
Varma et al., "A Structured Test Re-Use Methodology for Core-Based System Chips," IEEE, 1998, 9 pages.
Andrews, "Roadmap for Extending IEEE 1149.1 for Hierarchical Control of Locally-Stored. Standardized command Set, Test Programs," IEEE, 1994; 7 pages.
Adham et al.,"Preliminary Outline of the IEEE P1500 Scalable Architecture for Testing Embedded Cores," IEEE; 6 pages, 1999.
Ghosh et al., "A Low Overhead Design for Testability and Test Generation Technique for Core-based Systems," IEEE, 1997; 10 pages.
Zorian, "Test Requirements for Embedded Core-based Systems and IEEE P1500," IEEE, 1997; 9 pages.
Zorian et al., "Testing Embedded-Core Based System Chips," IEEE, 1998; 14 pages.
Papachristou et al., "Microprocessor Based Testing for Core-Based System on a Chip," IEEE,1999; 6 pages.
Maroufi et al., "Solving the I/O Bandwidth Problem in System on a Chip Testing." IEEE, 2000; 6 pages.
Marsh, "Smart Tools Illuminate Deeply Embedded Systems," EDN, 2000; 7 pages.
York at al., "On-chip Support Needed for SOC Debug," Electronic Engineering Times, 1999; 2 pages.
Atmel Corporation: AT90SC Summary: "Secure Microcontrollers for Smart Cards," 1999; 7 pages.
Hwang et al., "Integrated circuit for automatically varying resistance in computer system, has pair of transistors connected in parallel with respective resistors such that resistors are bypassed when corresponding transistors are enabled," Derwent Information Ltd; 2002; 2 pages.
Morrison, "IBM Eyes Merchant Packaging Services," Jul. 13, 1998; Electronic News <http://www.findarticles.com>; 4 pages.

Charles, Jr. et al, "Wirebonding: Reinventing the Process for MCMs," Apr. 1998: IEEE 7th International Conference on Multichip Modules and High Density Packaging: 3 pages.

Tran et al., "Fine Pitch and Wirebonding and Reliability of Aluminum Capped Copper Bond Pads," May 2000. IEEE Electronic Components and Technology Conference; 8 pages.

Song at al., "A 50% Power Reduction Scheme for CMOS Relaxation Oscillator," IEEE. 1999; 4 pages.

"Electronic Circuit Protector-CircuitBreaker;" IBM Technical Disclosure Bulletin; vol. 36, Issue 8, Aug. 1, 1993, 1 page.

USPTO Final Rejection for U.S. Appl. No. 10/001,478 dated Apr. 20, 2009; 16 pages.

USPTO Notice of Allowance for U.S. Appl. No. 09/994,600 dated Apr. 3, 2009; 5 pages.

USPTO Notice of Allowance for U.S. Appl. No. 09/989,777 dated Mar. 9, 2009; 7 pages.

USPTO Notice of Allowance for U.S. Appl. No. 09/992,076 dated Feb. 27, 2009; 6 pages.

USPTO Non-Final Rejection for U.S. Appl. No. 09/989,771 dated Apr. 30, 2009, 11 pages.

USPTO Notice of Allowance for U.S. Appl. No. 09/989,762 dated Mar. 25, 2009; 7 pages.

USPTO Notice of Allowance for U.S. Appl. No. 09/989,762 dated Oct. 24, 2008; 7 pages.

USPTO Notice of Allowance for U.S. Appl. No. 09/989,762 dated Mar. 25, 2009, 7 pages.

USPTO Notice of Allowance for U.S. Appl. No. 09/989,762 dated Jun. 2, 2008: 6 pages.

USPTO Notice of Allowance for U.S. Appl. No. 09/989,762 dated Jan. 2, 2008; 6 pages.

USPTO Non-Final Rejection for U.S. Appl. No. 989,762 dated Jul. 23, 2007; 15 pages.

USPTO Final Rejection for U.S. Appl. No. 09/989,762 dated Jan. 26, 2007; 13 pages.

USPTO Non-Final Rejection for U.S. Appl. No. 09/989,762 dated Aug. 10, 2006; 18 pages.

USPTO Final Rejection for U.S. Appl. No. 09/989,762 dated Mar. 14, 2006; 19 pages.

USPTO Non-Final Rejection for U.S. Appl. No. 09/989,762 dated Jul. 27, 2005; 15 pages.

U.S. Appl. No. 09/275,336 : "Programmable Osciliator Scheme;" Mar et al.; 25 pages, Mar. 24, 1999.

U.S. Appl. No. 09/721,316: "Programmable Oscillator Scheme;" Mar et al.; 26 pages, Nov. 22, 2000.

U.S. Appl. No. 10/324,455: "Programmable Oscillator Scheme;" Mar et al.; 23 pages, Dec. 20, 2003.

U.S. Appl. No. 09/998,859: "A System and a Method for Checking Lock Step Consistency between in Circuit Emulation and a Microcontroller while Debugging Process is in Progress," Nemecek; 33 pages, Nov. 15, 2001.

U.S. Appl. No. 09/998,834: "A System and a Method for Communication between an Ice and a Production Microcontroller while in a Halt State;" Nemecek; 33 pages, Nov. 15, 2001.

U.S. Appl. No. 10/113,065: "System and Method for Automatically Matching Components in a Debugging System," Nemecek at al.; 32 pages, Mar. 29, 2002.

U.S. Appl. No. 09/989,574: "Method and System for using a Graphics user interface for Programming an Electronic Device;" Bartz et al.; 43 pages, Nov. 19, 2001.

U.S. Appl. No. 09/989,816: "Datasheet Browsing and Creation with Data-Driven Datasheet Tabs within a Microcontroller Design Tool;" Bartz et al.; 55 pages, Nov. 19, 2001.

U.S. Appl. No. 09/989,815: "A Data Driven Method and System for Monitoring Hardware Resource Usage for Programming an Electric Device;" Bartz et al.; 36 pages, Nov. 19, 2001.

USPTO Notice of Allowance for U.S. Appl. No. 09/930,021 dated Nov. 26, 2004; 4 pages.

USPTO Final Refection for U.S. Appl. No. 09/930,021 dated Aug. 31, 2004; 8 pages.

USPTO Non-Final Rejection for U.S. Appl. No. 091/930,021 dated Apr. 26, 2004; 6 pages.

USPTO Miscellaneous Action with SSP for Application U.S. Appl. No. 09/930,021 dated Oct. 1, 2001; 1 page.

USPTO Notice of Allowance for U.S. Appl. No. 09/953,423 dated Jul. 12, 2004; 6 pages.

USPTO Non-Final Rejection for U.S. Appl. No. 09/953,423 dated Feb. 6, 2064. 5 pages.

USPTO Notice of Allowance for U.S. Appl. No. 09/957,084 dated May 18, 2004; 5 pages.

USPTO Final Rejection or U.S. Appl. No. 9/957,084 dated Jan. 29, 2004; 8 pages.

USPTO Non-Final Rejection for U.S. Appl. No. 09/957,084 dated Aug. 27, 2003; 8 pages.

USPTO Final Rejection for U.S. Appl. No. 09/957,084 dated Apr. 23, 2003; 8 pages.

USPTO Non-Final Rejection for U.S. Appl. No. 09/957,084 dated Aug. 23, 2002; 6 pages.

USPTO Notice of Allowance for U.S. Appl. No. 09/969,313 dated Oct. 4, 2005; 6 pages.

USPTO Non-Final Rejection for U.S. Appl. No. 09/969,313 dated May 6, 2005, 9 pages.

USPTO Requirement for Restriction/Election for U.S. Appl. No. 09/969,313 dated Mar. 18, 2005; 6 pages.

USPTO Notice of Allowance for U.S. Appl. No. 09/969,311 dated Mar. 1, 2005; 4 pages.

USPTO Non-Final Rejection for U.S. Appl. No. 09/969,311 dated Sep. 21, 2004; 4 pages.

USPTO Advisory Action for U.S. Appl. No. 09/969,311 dated Jul. 21, 2003; 2 pages.

USPTO Final Rejection for U.S. Appl. No. 09/969,311 dated Apr. 7, 2003; 7 pages

USPTO Non-Final Rejection for U.S. Appl. No. 09/969,311 dated Nov. 6, 2002; 8 pages.

USPTO Notice of Allowance for U.S. Appl. No. 09/972,319 dated Dec. 30, 2004; 4 pages.

USPTO Non-Final Rejection for U.S. Appl. No. 09/972,319 dated Sep. 16, 2004; 9 pages.

USPTO Notice of Allowance for U.S. Appl. No. 09/972,003 dated Jul. 14, 2004; 4 pages.

USPTO Requirement for Restriction/Election for U.S. Appl. No. 09/972,003 dated May 6, 2004; 4 pages.

USPTO Non-Final Rejection fs r U.S. Appl. No. 09/972,003 dated Feb. 2, 2004; 10 pages.

USPTO Non-Final Rejection for U.S. Appl. No. 09/972,003 dated Aug. 19, 2003, 11 pages.

USPTO Notice of Allowance for U.S. Appl. No. 09/972,133 dated Jun. 9, 2006; 6 pages.

USPTO Final Rejection or U.S. Appl. No. 09/972,133 dated Mar. 30, 2006; 8 pages.

USPTO Non-Final Rejection for U.S. Appl. No. 09/972,133 dated Nov. 25, 2005; 9 pages.

USPTO Advisory Action for U.S. Appl. No. 09/972,133 dated Aug. 31, 2005; 3 pages.

USPTO Final Rejection or U.S. Appl. No. 9/972,133 dated Jun. 29, 2005; 10 pages.

USPTO Non-Final Rejection for U.S. Appl. No. 09/972,133 dated Mar. 8, 2005; 9 pages.

USPTO Notice of Allowance for U.S. Appl. No. 09/975,104 dated Oct. 19, 2006; 6 pages.

USPTO Non-Final Rejection for U.S. Appl. No. 09/975,104 dated Jun. 16, 2006; 8 pages.

USPTO Final Rejection for U.S. Appl. No. 09/975,104 dated Feb. 15, 2006; 7 pages USPTO Non-Final Rejection for U.S. Appl. No. 09/975,104 dated Aug. 16, 2005; 6 pages.

USPTO Non-Final Rejection for U.S. Appl. No. 09/975,104 dated Mar. 21, 2005; 7 pages.

USPTO Notice of Allowance for U.S. Appl. No. 09/975,030 dated Feb. 6, 2006; 7 pages.

USPTO Non-Final Rejection for U.S. Appl. No. 09/975,030 (000 0185) dated Oct. 20, 2005; 7 pages.

USPTO Non-Finaal Rejection for U.S. Appl. No. 09/975,030 dated Mar. 29, 2005; 13 pages.

USPTO Notice of Allowance for U.S. Appl. No. 09/977,111 dated Sep. 28, 2006; 6 pages.

USPTO Notice of Allowance for U.S. Appl. No. 10/272,231 dated Mar. 8, 2004; 6 pages.
USPTO Final Rejection for U.S. Appl. No. 10/272,231 dated Nov. 5, 2003; 5 pages.
USPTO Non-Final Rejection for U.S. Appl. No. 10/272,231 dated Jul. 14, 2003; 6 pages.
USPTO Notice of Allowance for U.S. Appl. No. 11/125,554 dated Feb. 7, 2008; 4 pages.
USPTO Notice of Allowance for U.S. Appl. No. 11/125,554 dated Apr. 24, 2007; 7 pages.
USPTO Non-Final Rejection for U.S. Appl. No. 11/125,554 dated Dec. 11, 2006; 9 pages.
USPTO Notice of Allowance for U.S. Appl. No. 09/855,868 dated Apr. 25, 2005; 6 pages.
USPTO Non-Final Rejection for U.S. Appl. No. 09/855,868 dated Aug. 26, 2004; 7 pages.
USPTO Notice of Allowance for U.S. Appl. No. 09/887,923 dated Sep. 27, 2004; 5 pages.
USPTO Non-Final Rejection for U.S. Appl. No. 09/887,923 dated May 25, 2004; 7 pages
U.S. Appl. No. 11/322,044, filed Dec. 28, 2005, Stiff, Jonathon.
U.S. Appl. No. 11/850,260: "Circuit and Method for Improving the Accuracy of a Crystal-less Oscillator Having Dual-Frequency Modes;" Wright et al.; 33 pages, Sep. 5, 2007.
USPTO Non-Final Rejection for U.S. Appl. No. 11/850,260 dated Mar. 6, 2009; 7 pages.
USPTO Non-Final Rejection for U.S. Appl. No. 11/644,100 dated Mar. 9, 2009; 11 pages.
USPTO Advisory Action for U.S. Appl. No. 11/644,100 dated Feb. 9, 2009; 3 pages.
USPTO Final Rejection for U.S. Appl. No. 11/644,100 dated Nov. 18, 2008; 12 pages.
USPTO Non-Final Rejection for U.S. Appl. No. 11/644,100 dated Apr. 14, 2008; 10 pages.
USPTO Notice of Allowance for U.S. Appl. No. 11/415,588 dated Mar. 11, 2008; 6 pages.
USPTO Advisory Action for U.S. Appl. No. 11/415,588 dated Jan. 14, 2008; 3 pages.
USPTO Final Rejection for U.S. Appl. No. 11/415,588 dated Oct. 19, 2007; 8 pages.
USPTO Non-Final Rejection for U.S. Appl. No. 11/415,588 dated Jun. 13, 2007; 8 pages.
USPTO Notice of Allowance for U.S. Appl. No. 12/218,404 dated Mar. 19, 2009; 7 pages.
USPTO Non-Final Rejection for U.S. Appl. No. 12/218,404 dated Sep. 30, 2008; 8 pages.
U.S. Appl. No. 11/644/100: "Differential-to-single ended signal converter circuit and method," Stiff; 33 pages, Dec. 21, 2006.
U.S. Appl. No. 11/415,588: "Votage Controlled Oscillator Delay Cell and Method," Sivadasan; 24 pages, May 1, 2006.
U.S. Appl. No. 12/218,404: "Voltage Controlled Oscillator Delay Cell and Method." Sivadasan; 23 pages, Jul. 14, 2008.
USPTO Notice of Allowance for U.S. Appl. No. 11/132,894 dated Apr. 26, 2007; 4 pages.
USPTO Non-Final Rejection for U.S. Appl. No. 11/132,894 dated Dec. 19, 2006; 12 pages.
U.S. Appl. No. 11/132,894): "Open Loop Bandwidth Test Architecture and Method for Phase Locked Loop (PLL)," Stiff; 38 pages, May 19, 2005.
USPTO Non-Final Rejection for U.S. Appl. No. 11/322,044 dated May 4, 2009; 18 pages.
USPTO Non-Final Rejection for U.S. Appl. No. 11/322,044 dated Nov. 25, 2008; 15 pages.
USPTO Non-Final Rejection for U.S. Appl. No. 11/322,044 dated Apr. 11, 2008; 11 pages.
USPTO Advisory Action for U.S. Appl. No. 11/322,044 dated Nov. 30, 2007; 2 pages.
USPTO Final Rejection for U.S. Appl. No. 11/322,044 dated Sep. 21, 2007; 14 pages.
USPTO Non -Final Rejection for U.S. Appl. No. 11/322,044 dated Apr. 24, 2007; 13 pages.
U.S. Appl. No. 11/322,044: "Split charge pump PLL architecture." Stiff; 19 pages, Dec. 28, 2005.
USPTO Notice of Allowance for U.S. Appl. No. 10/305,589 dated Feb. 4, 2005; 5 pages.
USPTO Final Rejection or U.S. Appl. No. 10/305,589 dated Oct. 21, 2004; 7 pages.
USPTO Non-Final Rejection for U.S. Appl. No. 10/305,589 dated Oct. 7, 2003; 6 pages.
U.S. Appl. No. 10/305,589: "Current Controlled Delay Circuit," Stiff; 18 pages, Nov. 26, 2002.
U.S. Appl. No. 09/849,164: "Reduced Static Phase Error CMOS PLL Charge Pump," Stiff; 30 pages, May 4, 2001.
Maneatis, "Low-Jitter Process-Independent DLL and PLL Based on Self-Biased Techniques," IEEE Journal of Solid-State Circuits, vol. 31, No, 11, Nov. 1996; 10 pages.
Larsson, "A 2-1600-MHz CMOS Clock Recovery PLL with Low-Vdd Capability," IEEE Journal of Solid-State Circuits, vol. 34, No. 12, Dec. 1999; 10 pages.
USPTO Notice of Allowance for U.S. Appl. No. 10/327,217 dated Aug. 12, 2004; 6 pages.
USPTO Non-Final Rejection for U.S. Appl. No. 11/327,217 dated Apr. 30, 2004; 5 pages.
USPTO Miscellaneous Action for U.S. Appl. No. 10/327,217 dated Feb. 10, 2004; 1 page.
U.S. Appl. No. 10/327,217: "Single Ended Clock Signal Generator Having a Differential Output," Richmond et al.; 27 pages, Dec. 20, 2002.
USPTO Notice of Allowance for U.S. Appl. No. 10/871,582 dated Mar. 30, 2006; 6 pages.
USPTO Final Rejection for U.S. Appl. No. 10/871,582 dated Feb. 1, 2006: 5 pages.
USPTO Non-Final Rejection for U.S. Appl. No. 10/871,582 dated Sep. 7, 2005; 7 pages.
U.S. Appl. No. 10/871,582: "LVDS Input Circuit with Extended Common Mode Range," Reinschmidt et al.; 25 pages, Jun. 17, 2004.
USPTO Notice of Allowance for U.S. Appl. No. 09/404,891 dated Mar. 4, 2005; 6 pages.
USPTO Final Rejection for U.S. Appl. No. 09/404,891 dated Dec. 8, 2004; 7 pages.
USPTO Non-Final Rejection for U.S. Appl. No. 09/404,891 dated Jun. 25, 2004; 6 pages.
USPTO Non-Final Rejection for U.S. Appl. No. 09/404,891 dated Jan. 5, 2004; 5 pages.
USPTO Non-Final Rejection for U.S. Appl. No. 09/404,891 dated Jul. 10, 2003; 6 pages.
USPTO Non-Final Rejection for U.S. Appl. No. 09/404,891 dated Mar. 5, 2003; 6 pages.
USPTO Non-Final Rejection for U.S. Appl. No. 09/404,891 dated Oct. 11, 2002; 5 pages.
U.S. Appl. No. 09/404,891: "Method, Architecture and Circuitry for Controlling Pulse Width in a Phase and/or Frequency Detector," Scott et al.; 17 pages, Sep. 24, 1999.
USPTO Notice of Allowance for U.S. Appl. No. 10/226,911 dated Aug. 20, 2004; 4 pages.
USPTO Non-Final Rejection for U.S. Appl. No. 10/226,911 dated Mar. 19, 2004; 6 pages.
From U.S. Appl. No. 10/033,027: Goodenough, F. "Analog Counterparts of FPGAS Ease System Design" Electronic Design, Penton Publishing, Cleveland, OH, US vol. 42, No. 21, Oct. 14, 1994; 10 pages.
From U.S. Appl. No. 10/033,027: Harbaum, T. et al. "Design of a Flexible Coprocessor Unit" Proceedings of the Euromicro Conference, XX XX, Sep. 1999; 10 pages.
From U.S. Appl. No. 10/033,027: "Programmable Microcontroller (PSoC) Architecture (Mixed Analog/Digital)"; Aug. 7, 2001; U.S. Appl. No. 09/924,734 Snyder et al.; 28 pages.
From U.S. Appl. No. 10/033,027: "Digital Configurable Macro Architecture"; Jul. 18, 2001; U.S. Appl. No. 09/909,045; Snyder, 37 pages.
From U.S. Appl. No. 10/033,027; "Configuring Digital Functions in a Digital Configurable Macro Architecture"; Jul. 18, 2001; U.S. Appl. No. 09/909,109; Snyder; 38 pages.
From U.S. Appl. No. 10/033,027; "A Programmable Analog System Architecture (As Amended)"; Jul. 18, 2001; U.S. Appl. No. 09/909,047; Mar; 60 pages.

From U.S. Appl. No. 10/033,027: "Programmable Methodology and Architecture for a Programmable Analog System (As Amended)"; Aug. 14, 2001; U.S. Appl. No. 09/930,021; Mar et al.; 87 pages.

From U.S. Appl. No. 10/033,027; "Method for Synchronizing and Resetting Clock Signals Supplied to Multiple Programmable Analog Blocks (As Amended)"; Oct. 1, 2001; U.S. Appl. No. 09/969;311; Sullam; 57 pages.

From U.S. Appl. No. 10/033,027; "Method and Apparatus for Programming a Flash Memory"; Jun. 5, 2001; U.S. Appl. No. 09/875,599; Snyder; 23 pages.

U.S. Appl. No. 09/923,461): "Non-Interfering Multiply-Mac (Multiply Accumulate) Circuit;" Snyder; 25 pages, Aug. 6, 2001.

From Application No. 10/033,027; "A Configurable Input/Output Interface for a Microcontroller"; Sep. 14 2001; U.S. Appl. No. 09/953,423; Kutz et al.; 28 pages.

From U.S. Appl. No. 10/033,027; "Multiple Use of Microcontroller Pad"; Jun. 26, 2001; U.S. Appl. No. 09/893,050; Kutz et al.; 21 pages.

From U.S. Appl. No. 10/033,027; "Programming Architecture for a Programmable Analog System"; Aug. 14, 2001; U.S. Appl. No. 09/929,891; Mar et al.; 82 pages.

From U.S. Appl. No. 10/033,027; "Architecture for Synchronizing and Resetting Clock Signals Supplied to Multiple Analog Programmable Analog Blocks"; Oct. 1, 2001; U.S. Appl. No. 09/969,313; Sullam; 50 pages.

U.S. Appl. No. 10/011,214: "Method and Circuit for Synchronizing a Write Operation between an On-Chip Microprocessor and an On-Chip Programmable Analog Device Operating at Different Frequencies;" Sullam; 49 pages, Oct. 25, 2001.

USPTO Final Rejection for U.S. Appl. No. 09/994,601 dated Mar. 8, 2006; 14 pages.

U.S. Appl. No. 09/935,454: "Method and Apparatus for Local and Global Power Management in a Programmable Analog Circuit;" Mar, 51 pages, Aug. 22, 2001.

USPTO Final Rejection for U.S. Appl. No 09/994,601 dated Mar. 24, 2005; 13 pages.

Hintze et al.; "Microcontrollers", 1992, McGraw-Hill; 11 pages.

Ganapathy, Gopi, and Narayan, Ram, and Jorden, Glen, and Fernandez, Denzil, and Wang, Ming, and Nishimura, Jim; "Hardware Emulation for Functional Verification of K5", Jun. 1996, 33rd Design Automation Conference Proceedings, Jun. 3-7, 1996; 4 pages.

U.S. Appl. No. 60/243,708 "Advanced Programmable Microcontroller Device"; 277 pages, Oct. 26, 2000 .

"Webster's Third New International Dictionary", 1996, G. & C. Merriam Company; 3 pages.

USPTO Advisory Action for U.S. Appl. No. 09/998,848 dated Sep. 7, 2005; 3 pages.

U.S. Appl. No. 09/957,084: "A Crystal-Less Oscillator with Trimmable Analog Current Control for Increased Stability;" Mar; 28 pages, Sep. 19, 2001 .

U.S. Appl. No. 09/969,313: "Architecture for Synchronizing and Resetting Clock Signals Supplied to Multiple Analog Programmable System on a Chip Block;" Sullam; 50 pages, Oct. 1, 2001.

U.S. Appl. No. 09/972,319: "Method for Applying Instructions to Microprocessor in Test Mode;" Snyder, 31 pages, Oct. 5, 2001.

U.S. Appl. No. 09/972,003: "Test Architecture for Microcontroller Providing for a Serial Communication Interface;" Snyder; 32 pages, Oct. 5, 2001.

U.S. Appl. No. 09/972,133: "Method for Entering Circuit Test Mode;" Snyder; 30 pages, Oct. 5, 2001.

U.S. Appl. No. 09/973,535: "Architecture for Decimation Algorithm;" Snyder; 26 pages, Oct. 9, 2001.

U.S. Appl. No. 09/977,111: A Frequency Doubler Circuit with Trimmable Current Control; Shutt; 35 pages, Oct. 11, 2001.

U.S. Appl. No. 10/272,231: "Digital Configurable Macro Architecture;" Snyder; 36 pages, Oct. 15, 2002.

U.S. Appl. No. 11/125,554: "A Method for a Efficient Supply to a Microcontroller;" Kutz; 1 page, May 9, 2005.

U.S. Appl. No. 09/855,868: "Protecting Access to Microcontroller Memory Block;" Snyder; 28 pages, May 14, 2001.

U.S. Appl. No. 09/887,923: "Novel Method and System for Interacting between a Processor and a Power on Reset to Dynamically Control Power States in a Microcontroller," Kutz; 44 pages, Jun. 22, 2001.

U.S. Appl. No. 10/000,383: "System and Method of Providing a Programmable Clock Architecture for an Advanced Microcontroller;" SuIlam; 34 pages Oct. 24, 2001.

U.S. Appl. No. 10/001,477: "Breakpoint Control in an In-Circuit Emulation System;" Roe; 43 pages, Nov. 1, 2004.

U.S. Appl. No. 10/004,197: "In-Circuit Emulator with Gatekeeper Based Halt Control;" Nemecek; 47 pages, Nov. 14, 2001.

U.S. Appl. No. 10/004,039: "In-Circuit Emulator with Gatekeeper for Watchdog Timer;" Nemecek; 46 pages, Nov. 14, 2001.

U.S. Appl. No. 10/002,217: "Conditional Branching in an In-Circuit Emulation System;" Nemecek; 43 pages, Nov. 1, 2001.

U.S. Appl. No. 10/001,568: "Combined In-Circuit Emulator and Programmer;" Nemecek; 47 pages, Nov. 1, 2001.

U.S. Appl. No. 10/001,478: "In-Circuit Emulator and Pod Synchronized Boot;" Nemecek; 44 pages, Nov. 1, 2001.

U.S. Appl. No. 09/887,955: "Novel Power on Reset Circuit for Microcontroller," Kutz; 42 pages, Jun. 22, 2001.

U.S. Appl. No. 09/826,397: "Method and Circuit for Allowing a Microprocessor to Change its Operating Frequency on-the-fly;" Sullam; 24 pages, Apr. 2, 2001.

U.S. Appl. No. 09/893,048: "A Microcontroller having an On-Chip High Gain Amplifier;" Kutz; 22 pages, Jun. 26, 2001.

U.S. Appl. No. 09/912,768: "A Microcontroller having a Dual Mode Relax Oscillator that is Trimmable;" Shutt; 33 pages, Jun. 24, 2001.

U.S. Appl. No. 09/922.419: "A Power Supply Pump Circuit for a Microcontroller;" Kutz; 38 pages, Aug. 3, 2001.

U.S. Appl. No. 09/922,579: "A Method for a Efficient Supply to a Microcontroller;" Kutz; 37 pages, Aug. 3, 2001.

USPTO Notice of Allowance for U.S. Appl. No. 10/238,966 dated Jan. 27, 2009; 4 pages.

USPTO Non-Final Rejection for U.S. Appl. No. 10/238,966 dated Jun. 30, 2008; 12 pages.

USPTO Non-Final Rejection for 10/238,966 dated Dec. 26, 2007; 12 pages.

USPTO Final Rejection for U.S. Appl. No. 10/238,966 dated Sep. 27, 2007; 9 pages.

USPTO Non-Final Rejection for U.S. Appl. No. 10/238,966 dated Apr. 19, 2007; 7 pages.

USPTO Non-Final Rejection for U.S. Appl. No. 10/238,966 dated Oct. 20, 2006; 8 pages.

USPTO Non-Final Rejection for U.S. Appl. No. 10/238,966 dated Apr. 6, 2006; 8 pages.

USPTO Notice of Allowance for U.S. Appl. No. 10/033,027 dated Mar. 31, 2009; 7 pages.

USPTO Non-Final Rejection for U.S. Appl. No. 10/033,027 dated Dec. 18, 2008; 5 pages.

USPTO Final Rejection for U.S. Appl. No. 10/033,027 dated Jun. 8, 2007; 8 pages.

USPTO Non-Final Rejection for U.S. Appl. No. 10/033,027 dated Dec. 21, 2006; 31 pages.

USPTO Final Rejection for U.S. Appl. No. 10/033,027 dated Aug. 9, 2006; 6 pages.

USPTO Non-Final Rejection for U.S. Appl. No. 10/033,027 dated Apr. 26, 2006; 26 pages.

USPTO Final Rejection for U.S. Appl. No. 10/033,027 dated Oct. 31, 2005; 24 pages.

USPTO Non-Final Rejection for U.S. Appl. No. 10/033,027 dated Apr. Apr. 20, 2005; 20 pages.

USPTO Non-Final Rejection for U.S. Appl. No. 10/033,027 dated Oct. 18, 2004; 17 pages.

USPTO Notice of Allowance for U.S. Appl. No. 10/002,217 dated Jan. 28, 2009; 4 pages.

USPTO Advisory Action for U.S. Appl. No. 10/001,477 dated Oct. 10, 2008; 3 pages.

"Micropower CMOS Temperature Sensor with Digital Output" Bakker et al., IEEE Journal of Solid-State Circuits, 1996; 3 pages.

"WP 3.5: An Integrated Time Reference;" Blauschild, Digest of Technical Papers, 1994; 4 pages.

"An Analog PPL-Based Clock and Data Recovery Circuit with High Input Jitter Tolerance;" Sun, Reprinted from IEEE Journal of Solid-State Circuits, 1989; 4 pages.

U.S. Appl. No. 09/842,966: "Precision Crystal Oscillator Circuit Used in Microcontroller," Mar; 28 pages, Apr. 25, 2001.

U.S. Appl. No. 09/964,991: "A Novel Band-Gap Circuit for Providing an Accurate Reference Voltage Compensated for Process State, Process Variations and Temperature," Kutz et al.; 25 pages, Sep. 26, 2001.
U.S. Appl. No. 10/226,911: "Calibration of Integrated Circuit Time Constants," Gehring et al.; 32 pages, Aug. 22, 2002.
USPTO Notice of Allowance for U.S. Appl. No. 09/943,149 dated Jan. 12, 20004; 7 pages.
USPTO Non-Final Rejection for U.S. Appl. No. 09/943,149 dated Jan. 12, 2004; 9 pages.
USPTO Final Rejection for U.S. Appl. No. 09/943,149 dated May 7, 2003; 10 pages.
USPTO Non-Final Rejection for U.S. Appl. No. 09/943,149 dated Nov. 20, 2002; 7 pages.
U.S. Appl. No. 09/943,149: "Method for Phase Locking in a Phase Lock Loop," Moyal et al ; 21 pages, Aug. 30, 2001.
Durham et al., "Integrated Continuous-Time Balanced Filters for 16-bit DSP Interfaces," IEEE, 1993; 6 pages.
Durham et al., "Circuit Architectures for High Linearity Monolithic Continuous-Time Filtering." IEEE, 1992, 7 pages.
Durham et al., "High Linearity Conitnuous-Time Fitter in 5-VLSI CMOS," IEEE, 1992; 8 pages.
U.S. Appl. No. 09/047,595: "Roving Range Control to Limit Receive PLL Frequency of Operation," Scott; 35 pages, Mar. 25, 1998.
U.S. Appl. No. 09/216,460: "Circuit and Method for Controlling an Output of Ring Oscillator," Abugharbieh at al.; 21 pages, Dec. 18, 1998.
U.S. Appl. No. 09/471,914: "Reference-Free Clock Generator and Data Recovery PLL," Dalmia et al.; 32 pages, Dec. 23, 1999.
U.S. Appl. No. 09/471,576: "Reference-Free Clock Generation and Data Recovery PLL," Dalmia; 30 pages, Dec. 23, 1999.
U.S. Appl. No. 10/083,442: "Method/Architecture for a Low Gain PLL with Wide Frequency Range," Meyers at al.; 28 pages, Feb. 26, 2002.
U.S. Appl. No. 09/470,665: "Digital Phase/Frequency Detector, and Clock Generator and Data Recovery PLL Containing the Same," Dalmia; 26 pages, Dec. 23, 1999.
U.S. Appl. No. 09/893,161: "Architecture of a PLL with Dynamic Frequency Control on a PLD," Moore; 32 pages, Jun. 27, 2001.
U.S. Appl. No. 09/608,753: "PLL Lockout Watchdog," Wilson at al.; 24 pages, Jun. 30, 2000.
U.S. Appl. No. 09/398,956: "Frequency Acquisition Rate Control in Phase Lock Loop Circuits," Moyal et al.; 35 pages, Sep. 17, 1999.
U.S. Appl. No. 09/747,262: "Linearized Digital Phase-Locked Loop," Williams et al.; 9 pages, Dec. 22, 2000.
U.S. Appl. No. 09/981,448: "Oscillator Tuning Method," Hauck; 28 pages, Oct. 17, 2001.
U.S. Appl. No. 09/538,98: "Memory Based Phase Locked Loop," Krishnan; 27 pages, Mar. 30, 2000.
U.S. Appl. No. 09/048,905;"Programmable Clock Generator," Mann et al.; 42 pages, Mar. 26, 1998.
U.S. Appl. No. 08/865,342: "Programmable Clock Generator," Mann et al.; 41 pages, May 29, 1997.
USPTO Notice of Allowance for U.S. Appl. No. 10/293,392 dated Mar. 10, 2004; 6 pages.
USPTO Non-Final Rejection for U.S. Appl. No. 10/293,392 dated Oct. 16, 2003; 6 pages.
U.S. Appl. No. 10/293,392: "Low Voltage Receiver Circuit and Method for Shifting the Differential Signals of the Receiver Depending on a Common Mode Voltage of the Input Signals," Maher et al.; 20 pages, Nov. 13, 2002.
USPTO Notice of Allowance for U.S. Appl. No. 10/288,003 dated Jan 14, 2005; 6 pages.
USPTO Final Rejection for U.S. Appl. No. 10/288,003 dated Oct. 6, 2004; 6 pages.
USPTO Non-Final Rejection for U.S. Appl. No. 10/288,003 dated Apr. 7, 2004; 9 pages.
U.S. Appl. No. 10/288,003: "Low Voltage Differential Signal Driver Circuit and Method." Roper et al.; 30 pages, Nov. 4, 2002.
"New Object Domain R3 Beta Now Available (Build 134)!" Mar. 13, 2001; <http://web.archive.org/web/200100331202605/www objectdomain.com/domain30/inde.html>; 2 pages.

"OMG XML Metadata Interchange (XMI) Specifications" 2000; 17 pages.
Electronic Tools Company; E-Studio User Manuel; 2000; retrieved from http://webarchive.org for site http://e-tools.com on Mar. 23, 2005; 77 pages.
Cover Pages Technology Reports; XML and Electronic Design Automation (EDA); Aug. 2000; retrieved from http://xml.coverpages.org on Mar. 23, 2005; 5 pages.
Microsoft Computer Dictionary "ActiveX" 2002; Microsoft Press; 5th Edition: 3 pages.
Wikipedia "XLM" retrieved on Jan. 29, 2007 from http://en.wikipedia.org/wiki/XML; 16 pages.
"VHDL Sample" retrieved on Jan. 29, 2007 from http//www.csee.umbc.edu/helpVHDL/samples/samples.shtml; 10 pages.
Anonymous, "Lotus Notes FAQ—How do you generate unique document numbers?" Sep. 19, 1999; retrieved from www.keysolutions.com on Jul. 9, 2008; 1 page.
Ashok Bindra, "Programmable SoC Delivers A New Level Of System Flexibility"; Electronic Design; Nov. 6, 2000; 11 pages.
Cypress MicroSystem, Inc. "PsoC Designer: Integrated Development Environment User Guide"; Rev. 1.18; Sep. 8, 2003; 193 pages.
Hamblen, "Rapid Prototyping Using Field-Programmable Logic Devices" Jun. 2000, IEEE; 9 pages.
USPTO Non-Final Rejection for U.S. Appl. No. 09/943,062 dated Sep. 11, 2002; 9 pages.
Snyder et al., "Xilinx's A-to-Z Systems Platform" Cahners Microprocessor, The Insider's Guide to Microprocessor Hardware, Feb. 6, 2001; 6 pages.
"PSoC Technology Completely Changes 8-bit MCU System Design" Cypress MicroSystem, Inc. Feb. 19, 2001; 21 pages.
USPTO Non-Final Rejection for U.S. Appl. No. 09/943,062 dated Jan. 27, 2003; 7 pages.
USPTO Final Rejection For U.S. Appl. No. 09/943,062 Dated Jun. 27, 2003; 8 pages.
USPTO Advisory Action for U.S. Appl. No. 09/943,062 dated Sep. 25, 2003; 3 pages.
USPTO Non-Final Rejection for U.S. Appl. No. 09/943,062 dated Dec. 8, 2003; 9 pages.
USPTO Final Rejection for U.S. Appl. No. 09/943,002 dated Apr. 30, 2003; 9 pages.
USPTO Miscellaneous Action for U.S. Appl. No. 09/943,062 dated Jan. 30, 2006; 2 pages.
USPTO Non-Final Rejection for U.S. Appl. No. 09/943,062 dated Jun. 22, 2007; 12 pages.
Huang et al., 'ICEBERG, An Embedded In-Circuit Emulator Snthesizer for Microcontrollers, Proceedings of the 36th Design Automation Conference 1999; 6 pages.
USPTO Final Rejection for U.S. Appl. No. 09/943,062 dated Jan. 18, 2008; 8 pages.
USPTO Advisory Action for U.S. Appl. No. 09/943,062 dated Mar. 27, 2008; 3 pages.
USPTO Notice of Allowance for U.S. Appl. No. 10/113,064 dated Sep. 21, 2006; 7 pages.
USPTO Non-Final Rejection for U.S. Appl. No. 10/113,064 dated Apr. 6, 2006; 19 pages.
USPTO Final Rejection for U.S. Appl. No. 10/113,064 dated Oct. 18, 2005; 22 pages.
USPTO Non-Rejection for U.S. Appl. No. 10/113,064 dated Apr. 25, 2005; 15 pages.
U.S. Appl. No. 10/113,064: "Method and System for Debugging through Supervisory Operating Codes and Self Modifying Codes," Roe et al.; 36 pages, Mar. 29, 2002.
USPTO Non-Final Rejection for U.S. Appl. No. 09/975,115 dated Oct. 9, 2008; 34 pages.
USPTO Final Rejection for U.S. Appl. No. 09/975,115 dated May 12, 2008; 33 pages.
USPTO Non-Final Rejection for U.S. Appl. No. 09/975,115 dated Jan. 7, 2008; 30 pages.
USPTO Non-Final Rejection for U.S. Appl. No. 09/975,115 dated Jul. 31, 2007; 28 pages.
USPTO Final Rejection for U.S. Appl. No. 09/975,115 dated Feb. 21, 2007; 25 pages.

USPTO Non-Final Rejection for U.S. Appl. No. 09/975,115 dated Oct. 31, 2006; 19 pages.
USPTO Final Rejection for U.S. Appl. No. 09/975,115 dated Jun. 23, 2006; 20 pages.
USPTO Non-Final Rejection for U.S. Appl. No. 09/975,115 dated Jan. 11, 2006; 15 pages.
USPTO Non-Final Rejection for U.S. Appl. No. 09/975,115 dated Jul. 27, 2005; 11 pages.
USPTO Non-Final Rejection for U.S. Appl. No. 09/975,115 dated Feb. 11, 2005; 86 pages.
USPTO Final Rejection for U.S. Appl. No. 09/975,338 dated Jan. 31, 2008; 21 pages.
USPTO Non-Final Rejection for U.S. Appl. No. 09/975,338 dated Aug. 14, 2007; 19 pages.
USPTO Final Rejection for U.S. Appl. No. 09/975,338 dated Feb. 27, 2007; 23 pages.
USPTO Non-Final Rejection for U.S. Appl. No. 09/975,338 dated Sep. 6, 2006; 11 pages.
USPTO Advisory Action for U.S. Appl. No. 09/975,338 dated May 15, 2006; 4 pages.
USPTO Final Rejection for U.S. Appl. No. 09/975,338 dated Jan. 18, 2006; 12 pages.
USPTO Non-Final Rejection for U.S. Appl. No. 09/975,338 dated Apr. 5, 2005; 13 pages.
U.S. Appl. No. 09/207,912: "Circuit(s), Architecture and Method(s) for Operating and/or Tuning a Ring Oscillator;" Mar; 23 pages, Dec. 9, 1998.
USPTO Non-Final Rejection for U.S. Appl. No. 10/113,065 dated May 20, 2005; 14 pages.
USPTO Final Rejection for U.S. Appl. No. 10/113,065 dated Oct. 26, 2005; 17 pages.
USPTO Notice of Allowance for U.S. Appl. No. 10/113,065 dated Apr. 6, 2006; 8 pages.
USPTO Non-Final Rejection for U.S. Appl. No. 09/998,834 dated Sep. 20, 2004; 11 pages.
USPTO Notice of Allowance for U.S. Appl. No. 09/998,834 dated May 19, 2005; 7 pages.
USPTO Non-Final Rejection for U.S. Appl. No. 09/998,859 dated May 15, 2003; 6 pages.
USPTO Non-Final Rejection for U.S. Appl. No. 09/998,859 dated May 28, 2003; 6 pages.
USPTO Final Rejection for U.S. Appl. No. 09/998,859 dated Nov. 19, 2003; 5 pages.
USPTO Non-Final Rejection for U.S. Appl. No. 09/998,859 dated Nov. 4, 2004; 6 pages .
USPTO Notice of Allowance for U.S. Appl. No. 09/998,859 dated Mar. 14, 2005; 6 pages.
USPTO Notice of Allowance for U.S. Appl. No. 09/975,105 dated Dec. 4, 2006; 4 pages.
USPTO Final Rejection for U.S. Appl. No. 09/975,105 dated Jul. 13, 2006; 7 pages.
USPTO Non-Final Rejection for U.S. Appl. No. 09/975,105 dated Jan. 19, 2006; 5 pages.
USPTO Non-Final Rejection for U.S. Appl. No. 09/975,105 dated Apr. 19, 2005; 9 pages.
U.S. Appl. No. 09/943,062: "Apparatus and Method for Programmable Power Management in a Programmable Analog Circuit Block;" Mar; 46 pages, Aug. 29, 2001.
U.S. Appl. No. 10/238,966: "Method for Parameterizing a User Module;" Perrin; 41 pages, Sep. 9, 2002.
USPTO Notice of Allowance for U.S. Appl. No. 10/324,455 dated Feb. 12, 2004; 4 pages.
USPTO Non-Final Rejection for U.S. Appl. No. 10/324,455 dated Nov. 6, 2003; 4 pages.
USPTO Non-Final Rejection for U.S. Appl. No. 10/324,455 dated Aug. 21, 2003; 4 pages.
USPTO Final Rejection for U.S. Appl. No. 09/989,778 dated Mar. 16, 2009; 26 pages.
USPTO Final Rejection for U.S. Appl. No. 09/989,765 dated Mar. 31, 2009; 18 pages.
"In-Curcuit Emulators - descriptions of the major ICEs around"; retrieved on Nov. 14, 2005 from http://www.algonet.se/~staffann/developer/emulator.htm; 6 pages.

"Host to FPGA Interface in an In-Circuit Emulation System;" Oct. 10, 2001; U.S. Appl. No. 09/975,105; Nemecek; 44 pages.
USPTO Advisory Action for U.S. Appl. No. 09/994,601 dated May 23, 2006; 3 pages.
USPTO Non-Final Rejection for U.S. Appl. No. 09/994,601 dated Jul. 29, 2004; 10 pages.
USPTO Ex Parte Qualyle Action for U.S. Appl. No. 09/992,076 dated Jun. 18, 2007; 6 pages.
USPTO Non-Final Rejection for U.S. Appl. No. 09/992,076 dated Aug. 10, 2006; 19 pages.
USPTO Notice of Allowance for U.S. Appl. No. 09/992,076 dated Mar. 26, 2008; 23 pages.
USPTO Notice of Allowance for U.S. Appl. No. 09/992,076 dated Jul. 29, 2008; 6 pages.
USPTO Notice of Allowance for U.S. Appl. No. 09/875,599 dated Oct. 17, 2006; 4 pages.
USPTO Non-Final Rejection for U.S. Appl. No. 09/875,599 dated May 31, 2006; 18 pages.
USPTO Final Rejection for U.S. Appl. No. 09/875,599 dated Feb. 15, 2006, 18 pages.
USPTO Final Rejection for U.S. Appl. No. 09/875,599 dated Nov. 21, 2005; 16 pages.
USPTO Advisory Action for U.S. Appl. No. 09/875,599 dated Jun. 8, 2005; 3 pages.
USPTO Final Rejection for U.S. Appl. No. 09/875,599 dated Mar. 29, 2005; 20 pages.
USPTO Non-Final Rejection for U.S. Appl. No. 09/875,599 dated Dec. 3, 2004; 16 pages.
USPTO Final Rejection for U.S. Appl. No. 09/875,599 dated Aug. 25, 2004; 17 pages.
USPTO Final Rejection for U.S. Appl. No. 09/875,599 dated Apr. 26, 2004; 15 pages.
USPTO Non-Final Rejection for U.S. Appl. No. 09/875,599 dated Oct. 27, 2003; 13 pages.
USPTO Notice of Allowance for U.S. Appl. No. 10/004,197 dated Feb. 9, 2007; 7 pages.
USPTO Notice of Allowance for U.S. Appl. No. 10/004,197 dated Oct. 6, 2006; 7 pages.
USPTO Non-Final Rejection for U.S. Appl. No. 10/004,197 dated Apr. 3, 2006; 13 pages.
USPTO Final Rejection for U.S. Appl. No. 10/004,197 dated Nov. 23, 2005, 17 pages.
USPTO Non-Final Rejection for U.S. Appl. No. 10/004,197 dated Jun. 6, 2005; 21 pages.
USPTO Notice of Allowance for U.S. Appl. No. 10/004,039 dated Aug. 15, 2006, 7 pages.
USPTO Non-Final Rejection for U.S. Appl. No. 10/004,039 dated Apr. 11, 2006; 14 pages.
USPTO Final Rejection for U.S. Appl. No. 10/004,039 dated Nov. 22, 2005; 19 pages.
USPTO Non-Final Rejection for U.S. Appl. No. 10/004,039 dated Jun. 6, 2005; 17 pages.
USPTO Notice of Allowance for U.S. Appl. No. 10/001,568 dated Mar. 17, 2006; 9 pages.
USPTO Non-Final Rejection for U.S. Appl. No. 09/826,397 dated Apr. 21, 2004; 6 pages.
USPTO Non-Final Rejection for U.S. Appl. No. 10/001,568 dated May 19, 2005; 16 pages.
USPTO Notice of Allowance for U.S. Appl. No. 09/887,955 dated Oct. 12, 2004; 5 pages.
USPTO Non-Final Rejection for U.S. Appl. No. 09/887,955 dated May 26, 2004; 5 pages.
USPTO Notice of Allowance for U.S. Appl. No. 09/826,397 dated Oct. 7, 2004; 8 pages.
USPTO Non-Final Rejection for U.S. Appl. No. 09/826,397 dated Apr. 21, 2004; 6 pages.
USPTO Notice of Allowance for U.S. Appl. No. 09/893,048 dated Jul. 25, 2006, 4 pages.
USPTO Non-Final Rejection for U.S. Appl. No. 09/893,048 dated Jan. 12, 2006; 6 pages.
USPTO Non-Final Rejection for U.S. Appl. No. 09/893,048 dated Jul. 27, 2005; 6 pages.

USPTO Non-Final Rejection for U.S. Appl. No. 09/893,048 dated Oct. 6, 2004; 5 pages.
USPTO Notice of Allowance for U.S. Appl. No. 09/893,050 dated Jul. 5, 2005; 6 pages.
USPTO Non-Final Rejection for U.S. Appl. No. 09/893,050 dtated Jan. 5, 2005; 13 pages.
USPTO Final Rejection for U.S. Appl. No. 09/893,050 dated Aug. 30, 2004; 13 pages.
USPTO Non-Final Rejection for U.S. Appl. No. 09/893,050 dated Jan. 15, 2004; 9 pages.
USPTO Notice of Allowance for U.S. Appl. No. 09/909,047 dated May 11, 2005; 25 pages.
USPTO Notice of Allowance for U.S. Appl. No. 09/909,047 dated Feb. 15, 2005; 6 pages.
USPTO Non-Final Rejection for U.S. Appl. No. 09/909,047 dated Jul. 6, 2004; 9 pages.
USPTO Notice of Allowance for U.S. Appl. No. 09/912,768 dated Sep. 13, 2005; 5 pages.
USPTO Non-Final Rejection for U.S. Appl. No. 09/912,768 dated Apr. 11, 2005; 14 pages.
USPTO Final Rejection for U.S. Appl. No. 09/912,768 dated Nov. 17, 2004; 13 pages.
USPTO Non-Final Rejection for U.S. Appl. No. 09/912,768 dated Jun. 22, 2004; 11 pages.
USPTO Notice of Allowance for U.S. Appl. No. 09/922,579 dated Dec. 28, 2004; 6 pages.
USPTO Non-Final Rejection for U.S. Appl. No. 09/922,579 dated Aug. 18, 2004; 6 pages.
USPTO Notice of Allowance for U.S. Appl. No. 0131923,461dated May 12, 2005; 6 pages.
USPTO Non-Final Rejection for U.S. Appl. No. 09/923,461 dated Jul. 16, 2004; 6 pages.
USPTO Notice of Allowance for U.S. Appl. No. 09/929,891 dated Dec. 23, 2005; 4 pages.
USPTO Notice of Allowance for U.S. Appl. No. 09/929,891 dated Jun. 15, 2005; 6 pages.
USPTO Non-Final Rejection for U.S. Appl. No. 09/929,891 dated Sep. 13, 2004; 6 pages.
USPTO Notice of Allowance for U.S. Appl. No. 10/803,030 dated Jan. 8, 2007; 6 pages.
USPTO Non-Final Rejection for U.S. Appl. No. 10/803,030 dated Jun. 8, 2005; 4 pages.
USPTO Notice of Allowance for U.S. Appl. No. 10/001,477 dated May 8, 2009; 6 pages.
USPTO Final Rejection for U.S. Appl. No. 09/989,765 dated Mar. 31, 2009; 18 pages.
USPTO Final Rejection for U.S. Appl. No. 09/989,778 dated Mar. 16, 2009; 26 pages.
USPTO U.S. Appl. No. 09/975,105: "Host to FPGA Interface in an In-Circuit Emulation System," Craig Nemecek, filed on Oct. 10, 2001; 44 pages.
USPTO Advisory Action for U.S. Appl. No. 09/994,601 dated May 23, 20/06; 3 pages.
USPTO Non-Final Rejection for U.S. Appl. No. 09/994,601 dated Jul. 29, 2004; 10 pages.
USPTO Ex Parte Qualyle Action for U.S. Appl. No. 09/992,076 dated Jun. 18, 2007; 6 pages.
USPTO Notice of Allowance for U.S. Appl. No. 09/992,076 dated Mar. 26, 2008; 23 pages.
USPTO Notice of Allowance for U.S. Appl. No. 09/992,076 dated Jul. 29, 2008; 6 pages.
Cypress MicroSystem, Inc. "Cypress Customer Forums" retrieved from <http://www.cypress.com/forums/messageview>; Nov. 30, 2004; 1 page.
U.S. Appl. No. 10/002,726: "Method and Apparatus for Generating Microcontroller Configuration Information," Ogami et al., filed on Oct. 24, 2001; 54 pages.
USPTO Notice of Allowance for U.S. Appl. No. 10/002,726 dated Feb. 6, 2007; 7 pages.
USPTO Non-Final Rejection for U.S. Appl. No. 10/002,726 dated Aug. 28, 2006; 10 pages.
USPTO Final Rejection for U.S. Appl. No. 10/002,726 dated Mar. 27, 2006; 8 pages.

USPTO Final Rejection for U.S. Appl. No. 10/002,726 dated Nov. 30, 2005; 10 pages.
USPTO Non-Final Rejection for U.S. Appl. No. 10/002,726 dated Jun. 10, 2005; 10 pages.
USPTO Non-Final Rejection for U.S. Appl. No. 10/002,726 dated Dec. 13, 2004; 7 pages.
U.S. Appl. No. 11/818,005: "Techniques for Generating Microcontroller Configuration Information," Ogami et al., filed on Jun. 12, 2007; 61 pages.
USPTO Requirement for Restriction/Election for U.S. Appl. No. 11/818,005 dated Jul. 14, 2009; 5 pages.
USPTO Advisory Action for U.S. Appl. No. 11/200,619 dated May 11, 2009; 3 pages
USPTO Final Rejection for U.S. Appl. No. 11/200,619 dated Mar. 3, 2009; 14 pages.
USPTO Non-Final Rejection for U.S. Appl. No. 11/200,619 dated Aug. 27, 2008; 13 pages.
U.S. Appl. No. 11/200,619: "Providing hardware independence to automate code generation of processing device firmware," Snyder et al.; filed on Aug. 10, 2005; 41 pages.
USPTO Notice of Allowance for U.S. Appl. No. 11/201,922 dated Apr. 9, 2009; 4 pages.
USPTO Non-Final Rejection for U.S. Appl. No. 11/201,922 dated Oct. 21, 2008; 12 pages.
USPTO Final Rejection for U.S. Appl. No. 11/201,922 dated Apr. 30, 2008; 10 pages.
USPTO Non-Final Rejection for U.S. Appl. No. 11/201,922 dated Oct. 15, 2007; 10 pages.
U.S. Appl. No. 11/201,922: "Design model for a hardware device-independent method of defining embedded firmware for programmable systems," McDonald et al.; filed on Aug. 10, 2005; 31 pages.
USPTO Non-Final Rejection for U.S. Appl. No. 11/201,627 dated Dec. 12, 2008; 17 pages.
USPTO Final Rejection for U.S. Appl. No. 11/201,627 dated Apr. 29, 2008; 21 pages.
USPTO Non-Final Rejection for U.S. Appl. No. 11/201,627 dated Nov. 16, 2007; 16 pages.
U.S. Appl. No. 11/201,627: "Method and an apparatus to design a processing system using a graphical user interface," Ogami et al.; filed on Aug. 10, 2005; 37 pages.
USPTO Notice of Allowance for U.S. Appl. No. 09/989,808 dated Feb. 13, 2006; 4 pages.
USPTO Non-Final Rejection for U.S. Appl. No. 09/989,808 dated Oct. 19, 2005; 8 pages.
USPTO Non-Final Rejection for U.S. Appl. No. 09/989,808 dated Apr. 14, 2005; 8 pages.
U.S. Appl. No. 09/989,808: "Automatic generation of application program interfaces, source code, interrupts, and data sheets for microcontroller programming," Bartz et al., filed on Nov. 19, 2001; 67 pages.
USPTO Notice of Allowance for U.S. Appl. No. 10/109,979 dated Mar. 14, 2006; 6 pages.
USPTO Non-Final Rejection for U.S. Appl. No. 10/109,979 dated Jun. 30, 2005; 6 pages.
U.S. Appl. No. 10/109,979: "Graphical user interface with logic unifying functions," Anderson et al., filed on Mar. 29, 2002; 100 pages.
U.S. Appl. No. 09/979,781: "System and method for decoupling and iterating resources associated with a module," Ogami et al., filed on Nov. 27, 2001; 40 pages.
U.S. Appl. No. 09/989,775: "User defined names for registers in memory banks derived from configurations," Ogami et al., filed on Nov. 19, 2001; 29 pages.
USPTO Notice of Allowance for U.S. Appl. No. 09/989,819 dated Jan. 11, 2005; 7 pages.
USPTO Non-Final Rejection for U.S. Appl. No. 09/989,819 dated Jul. 13, 2004; 4 pages.
USPTO Miscellaneous Action for U.S. Appl. No. 09/989,819 dated Dec. 14, 2001; 1 page.
U.S. Appl. No. 09/989,819: "System and method for creating a boot file utilizing a boot template," Ogami et al., filed on Nov. 19, 2001; 43 pages.

USPTO Notice of Allowance for U.S. Appl. No. 09/989,761 dated Jan. 14, 2005; 6 pages.
USPTO Final Rejection for U.S. Appl. No. 09/989,761 dated Aug. 26, 2004; 7 pages.
USPTO Non-Final Rejection for U.S. Appl. No. 09/989,761 dated Mar. 10, 2004; 6 pages.
USPTO Final Rejection for U.S. Appl. No. 09/989,761 dated Oct. 3, 2003; 7 pages.
USPTO Non-Final Rejection for U.S. Appl. No. 09/989,761 dated Apr. 18, 2003; 5 pages.
U.S. Appl. No. 09/989,761: "Storing of global parameter defaults and using them over two or more design projects," Ogami et al., filed on Nov. 19, 2001; 37 pages.
Wang, et al. "Synthesizing Operating System Based Device Drivers in Embedded Systems," 2003, ACM; 8 pages.
Lutovac of al. "Symbolic Computation of Digital Filter Transfer Function Using Matlab," Proceedings of 23rd International Conference on Microelectronics (MIEL 2002), vol. 2 NIS, Yugoslavia; 4 pages.
Nouta at al. "Design and FPGA-Implementation of Wave Digital Bandpass Filters with Arbitrary Amplitude Transfer Characteristics," *Proceedings of IEEE international Symposium on Industrial Electronics*; 1998, vol. 2; 5 pages.
Xilinx, Virtex-II Pro Platform FPGA Developer's Kit, "How Data2BRAM Fits in with Hardware and Software Flows," Chapter 2: Using Data2BRAM; Jan. 2003 Release; 2 pages.
PCT Preliminary Report on Patentability (Chapter 1 of the Patent Cooperation Treaty), PCT/US2005/028793, filed Aug. 12, 2005, mailed Dec. 21, 2007; 2 pages.
PCT Written Opinion of the International Searching Authority for PCT/US2005/028793, filed Aug. 12, 2005, mailed Nov. 19, 2007; 7 pages.
PCT International Search Report of the International Searching Authority for PCT/US05/28793, filed Aug. 12, 2005, mailed Nov. 19, 2007; 5 pages.
International Search Report and Written Opinion of the International Searching Authority for PCT/US05/28898, filed Aug. 12, 2005, mailed Mar. 6, 2007; 6 pages.
Burogs at al., "Power Converter Analysis and Design using Matlab: A Transfer Function Approach," Proceedings of IEEE International Symposium on Industrial Electronics 1998, vol. 2; 6 pages.
Efstathiou, "Analog Electronics: Basic Circuits of Operational Amplifiers," <http://web.archive.org/web/20021231045232> Dec. 31, 2002, version, retrieved from the Internet Archives; 10 pages.
PCT International Search Report for PCT/US05/28791, filed Aug. 12, 2005, mailed Mar. 31, 2008; 4 pages.
PCT International Written Opinion for PCT/US05/28791, filed Aug. 12, 2005, mailed Mar. 31, 2008; 8 pages.
Kory Hopkins, "Definition;" Jan. 16, 1997; <http://www.cs.sfu.ca/cs/people/GradStudent.html>; 1 page.
Ebeling et al., "Validating VLSI Circuit Layout by Wirelist Comparison;" Sep. 1983; in proceedings of the IEEE International Conference on Computer Aided Design (ICCAD-83); 2 pages.
"The Gemini Netlist Comparison Project;" <http://www.cs.washington.edu/research/projects/lis/www/gemini/gemini.html> larry@cs.washington.edu; Mar. 19, 2002; 2 pages.
Ohlrich et al., "Sub-Gemini: Identifying Subcircuits using a Fast Subgraph Isomorphism Algorithm;" Jun. 1993; in proceedings of the 30th IEEE/ACM Design Automation Conference; 7 pages.
Ebling, "Gemini II: A Second Generation Layout Validation Program;" 1988; in proceedings of the IEEE International Conference on Computer Aided Design (ICCAD-88); 4 pages.
USPTO U.S. Appl. No. 12/132,527: "System and Method for Performing Next Placements and Pruning of Disallowed Placements for Programming an Integrated Circuit;" Ogami et al., filed on Jun. 3, 2008; 44 pages.
USPTO U.S. Appl. No. 12/356,468: "System and Method for Dynamically Generating a Configuration Datasheet," Anderson et al., filed on Jan. 20, 2009; 27 pages.
Written Opinion of the International Search Authority for International U.S. Appl. No. PCT/US08/60680 dated Aug. 15, 2008; 4 pages.

USPTO Notice of Allowance for U.S. Appl. No. 09/475,879 dated Oct. 22, 2004; 7 pages.
USPTO Advisory Action for U.S. Appl. No. 09/475,879 dated Mar. 4, 2002; 3 pages.
USPTO Advisory Action for U.S. Appl. No. 09/475,879 dated Dec. 31, 2001; 3 pages.
USPTO Final Rejection for U.S. Appl. No. 09/475,879 dated Oct. 11, 2001; 10 pages.
USPTO Non-Final Rejection for U.S. Appl. No. 09/475,879 dated Mar. 8, 2001; 6 pages.
USPTO U.S. Appl. No. 09/475,879: "Programmable Logic Device," Lacey et al.; filed on Dec. 30, 1999; 50 pages.
USPTO U.S. Appl. No. 09/475,808: "Configurable Memory for Programmable Logic Circuits," Lacey et al., filed on Dec. 30, 1999; 24 pages.
USPTO Non-Final Rejection for U.S. Appl. No. 09/475,808 dated Jun. 6, 2001; 8 pages.
USPTO Notice of Allowance for U.S. Appl. No. 09/475,808 dated Nov. 6, 2001; 8 pages.
U.S. Appl. No. 10/137,497: "Reconfigurable Testing System and Method," Pleis et al.; filed on May 1, 2002; 40 pages.
USPTO Non-Final Rejection for U.S. Appl. No. 10/137,497 dated Nov. 5, 2004; 17 pages.
USPTO Final Rejection for U.S. Appl. No. 10/137,497 dated May 5, 2005; 13 pages.
USPTO Non-Final Rejection for U.S. Appl. No. 10/137,497 dated Sep. 22, 2005; 21 pages.
USPTO Final Rejection for U.S. Appl. No. 10/137,497 dated Mar. 13, 2006; 15 pages.
USPTO Non-Final Rejection for U.S. Appl. No. 10/137,497 dated Aug. 2, 2006; 21 pages.
USPTO Notice of Allowance for U.S. Appl. No. 10/137,497 dated Jan. 24, 2007; 12 pages.
USPTO Notice of Allowance for U.S. Appl. No. 10/137,497 dated Jul. 20, 2007; 4 pages.
U.S. Appl. No. 10/653,050 (CD01242C): "Method and System for Programming a Memory Device," Snyder et al.; filed on Aug. 29, 2003; 69 pages.
USPTO Non-Final Rejection for U.S. Appl. No. 10/653,050 dated Apr. 6, 2004; 7 pages.
USPTO Notice of Allowance for U.S. Appl. No. 10/653,050 dated Jul. 29, 2004; 3 pages.
U.S. Appl. No. 10/172,670: "Method and System for Programming a Memory Device," Snyder at al.; filed on Jun. 13, 2002; 66 pages.
U.S. Appl. No. 11/986,338: Reconfigurabie Testing System and Method, Pleis et al., filed on Nov. 20, 2007; 41 pages.
USPTO Notice of Allowance for U.S. Appl. No. 11/965,291 dated May 5, 2009; 7 pages.
USPTO Non-Final Rejection for U.S. Appl. No. 11/965,291 dated Dec. 17, 2008; 8 pages.
U.S. Appl. No. 11/965,291: "Universal Digital Block Interconnection and Channel Routing," Snyder et al., filed on Dec. 27, 2007; 31 pages.
USPTO Notice of Allowance for U.S. Appl. No. 11/986,338 dated May 7, 2009; 1 page.
USPTO U.S. Appl. No. 11/273,708: "Capacitance Sensor Using Relaxation Oscillators," Snyder et al., filed on Nov. 14, 2005; 33 pages.
USPTO Non-Final Rejection for U.S. Appl. No. 11/273,708 dated Mar. 19, 2007; 16 pages.
USPTO Final Rejection for U.S. Appl. No. 11/273,708 dated Jul. 5, 2007; 8 pages.
USPTO Notice of Allowance for U.S. Appl. No. 11/273,708 dated Aug. 9, 2007; 4 pages.
USPTO U.S. Appl. No. 11/337,272: "Successive Approximate Capacitance Measurement Circuit;" Warren Snyder, filed on Jan. 20, 2006 29 pages .
USPTO Requirement for Restriction/Election for U.S. Appl. No. 11/337,272 dated Sep. 11, 2006; 5 pages.
USPTO Non-Final Rejection for U.S. Appl. No. 11/337,272 dated Oct. 24, 2006; 9 pages.
USPTO Final Rejection for U.S. Appl. No. 11/337,272 dated Feb. 2, 2007; 11 pages.

USPTO Advisory Action for U.S. Appl. No. 11/337,272 dated Apr. 3, 2007; 3 pages.
USPTO Non-Final Rejection for U.S. Appl. No. 11/337,272 dated May 17, 2007; 11 pages.
USPTO Notice of Allowance for U.S. Appl. No. 11/337,272 dated Aug. 15, 2007; 9 pages.
USPTO U.S. Appl. No. 11/983,291: "Successive Approximate Capacitance Measurement Circuit," Warren Snyder, filed on Nov. 7, 2007; 26 pages.
USPTO Non-Final Rejection for U.S. Appl. No. 11/983,291 dated Mar. 9, 2009; 9 pages.
USPTO U.S. Appl. No. 11/698,660: "Configurable Bus," Kutz et al., filed on Jan. 25, 2007; 35 pages.
USPTO Non-Final Rejection for U.S. Appl. No. 11/698,660 dated Dec. 2, 2008; 12 pages.
USPTO Final Rejection for U.S. Appl. No. 11/698,660 dated May 28, 2009; 12 pages.
USPTO U.S. Appl. No. 11/709,866: "Input/Output Multiplexer Bus," Dennis Sequine, filed on Feb. 21, 2007; 33 pages.
USPTO Non-Final Rejection for U.S. Appl. No. 11/709,866 dated Nov. 7, 2008; 14 pages.
USPTO Notice of Allowance for U.S. Appl. No. 11/709,866 dated Apr. 7, 2009; 8 pages.
Sedra et al., "Microelectronic Circuits," 3rd Edition, 1991, Oxford University Press; 20 pages.
Van Ess, David; "Simulating a 555 Timer with PSoC," Cypress Semiconductor Corporation, Application Note AN2286, May 19, 2005; 10 pages.
Cypress Semiconductor Corporation, "FAN Controller CG6457AM and CG6462AM," PSoC Mixed Signal Array Preliminary Data Sheet; May 24, 2005; 25 pages.
Cypress Semiconductor Corporation, "PSoC Mixed-Signal Controllers," Production Description; –http://www.cypress.com/portal/server>; retrieved on Sep. 27, 2005; 2 pages.
Cypress Semiconductor Corporation, "CY8C21x34 Data Sheet," CSR User Module, CSR V.1.0; Oct. 6, 2005; 36 pages.
Chapweske, Adam; "The PS/2 Mouse Interface," PS/2 Mouse Interfacing, 2001; 11 pages.
Cypress Semiconductor Corporation, "Cypress Introduces PSoC(TM)-Based Capacitive Touch Sensor Solution," Cypress Press Release; May 31, 2005; <http://www.cypress.com/portal/server>; retrieved on Feb. 5, 2007; 4 pages.
Seguine, Ryan; "Layout Guidelines for PSoC CapSense," Cypress Semiconductor Corporation, Application Note AN2292; Jul. 22, 2005; 13 pages.
Lee, Mark; "EMC Design Considerations for PSoC CapSense Applications," Cypress Semiconductor Corporation, Application Note AN2318; Sep. 16, 2005; 6 pages.
Cypress Semiconductor Corporation, "Release Notes srn017," Jan. 24, 2007; 3 pages.
Cypress Semiconductor Corporation, "PSoC CY8C20x34 Technical Reference Manual (TRM)," PSoC CY8C20x34 TRM, Version 1.0, 2006; 220 pages.
USPTO U.S. Appl. No. 11/166,622: "Touch wake for electronic devices," Beard et al., filed on Jun. 23, 2005; 22 pages.
International Written Opinion of the International Searching Authority for International Application No. PCT/ US2006/09572 dated Jan. 10, 2008; 5 pages.
International Search Report for International Application No. PCT/US2006/09572 dated Jan. 10, 2008; 2 pages.
USPTO Notice of Allowance for U.S. Appl. No. 10/024,093 dated Sep. 10, 2002; 7 pages.
USPTO U.S. Appl. No. 10/024,093: "Configurable Memory for Programmable Logic Circuits," Lacey et al., filed on Dec. 18, 2001; 25 pages.
U.S. Appl. No. 11/088,028: "Method and Circuit for Rapid Alignment of Signals," Moyal et al., filed on Nov. 13, 2007; 34 pages.
USPT Notice of Allowance for U.S. Appl. No. 11/088,028 dated Jul. 2, 2007; 6 pages.
USPT Notice of Allowance for U.S. Appl. No. 11/088,028 dated Jan. 26, 2007; 6 pages.
USPT Non-Final Rejection for U.S. Appl. No. 11/088,028 dated Jun. 16, 2006; 8 pages.

U.S. Appl. No. 11/985,340: "Method and Circuit for Rapid Alignment of Signals," Moyal et al., filed on Nov. 13, 2007; 34 pages.
USPTO Notice of Allowance for U.S. Appl. No. 11/985,340 dated Jun. 2, 2009; 7 pages.
USPTO Requirement for Restriction for U.S. Appl. No. 11/985,340 dated Mar. 16, 2009; 7 pages.
USPTO Non-Final Rejection for U.S. Appl. No. 11/865,672 dated Jul. 17, 2009; 6 pages.
USPTO Non-Final Rejection for U.S. Appl. No. 11/859,547 dated Oct. 1, 2009; 9 pages.
USPTO Non-Final Rejection for U.S. Appl. No. 11/967,243 dated Sep. 17, 2009; 9 pages.
USPTO Non-Final Rejection for U.S. Appl. No. 11/967,240 dated Jun. 10, 2009; 7 pages.
USPTO Non-Final Rejection for U.S. Appl. No. 11/857,947 dated Mar. 30, 2009; 18 pages.
USPTO Non-Final Rejection for U.S. Appl. No. 12/104,672 dated Aug. 26, 2009; 11 pages.
USPTO Non-Final Rejection for U.S. Appl. No. 12/060,128 dated Apr. 29, 2009; 11 pages.
International Search Report of the International Searching Authority for international Application No. PCT/US08/60695 dated Jul. 22, 2009; 3 pages.
Written Opinion of the International Searching Authority for International Application No. PCT/US08/60695 dated Jul. 22, 2009; 6 pages.
Azim et al., "A Custom DSP Chip to Implement a Robot Motion Controller Proceedings of the IEEE Custom Integrated Circuits Conference," May 1988, pp. 8.7.1-8.7.5; 6 pages.
Catthoor et al., "Architectural Strategies for an Application-Specific Synchronous Multiprocessor Environment," IEEE transactions on Acoustics, Speech, and Signal Processing; vol. 36, No. 2, Feb. 1988, pp. 265-284; 20 pages.
International Search Report of the International Searching Authority for International Application No. PCT/US08/60696 dated Sep. 22, 2008; 2 pages.
International Search Report of the International Searching Authority for International Application No. PCT/US08/60698 dated Sep. 5, 2008; 2 pages.
Shahbahrarni et al., "Matrix Register File and Extended Subwords: Two Techniques for Embedded Media Processors," ACM, May 2005; 9 pages.
Jung et at., "A Register File with Transposed Access Mode," 2000, IEEE; 2 pages.
International Search Report of the International Searching Authority for International Application No. PCT/US08/60681 dated Sep. 12, 2008; 2 pages.
Written Opinion of the International Searching Authority for International Application No. PCT/US08/60681 dated Sep. 12, 2009; 4 pages.
USPTO Non-Final Rejection for U.S. Appl. No. 11/965,677 dated Mar. 10, 2009; 10 pages.
USPTO Non-Final Rejection for U.S. Appl. No. 11/965,677 dated Mar. 10, 2009; 10 pages.
Written Opinon of the International Searching Authority for International Application No. PCT/US08/60696 dated Sep. 22, 2008; 4 pages.
USPTO Non-Final Rejection for U.S. Appl. No. 10/001,478 dated Aug. 4, 2009; 17 pages.
USPTO Advisory Action for U.S. Appl. No. 101001,478 dated Jun. 30, 2009; 3 pages.
USPTO Final Rejection for U.S. Appl. No. 10/001,478 dated Apr. 20, 2009; 16 pages.
USPTO Notice of Allowance for U.S. Appl. No. 10/002,217 dated Sep. 17, 2009; 6 pages.
USPTO Notice of Allowance for U.S. Appl. No. 10/002,217 dated Jun. 8, 2009; 8 pages.
USPTO Notice of Allowance for U.S. Appl. No. 10/001,477 dated Dec. 4, 2009; 7 pages.
USPTO Notice of Allowance for U.S. Appl. No. 10/001,477 dated Aug. 26, 2009; 6 pages.
USPTO Ex Parte Quayle Action for U.S. Appl. No. 09/975,115 dated Aug. 20, 2009; 7 pages.

USPTO Non-Final Rejection for U.S. Appl. No. 09/994,601 dated Jul. 9, 2009; 11 pages.
USPTO Non-Final Rejection for Application No. 11/818,005 dated Nov. 23, 2009; 8 pages.
USPTO Requirement for Restriction/Election for Application No. 11/818,005 dated Jul. 14, 2009; 5 pages.
USPTO Advisory Action for Application No. 09/989,778 dated Jun. 17, 2009; 3 pages.
USPTO Notice of Allowance for Application No. 09/989,762 dated Oct. 30, 2009; 6 pages.
USPTO Notice of Allowance for Application No. 09/989,762 dated Jul. 16, 2009; 6 pages.
USPTO Non-Final Rejection for U.S. Appl. No. 09/998,848 dated May 12, 2009; 16 pages.
USPTO Non-Final Rejection for U.S. Appl. No. 09/989,767 dated May 12, 2009; 21 pages.
USPTO Final Rejection for Application No. 09/989,771 dated Nov. 25, 2009; 12 pages.
USPTO Notice of Allowance for Application No. 09/989,765 dated Sep. 3, 2009; 7 pages.
USPTO Non-Final Rejection for U.S. Appl. No. 09/989,782 dated Oct. 27, 2009; 9 pages.
USPTO Final Rejection for U.S. Appl. No. 09/989,782 dated May 15, 2009; 10 pages.
USPTO Final Rejection for U.S. Appl. No. 09/989,767 dated Dec. 7, 2009; 22 pages.
USPTO Notice of Allowance for U.S. Appl. No. 10/008,096 dated Oct. 21, 2009; 6 pages.
USPTO Notice of Allowance for U.S. Appl. No. 10/008,096 dated Jun. 5, 2009; 12 pages.
USPTO Notice of Allowance for U.S. Appl. No. 11/985,340 dated Nov. 9, 2009; 7 pages.
USPTO Advisory Action for U.S. Appl. No. 11/201,627 dated Sep. 21, 2009; 3 pages.
USPTO Final Rejection for U.S. Appl. No. 11/201,627 dated Jul. 7, 2009; 19 pages.
USPTO Miscellaneous Action for U.S. Appl. No. 11/201,922 dated Oct. 1, 2009; 2 pages.
USPTO Non-Final Rejection for U.S. Appl. No. 11/200,619 dated Jun. 17, 2009; 12 pages.
USPTO Non-Final Rejection for U.S. Appl. No. 11/166,622 dated Sep. 29, 2009; 11 pages.
USPTO Advisory Action for U.S. Appl. No. 11/166,622 dated May 27, 2009; 3 pages.
USPTO Final Rejection for U.S. Appl. No. 11/166,622 dated Mar. 10, 2009; 11 pages.
USPTO Notice of Allowance for U.S. Appl. No. 12/218,404 dated Nov. 3, 2009; 8 pages.
USPTO Notice of Allowance for U.S. Appl. No. 12/218,404 dated Jul. 10, 2009; 7 pages.
USPTO Notice of Allowance for U.S. Appl. No. 11/709,866 dated Aug. 4, 2009; 7 pages.
USPTO Non-Final Rejection for U.S. Appl. No. 11/698,660 dated Oct. 7, 2009; 12 pages.
USPTO Advisory Action for U.S. Appl. No. 11/698,660 dated Jul. 31, 2009; 3 pages.
USPTO Notice of Allowance for U.S. Appl. No. 11/983,291 dated Oct. 22, 2009; 7 pages.
USPTO Final Rejection for U.S. Appl. No. 11/983,291 dated Aug. 12, 2009; 10 pages.
USPTO Final Rejection for U.S. Appl. No. 11/322,044 dated Oct. 19, 2009; 10 pages.
USPTO Final Rejection for U.S. Appl. No. 11/644,100 dated Aug. 19, 2009; 12 pages.
USPTO Advisory Action for U.S. Appl. No. 11/850,260 dated Nov. 2, 2009; 3 pages.
USPTO Final Rejection for U.S. Appl. No. 11/850,260 dated Aug. 21, 2009; 9 pages.
USPTO Final Rejection for U.S. Appl. No. 11/698,660 dated Feb. 16, 2010; 14 pages.
USPTO Notice of Allowance for U.S. Appl. No. 09/989,765 dated Dec. 22, 2009; 8 pages.
USPTO Notice of Allowance for U.S. Appl. No. 10/002,217 dated Jan. 11, 2010; 7 pages.
USPTO Non-Final Rejection for U.S. Appl. No. 10/133,581 dated Feb. 24, 2006; 11 pages.
USPTO Notice of Allowance for U.S. Appl. No. 09/975,115 dated Jan. 29, 2010; 9 pages.
USPTO Final Rejection for U.S. Appl. No. 09/994,601 dated Jan. 5, 2010; 13 pages.
USPTO Non-Final Rejection for U.S. Appl. No. 09/998,848 dated Dec. 10, 2009; 16 pages.
USPTO Notice of Allowance for U.S. Appl. No. 10/008,096 dated Feb. 1, 2010; 6 pages.
USPTO Non-Final Rejection for U.S. Appl. No. 11/201,627 dated Dec. 24, 2009; 22 pages.
USPTO Final Rejection for U.S. Appl. No. 11/200,619 dated Jan. 4, 2010; 18 pages.
USPTO Non-Final Rejection for U.S. Appl. No. 11/644,100 dated Dec. 16, 2009; 13 pages.
USPTO Non-Final Rejection for U.S. Appl. No. 11/850,260 dated Jan. 14, 2010; 8 pages.
USPTO Notice of Allowance for U.S. Appl. No. 09/989,762 dated Feb. 22, 2010; 7 pages.
USPTO Non-Final Rejection for U.S. Appl. No. 12/136,557 dated Mar. 15, 2010; 10 pages.
USPTO Notice of Allowance for U.S. Appl. No. 11/985,340 dated Feb. 19, 2010; 8 pages.
USPTO Notice of Allowance for U.S. Appl. No. 12/218,404 dated Feb. 16, 2010; 7 pages.
USPTO Notice of Allowance for U.S. Appl. No. 11/709,866 dated Feb. 16, 2010; 7 pages.
USPTO Non-Final Rejection for U.S. Appl. No. 10/133,581 dated Aug. 12, 2005; 12 pages.
USPTO Notice of Allowance for U.S. Appl. No. 10/133,581 dated Mar. 5, 2010; 9 pages.
USPTO Non-Final Rejection for U.S. Appl. No. 10/133,581 dated Sep. 1, 2009; 18 pages.
USPTO Final Rejection:for U.S. Appl. No. 10/133,581 dated May 11, 2009; 21 pages.
USPTO Non-Final Rejection for U.S. Appl. No. 10/133,581 dated Nov. 26, 2008; 20 pages.
USPTO Final Rejection for U.S. Appl. No. 10/133,581 dated Jun. 11, 2008; 14 pages.
USPTO Non-Final Rejection for U.S. Appl. No. 10/133,581 dated Nov. 27, 2007; 15 pages.
USPTO Final Rejection for U.S. Appl. No. 10/133,581 dated Jul. 13, 2007; 15 pages.
USPTO Non-Final Rejection for U.S. Appl. No. 10/133,581 dated Jan. 10, 2007; 14 pages.
USPTO Final Rejection for U.S. Appl. No. 10/133,581 dated Aug. 10, 2006; 13 pages.
USPTO Notice of Allowance for U.S. Appl. No. 10/001,477 dated Mar. 23, 2010; 6 pages.
USPTO Notice of Allowance for U.S. Appl. No. 09/989,765 dated Mar. 31, 2010; 8 pages.
USPTO Non-Final Rejection for U.S. Appl. No. 11/965,677 dated Mar. 10, 2009; 10 pages.
USPTO Non-Final Rejection for U.S. Appl. No. 11/965,677 dated Mar. 10, 2009; 10 pages.
Written Opinion of the International Searching Authority for International Application No. PCT/US08/60696 dated Sep. 22, 2008; 4 pages.
USPTO Notice of Allowance for U.S. Appl. No. 10/238,966 dated Aug. 5, 2009; 5 pages.
USPTO Notice of Allowance for U.S. Appl. No. 10/033,027 dated Sep. 2, 2009; 4 pages.
USPTO Non-Final Rejection for U.S. Appl. No. 10/001,478 dated Aug. 4, 2009; 17 pages
USPTO Advisory Action for U.S. Appl. No. 10/001,478 dated Jun. 30, 2009; 3 pages.
USPTO Final Rejection for U.S. Appl. No. 10/001,478 dated Apr. 20, 2009; 16 pages.
USPTO Notice of Allowance for U.S. Appl. No. 10/002,217 dated Sep. 17, 2009; 6 pages.

USPTO Notice of Allowance for U.S. Appl. No.10/002,217 dated Jun. 8, 2009; 8 pages.
USPTO Notice of Allowance for U.S. Appl. No. 10/001,477 dated Dec. 4, 2009; 7 pages.
USPTO Notice of Allowance for U.S. Appl. No. 10/001,477 dated Aug. 26, 2009; 6 pages.
USPTO Ex Parte Quayle Action for U.S. Appl. No. 09/975,115 dated Aug. 20, 2009; 7 pages.
USPTO Non-Final Rejection for U.S. Appl. No. 09/994,601 dated Jul. 9, 2009; 11 pages.
USPTO Non-Final Rejection for U.S. Appl. No. 111818,005 dated Nov. 23, 2009; 8 pages.
USPTO Requirement for Restriction/Election for U.S. Appl. No. 11/818,005 dated Jul. 14, 2009; 5 pages.
USPTO Advisory Action for U.S. Appl. No. 09/989,778 dated Jun. 17, 2009; 3 pages.
USPTO Notice of Allowance for U.S. Appl. No. 09/994,600 dated Aug. 25, 2009; 4 pages.
USPTO Notice of Allowance for U.S. Appl. No. 09/994,600 dated Apr. 3, 2009; 5 pages.
USPTO Notice of Allowance for U.S. Appl. No. 09/989,762 dated Oct. 30, 2009; 6 pages.
USPTO Notice of Allowance for U.S. Appl. No. 09/989,762 dated Jul. 16, 2009; 6 pages.
USPTO Non-Final Rejection for U.S. Appl. No. 09/998,848 dated May 12, 2009; 16 pages.
USPTO Non-Final Rejection for U.S. Appl. No. 09/989,767 dated May 12, 2009; 21 pages.
USPTO Final Rejection for U.S. Appl. No. 09/989,771dated Nov. 25, 2009; 12 pages.
USPTO Notice of Allowance for U.S. Appl. No. 09/989,765 dated Sep. 3, 2009; 7 pages.
USPTO Non-Final Rejection for U.S. Appl. No. 09/989,782 dated Oct. 27, 2009; 9 pages.
USPTO Final Rejection for U.S. Appl. No. 09/989,782 dated May 15, 2009; 10 pages.
USPTO Final Rejection for U.S. Appl. No. 09/989,767 dated Dec. 7, 2009; 22 pages.
USPTO Final Rejection for U.S. Appl. No. 09/989,767 dated Dec. 7, 2009; 22 pages.
USPTO Notice of Allowance for U.S. Appl. No. 10/008,096 dated Oct. 21, 2009; 6 pages.
USPTO Notice of Allowance for U.S. Appl. No. 10/008,096 dated Jun. 5, 2009; 12 pages.
USPTO Notice of Allowance for U.S. Appl. No. 11/985,340 dated Nov. 9, 2009; 7 pages.
USPTO Advisory Action for U.S. Appl. No. 11/201,627 dated Sep. 21, 2009; 3 pages.
USPTO Final Rejection for U.S. Appl. No. 11/201,627 dated Jul. 7, 2009; 19 pages.
USPTO Miscellaneous Action for U.S. Appl. No. 11/201,922 dated Oct. 1, 2009; 2 pages.
USPTO Non-Final Rejection for U.S. Appl. No. 11/200,619 dated Jun. 17, 2009; 12 pages.
USPTO Non-Final Rejection for U.S. Appl. No. 11/166,622 dated Sep. 29, 2009; 11 pages
USPTO Advisory Action for U.S. Appl. No. 11/166,622 dated May 27, 2009; 3 pages.
USPTO Final Rejection for U.S. Appl. No. 11/166,622 dated Mar. 10, 2009; 11 pages.
USPTO Notice of Allowance for U.S. Appl. No. 12/218,404 dated Nov. 3, 2009; 8 pages.
USPTO Notice of Allowance for U.S. Appl. No. 12/218,404 dated Jul. 10, 2009; 7 pages.
USPTO Notice of Allowance for U.S. Appl. No. 11/709,866 dated Aug. 4, 2009; 7 pages.
USPTO Non-Final Rejection for U.S. Appl. No. 11/698,660 dated Oct. 7, 2009; 12 pages.
USPTO Advisory Action for U.S. Appl. No. 11/698,660 dated Jul. 31, 2009; 3 pages.
USPTO Notice of Allowance for U.S. Appl. No. 11/983,291 dated Oct. 22, 2009; 7 pages.
USPTO Final Rejection for U.S. Appl. No. 11/983,291 dated Aug. 12, 2009; 10 pages.
USPTO Final Rejection for U.S. Appl. No. 11/322,044 dated Oct. 19, 2009; 10 pages.
USPTO Final Rejection for U.S. Appl. No. 11/644,100 dated Aug. 19, 2009; 12 pages.
USPTO Advisory Action for U.S. Appl. No. 11/850,260 dated Nov. 2, 2009; 3 pages.
USPTO Final Rejection for U.S. Appl. No. 11/850,260 dated Aug. 21, 2009; 9 pages.
USPTO Final Rejection for U.S. Appl. No. 11/698,660 dated Feb. 16, 2010; 14 pages.
USPTO Notice of Allowance for U.S. Appl. No. 09/989,765 dated Dec. 22, 2009; 8 pages.
USPTO Notice of Allowance for U.S. Appl. No. 09/994,600 dated Jan. 4, 2010; 4 pages.
USPTO Notice of Allowance for U.S. Appl. No. 10/002,217 dated Jan. 11, 2010; 7 pages.
USPTO Non-Final Rejection for U.S. Appl. No. 10/133,581 dated Feb. 24, 2006; 11 pages.
USPTO Notice of Allowance for U.S. Appl. No. 11/965,291 dated Jan. 13, 2010; 4 pages.
USPTO Notice of Allowance for U.S. Appl. No. 09/975,115 dated Jan. 29, 2010; 9 pages.
USPTO Notice of Allowance for U.S. Appl. No. 10/238,966 dated Feb. 1, 2010; 4 pages.
USPTO Final Rejection for U.S. Appl. No. 09/994,601 dated Jan. 5, 2010; 13 pages.
USPTO Non-Final Rejection for U.S. Appl. No. 09/998,848 dated Dec. 10, 2009; 16 pages.
USPTO Notice of Allowance for U.S. Appl. No. 10/008,096 dated Feb. 1, 2010; 6 pages.
USPTO Non-Final Rejection for U.S. Appl. No. 11/201,627 dated Dec. 24, 2009; 22 pages.
USPTO Final Rejection for U.S. Appl. No. 11/200,619 dated Jan. 4, 2010; 18 pages.
USPTO Non-Final Rejection for U.S. Appl. No. 11/644,100 dated Dec. 16, 2009; 13 pages.
USPTO Non-Final Rejection for U.S. Appl. No. 11/850,260 dated Jan. 14, 2010; 8 pages.
USPTO Notice of Allowance for U.S. Appl. No. 10/033,027 dated Feb. 18, 2010; 4 pages.
USPTO Notice of Allowance for U.S. Appl. No. 09/989,762 dated Feb. 22, 2010; 7 pages.
USPTO Notice of Allowance for U.S. Appl. No. 11/986,338 dated Feb. 16, 2010; 4 pages.
USPTO Non-Final Rejection for U.S. Appl. No. 12/136,557 dated Mar. 15, 2010; 10 pages.
USPTO Notice of Allowance for U.S. Appl. No. 11/965,677 dated Feb. 12, 2010; 4 pages.
USPTO Notice of Allowance for U.S. Appl. No. 11/985,340 dated Feb. 19, 2010; 8 pages.
USPTO Notice of Allowance for U.S. Appl. No. 12/218,404 dated Feb. 16, 2010; 7 pages.
USPTO Notice of Allowance for U.S. Appl. No. 11/709,866 dated Feb. 16, 2010; 7 pages.
USPTO Non-Final Rejection for U.S. Appl. No. 10/133,581 dated Aug. 12, 2005; 12 pages.
USPTO Notice of Allowance for U.S. Appl. No. 10/133,581 dated Mar. 5, 2010; 9 pages.
USPTO Non-Final Rejection for U.S. Appl. No. 10/133,581 dated Sep. 1, 2009; 18 pages.
USPTO Final Rejection for U.S. Appl. No. 10/133,581 dated May 11, 2009; 21 pages.
USPTO Non-Final Rejection for U.S. Appl. No. 10/133,581 dated Nov. 26, 2008; 20 pages.
USPTO Final Rejection for U.S. Appl. No. 10/133,581 dated Jun. 11, 2008; 14 pages.
USPTO Non-Final Rejection for U.S. Appl. No. 10/133,581 dated Nov. 27, 2007; 15 pages.

USPTO Final Rejection for U.S. Appl. No. 10/133,581 dated Jul. 13, 2007; 15 pages.
USPTO Non-Final Rejection for U.S. Appl. No. 10/133,581 dated Jan. 10, 2007; 14 pages.
USPTO Final Rejection for U.S. Appl. No. 10/133,581 dated Aug. 10, 2006; 13 pages.
USPTO Notice of Allowance for U.S. Appl. No. 10/001,477 dated Mar. 23, 2010; 6 pages.
USPTO Notice of Allowance for U.S. Appl. No. 09/989,765 dated Mar. 31, 2010; 8 pages.

* cited by examiner

SLEEP AND STALL IN AN IN-CIRCUIT EMULATION SYSTEM

This application is related to commonly-owned U.S. Provisional Application 60/243,708, filed Oct. 26, 2000, U.S. patent application Ser. Nos. 09/998,834, filed Nov. 15, 2001, issued as U.S. Pat. No. 6,957,180, 9/998,859, filed Nov. 15, 2001 issued as U.S. Pat. No. 6,922,821, 09/975,030, filed Oct. 10, 2001, 09/975,105, filed Oct. 10, 2001, 09/975,338, filed Oct. 10, 2001 issued as U.S. Pat. No. 7,206,733, 09/992,076, filed Nov. 13, 2001, 10/001,477, filed Nov. 1, 2001, 10/001,478, filed Nov. 1, 2001, 10/001,568, filed Nov. 1, 2001 issued as U.S. Pat. No. 7,089,175, 10/004,039, filed Nov. 14, 2001 issued as U.S. Pat. No. 7,162,410, 10/004,197, filed Nov. 14, 2001 issued as U.S. Pat. No. 7,236,921, 10/113,064, filed Mar. 29, 2002 issued as U.S. Pat. No. 7,185,321, 10/002,217, filed Nov. 1, 2001, 09/998,859, filed Nov. 15, 2001 issued as U.S. Pat. No. 6,922,821, and 10/113,065, filed Mar. 29, 2002 issued as U.S. Pat. No. 7,099,818.

FIELD OF THE INVENTION

This invention relates generally to the field of In Circuit Emulation. More particularly, this invention relates to methods and apparatus for performing sleep and stall operations in an in-circuit emulation system.

BACKGROUND OF THE INVENTION

In-circuit emulation (ICE) has been used by software and hardware developers for a number of years as a development tool to emulate the operation of complex circuit building blocks and permit diagnosis and debugging of hardware and software. In-circuit emulation is most commonly used to analyze and debug the behavior of complex devices such as microcontrollers and microprocessors.

In conventional in-circuit emulation systems, a host computer (e.g., a personal computer) is connected to a debug logic block which is further connected to a special version of the microcontroller device that has been developed specially for use in emulation. Some in-circuit emulation systems use a bond-out version of the microcontroller that includes wirebonding pads on the chip that are not normally connected in the production wirebonding. These pads are connected to pins on the microcontroller package to permit access to otherwise inaccessible points of the circuit to facilitate debugging. This technique has the disadvantage of imposing significant limitations on the circuit layout to permit space and circuitry associated with the special wirebonding pads. Also, interface circuitry and other special circuitry is typically added to facilitate the debugging and bond-out. This increases the complexity, size, power consumption and potentially reduces the yield of the production part. Moreover, development resources are required to design and lay out the bond-out circuitry and pads.

Other in-circuit emulation systems use a special "probe mode" of operation of the processor in which a number of internal signals are routed to a "debug port" for use by the in-circuit emulation system. In these systems, the debug port allows the in-circuit emulation system to communicate with the processors at all times and, when placed in probe mode, to read otherwise inaccessible probe points within the processor. Of course, providing such a probe mode requires significant design resources, increasing development cost, chip complexity and chip size.

In in-circuit emulation operations, operational instructions are loaded from the host computer through the debug logic to the special version of the microcontroller. The debug logic monitors operation of the microcontroller as the instructions are executed. Depending upon the application, this operation may be monitored while the special version of the microcontroller is interconnected with the circuitry that is intended to interface a production version of the microcontroller in the finished product under development. As the circuit is stepped through its operation, the debug logic gathers information about the state of various components of the microcontroller during operation and feeds that information back to the host computer for analysis.

During the course of the analysis, various trace information such as time stamps, register values, data memory content, etc. may be logged in the host computer for analysis and debugging by the designer. Additionally, it is generally the case that various break points can be defined by the designer that cause the program to halt execution at various points in the operation to permit detailed analysis. Other debugging tools may also be provided to enable the user to debug the operation of the circuit.

During the course of the analysis, the microcontroller can perform a sleep function in which the microcontroller "sleeps" or pauses some or all operations. During a typical sleep function the CPU clock of the microcontroller stops operating to conserve battery power. Also, the microcontroller can perform a stall operation in which the microcontroller pauses some operations. During a typical stall operation the CPU clock of the microcontroller continues to operate. Sleep and stall operations should be addressed in in-circuit emulation systems to assure that the in-circuit emulation system emulates the sleep or stall operation.

SUMMARY OF THE INVENTION

The method and apparatus of the present invention effectively provides in-circuit emulation using an emulation device that operates in lock-step fashion with the device under test. The method and apparatus of the present invention effectively handles sleep and stall operations such that the emulation device and the device under test continue to operate in lock-step after sleep and stall operations have been performed.

A system that includes a device under test and that includes an emulator device is disclosed. The emulator device emulates the functions of the device under test by operating in lock-step fashion with the device under test. In one embodiment, the emulator device is a Field Programmable Gate Array (FPGA) device and the device under test is a microcontroller. A host PC can be coupled to the emulator device. The FPGA is programmed to operate as a virtual microcontroller, performing a set of instructions that are also performed by the microcontroller in lock-step fashion. In the present embodiment, only the core processing functions of the microcontroller are performed in lock-step fashion. However, alternatively, any or all instructions or sequences of instructions performed by the microcontroller could be performed in lock-step fashion by the FPGA.

More specifically, for a system that includes a device under test and that includes an emulator device that emulates the functions of the device under test by operating in lock-step fashion with the device under test, a method for performing a sleep operation is disclosed in which the device under test initiates the sleep function upon receiving a first signal that indicates that a sleep function is to be performed and turns off its clocks. In one embodiment, the first signal is generated internally by the device under test and is transmitted internally to a register that indicates that a sleep function is to be performed.

The emulator device discontinues execution of the sequence of instructions that are performed in lock-step when the clock is turned off. More particularly, when clock signals are no longer received at the emulator device, the emulator device discontinues execution of the sequence of instructions that are performed in lock-step.

When the sleep function has been completed by the device under test a second signal (the wake-up signal) is sent from the device under test to the emulator device. Upon receiving the second signal at the emulator device, the emulator device determines the number of clock signals received at the emulator device since the second signal was received. Execution of the sequence of instructions that are performed in lock-step fashion at the emulator device is resumed when the determined number of clock signals received equals a predetermined value.

Also, for a system that includes a device under test and that includes an emulator device that emulates the functions of the device under test by operating in lock-step fashion with the device under test, a method for performing a stall operation is disclosed. In the present embodiment, the device under test conveys clock signals (e.g., from the microcontroller CPU clock) to the emulator device.

The device under test initiates the stall function upon receiving a first signal that indicates that a stall function is to be performed. In one embodiment, the first signal is generated internally by the device under test and is transmitted internally to a register that indicates that a stall function is to be performed. Upon receiving the first signal, the device under test discontinues sending clock signals to the emulator device. The emulator device discontinues execution of instructions that are performed in lock-step fashion while sending of clock signals is discontinued.

When the stall function has been completed by the device under test sending of clock signals to the emulator device is resumed. Upon receiving the clock signals, the emulator device resumes execution of the sequence of instructions that are performed in lock-step.

Accordingly, both the device under test and the emulator device stop and resume execution of the sequence of instructions that are performed in lock-step fashion during both sleep and stall functions in such a manner as to assure that the device under test and the emulator device remain in lock-step.

Thereby, the method and apparatus of the present invention effectively provides in-circuit emulation using an emulation device that operates in lock-step with the device under test. Also, the method and apparatus of the present invention effectively handles sleep and stall operations such that the emulation device and the device under test continue to operate in lock-step after sleep and stall operations are completed.

It is appreciated that the emulator and emulation methods described herein can work equally well with any programmable device, and that the microcontroller described herein is one example.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Figure 1:
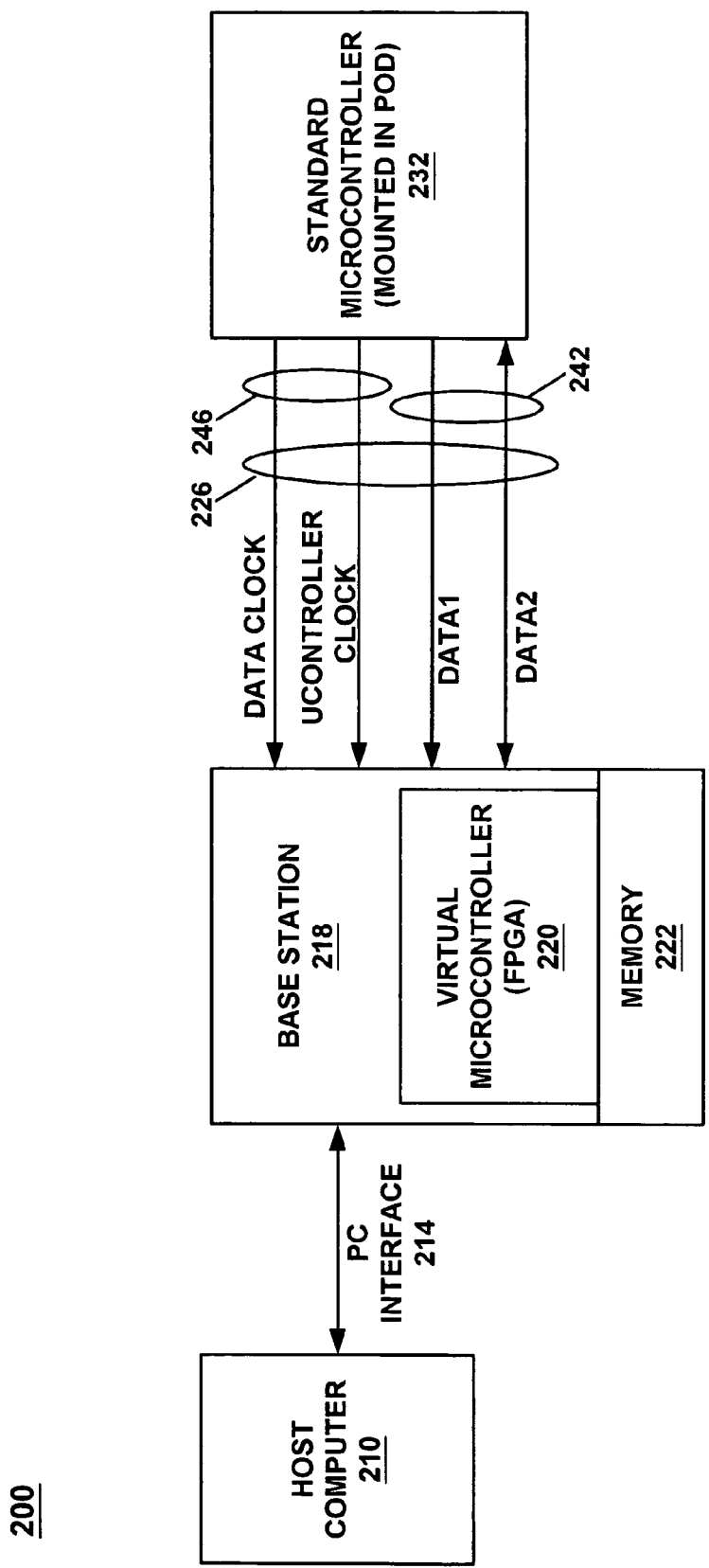
FIG. 1 is a block diagram of an exemplary In-Circuit Emulation system in accordance with an embodiment of the present invention.

In the following detailed description of the present invention, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

NOTATION AND NOMENCLATURE

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities.

Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "generating" or "executing" or "determining" or "conveying" or "initiating" or "sending" or "receiving" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

In-Circuit Emulation System

Referring now to FIG. 1, a system 200 is shown that includes a host computer 210 (e.g., a personal computer based on a PENTIUM® class microprocessor) that is interconnected (e.g., using a standard PC interface 214 such as a parallel printer port connection, a universal serial port (USB) connection, etc.) with a base station 218. The host computer 210 generally operates to run an ICE computer program to control the emulation process and further operates in the capacity of a logic analyzer to permit a user to view information provided from the base station 218 for use in analyzing and debugging a system under test or development.

The base station 218 is based upon a general-purpose programmable hardware device such as a gate array configured to function as a functionally equivalent "virtual microcontroller" 220 (or other device under test (DUT)). This is accomplished using an associated integral memory 222 which stores program instructions, data, trace information and other associated information. Thus, the base station is configured as an emulator of the internal microprocessor portion of the microcontroller 232. In preferred embodiments, a field programmable gate array FPGA (or other programmable logic device) is configured to function as the virtual microcontroller 220. More particularly, virtual microcontroller 220 is implemented within the FPGA of base station 218. The base station 218 is coupled (e.g., using a four wire interface 226) to a standard production microcontroller 232 mounted in a mounting device referred to as a "pod". The pod, in certain embodiments, provides connections to the microcontroller 232 that permit external probing as well as interconnection with other circuitry as might be used to simulate a system under development.

In one embodiment, system 200 is adapted to test the CY8C25xxx/26xxx series of microcontrollers made by Cypress MicroSystems, Inc., 22027 17th Avenue SE, Suite 201, Bothell, Wash. 98021. In this embodiment FPGA 220 emulates the core processor functionality (microprocessor functions, Arithmetic Logic Unit functions and RAM and ROM memory functions) of the Cypress MicroSystems CY8C25xxx/26xxx series microcontrollers. Detailed information regarding this commercial product is available from Cypress MicroSystems, Inc., in the form of version 1.11 of "PSOC DESIGNER: Integrated Development Environment User Guide", which is hereby incorporated by reference in its entirety as background material. While the present invention is described in terms of an ICE system for the above exemplary microcontroller device, the invention is equally applicable to other complex circuitry including microprocessors and other circuitry that is suitable for analysis and debugging using in-circuit emulation. Moreover, the invention is not limited to the exact implementation details of the exemplary embodiment used herein for illustrative purposes.

In order to minimize the need for any special ICE related functions on microcontroller 232, the FPGA 220 and associated circuitry of the base station 218 are designed to operate functionally in a manner identically to that of the microprocessor portion of the production microcontroller, but to provide for access to extensive debug tools including readout of registers and memory locations to facilitate traces and other debugging operations.

Virtual microcontroller 220 operates to execute the code programmed into microcontroller 232 in lock-step operation with microcontroller 232. Thus, there is no need to provide special facilities for ICE in microcontroller 232, since any such facilities are provided in virtual microcontroller 220. Virtual microcontroller 220 and microcontroller 232 operate together such that I/O reads and interrupts are fully supported in real time. The combination of real and virtual microcontroller behave just as the microcontroller 232 would alone under normal operating conditions. I/O reads and interrupt vectors are transferred from the microcontroller 232 to the base station 218 as will be described later. Base station 218 is then able to provide the host computer 210 with the I/O reads and interrupt vectors as well as an array of information internal to microcontroller 232 within memory and register locations that are otherwise inaccessible.

In the present embodiment, the design of microcontroller 232 is implemented using the VERILOG® language (or other suitable language). Thus, the full functional design description of the microcontroller is available in a software format. In one embodiment base station 218 is based upon the commercially available SPARTAN® series of FPGAs from Xilinx, Inc., 2100 Logic Drive, San Jose, Calif. 95124. The VERILOG® description can be used as the input to the FPGA design and synthesis tools available from the FPGA manufacturer to realize the virtual microcontroller 220 (generally after timing adjustments and other debugging). Thus, design and realization of the FPGA implementation of an emulator for the microcontroller (virtual microcontroller) or other device can be readily achieved by use of the VERILOG® description along with circuitry to provide interfacing to the base station and the device under test (DUT).

Continuing with FIG. 1, the actual production microcontroller 232 carries out its normal functions in the intended application and passes I/O information and other information needed for debugging to FPGA 220. Virtual microcontroller 220 serves to provide the operator with visibility into the core processor functions that are inaccessible in the production microcontroller 232. Thus, FPGA 220, by virtue of operating in lock-step operation with the microcontroller 232 provides an exact duplicate of internal registers, memory contents, interrupt vectors and other useful debug information. Additionally, memory 222 can be used to store information useful in trace operations that is gathered by the FPGA 220 during execution of the program under test. This architecture, therefore, permits the operator to have visibility into the inner workings of the microcontroller 232 without need to provide special bondouts and expensive circuitry on the microcontroller itself.

Virtual microcontroller 220, operating under control of host computer 210, carries out the core processor functions of microcontroller 232 and thus should always try to contain a functionally exact emulated copy of the contents of the registers and memory of microcontroller 232. To maintain this data integrity, certain data is passed from the microcontroler to the FPGA, e.g., data that comes on an external data or peripheral bus coupled only to the microcontroller. The ICE system starts both microcontrollers (real and virtual) at the same time and keeps them running in synchronization. Microcontroller 232 sends I/O data to base station 218 (and in turn to the ICE software operating on the host computer 210 if required) fast enough to keep the microcontroller 232 and virtual microcontroller 220 of base station 218 in synchronization. Whenever the system is halted (i.e., when the system is not emulating), other information (e.g., flash memory programming functions, test functions, etc.) can be sent over the interface.

Because microcontroller 232 operates in synchronization with virtual microcontroller 220, less data needs to be sent over the four-wire interface than would be required in an ICE system otherwise. The type of data sent over the lines is allowed to change depending on when the data is sent in the execution sequence. For example, depending on the execution sequence time, the information sent over the data lines can be commands to microcontroller 232 or can be data. Since the clock frequency of microcontroller 232 is programmable, it copies its current clock on one of the lines of the four wire interface. Moreover, virtual microcontroller 220 does not require certain resources of the microcontroller 232 such as timers, counters, amplifiers, etc. since they are fully implemented in virtual microcontroller 220. In addition, since all registers and memory locations, etc. are available through the virtual microcontroller 220, the microcontroller 232 (or other DUT) can be debugged in real time without need for extensive debug logic residing on the microcontroller 232.

In the embodiment illustrated, the basic interface used is a four-line interface between microcontroller 232 and base station 218. The four-wire interface 226 of the present embodiment can be functionally divided into two functional portions, a data transport portion 242 and a clock portion 246. Three additional lines are also provided (not shown) for supply, ground and a reset line.

The data transport portion 242 includes two data lines. The first data line (data1) provides a data signal to send I/O data to virtual microcontroller 220. The first data line is also used to notify FPGA 220 of pending interrupts. The Data1 line is only driven by microcontroller 232. A second data line (Data2), which is bidirectional, is used by the microcontroller 232 to send I/O data to the FPGA based virtual microcontroller of base station 218. In addition, the FPGA 220 uses the Data2 line to convey halt requests (e.g., to implement simple or complex breakpoints) and other information to the microcontroller 232.

The clock portion 246 includes a debug system clock (data clock) line and a microcontroller clock line. The data clock line provides a data clock signal (U_-HCLK) from a 24/48 MHz data clock driven by microcontroller 232. This clock is used to drive the ICE virtual microcontroller communication state machines (the logic used within the state controller to communicate with the microcontroller 232) and to regulate data transfer and other operations. The second clock interface line (uCONTROLLER CLOCK) is the internal microcontroller CPU clock of microcontroller 232. In the present embodiment, the data clock runs at 24 MHz, unless the internal microcontroller 232 clock is running at 24 MHz (when the clock (U_CCLK) of microcontroller 232 is running at 24 MHz, the data clock signal switches to 48 MHz).

In the present embodiment, the four-line interface 226 forms a part of a seven wire connection as described below. The interface signals travel over a short (e.g., one foot) of CAT5 network cable. In the present embodiment, a fifth line (not shown) is be used to provide a system reset signal to effect the simultaneous startup of both microcontrollers. This fifth line provides a convenient mechanism to reset the microcontrollers, but in most environments, the simultaneous startup can also be effected in other ways including switching of power. In the present embodiment, the reset signal line outputs an optional active high reset signal (ICE_POD_RST) to microcontroller 232. Sixth and Seventh lines (not shown) are provided in the current interface to provide power and ground for power supply. More particularly, an optional power supply wire provides power (ICE_POD_PW_R) to microcontroller 232 and an optional ground wire provides ground (ICE_POD_GND) to microcontroller 232.

Synchronization between microcontroller 232 and virtual microcontroller 220 is achieved by virtue of their virtually identical operation. They are both started simultaneously by a power on or reset signal. They then track each other's operation continuously executing the same instructions using the same clocking signals. The system clock signal and the microcontroller clock signal are shared between the two microcontrollers (real and virtual) so that even if the microprocessor clock is changed during operation, they remain in lock-step.

Figure 2:
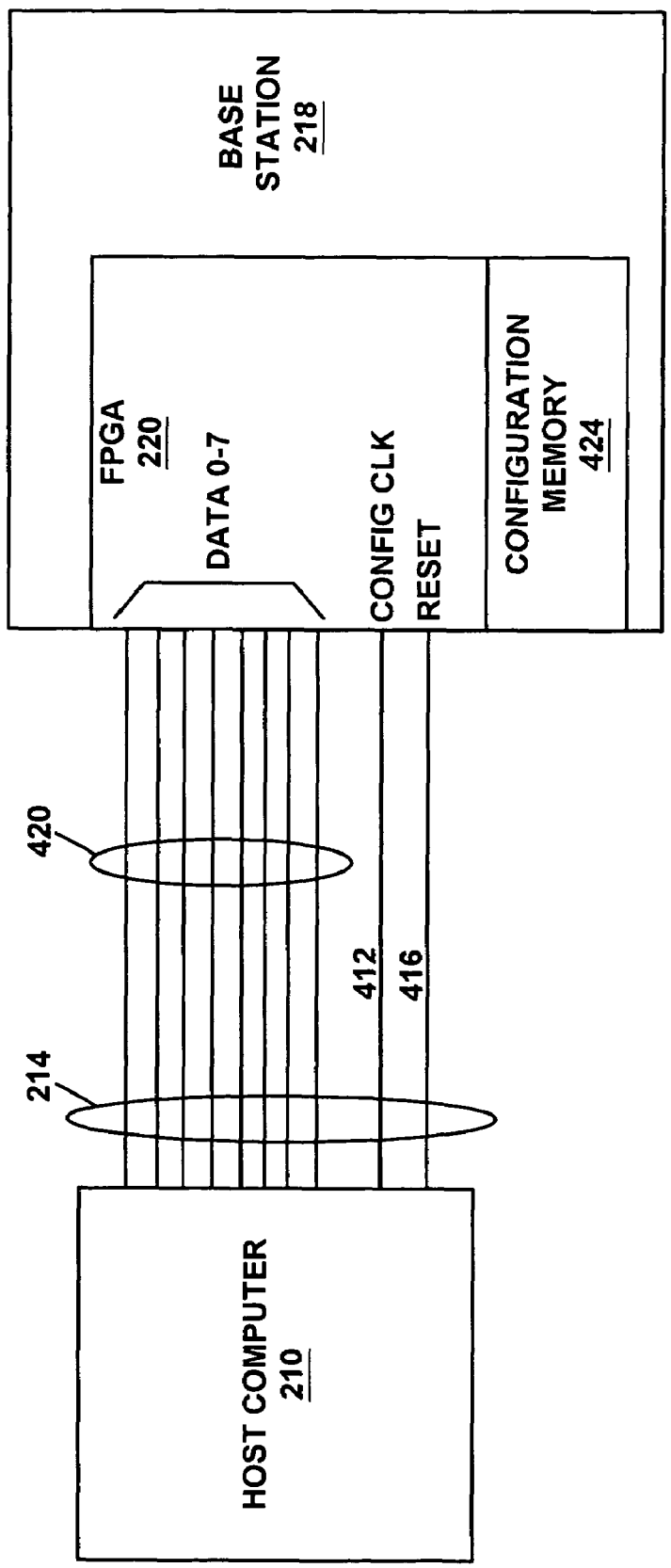
FIG. 2 is a block diagram that shows the host to FPGA interface in accordance with an embodiment of the present invention

Referring now to the block diagram of FIG. 2, the interface between the host processor 210 and the base station 218 of a preferred embodiment of the present invention is illustrated. In this embodiment, the connection between the host processor 210 and the FPGA 220 is advantageously provided using a standard IEEE 1284 parallel printer cable 214 with communication carried out using a modification of standard EPP (enhanced parallel port) communication protocol. Of particular interest in this communication interface is the data strobe connection 412, the INIT (initialize) connection 416 and the eight data connections (data line 0 through data line 7) 420. These connections are directly connected to the FPGA with the INIT connection connected to the FPGA RESET pin. The data strobe line 412 is connected to the FPGA configuration clock input and the eight data lines 420 are connected to data input pins of the FPGA.

When the software on the host is started, the INIT connection 416 is driven by the host computer 210 to a logic low causing the FPGA to clear its configuration memory 424 and begin receiving configuration data. The configuration data is stored in configuration memory to define the functionality of the FPGA. This configuration data is clocked in eight bits at a time over the data lines 420 using the data strobe signal as a clock signal. That is, an eight bit word is placed on the interface data lines 420 by host processor 210 followed by toggling the data strobe line to clock the data into the FPGA 220. This unidirectional data transfer from the host computer incorporates a set of design parameters that configure the circuitry of the FPGA 220 to function, in part, as a standard IEEE 1284 EPP interface once the FPGA 220 is programmed and functional. This programming configures the FPGA 220 to have an IEEE 1284 EPP interface with the data lines 420 connected to the FPGA as bidirectional data lines, the configuration clock configured to operate as the IEEE 1284 data clock line connected to data strobe 412 and the INIT line 416 continues to drive the FPGA clear and reset function.

Data transfer continues in this manner until the FPGA 220 is fully programmed by virtue of having received the correct amount of data required by the particular FPGA 220 used in base station 218. Thus, each time the host software is initialized, a data transfer to the FPGA 220 occurs to program the FPGA 220 to function in its capacity of a virtual microcontroller (in this embodiment). Once programming ceases, the FPGA 220 operates as a virtual microcontroller (or whatever device is programmed into the FPGA 220 in general). At this point, the interface 214 ceases to function as a unidirectional programming interface and begins to function as a bidirectional communication interface using the programmed operation of the FPGA 220 communicating through its programmed IEEE 1284 EPP parallel communication interface.

In the virtual microcontroller mode of operation of the FPGA 220, communication is carried out using the eight data lines 420 as bidirectional data lines compliant with IEEE 1284 EPP parallel communication protocol with the data strobe line 412 used as a data clock and the INIT line 416 continuing to act as a clear and reset signal. INIT line 416 can thus be used to reinitialize the programming of the FPGA 220, for example, to revise a design parameter or to simply restart the ICE system.

In the present embodiment, data strobe interface line provides a unidirectional programming clock in the program mode function and provides an EPP Compliant data strobe in the free running "Awake" mode function. In the program mode function Data bits 0 through 7 provide Unidirectional data into the FPGA while in the free running "awake" mode function data bits 0 through 7 provide EPP compliant communication. A low signal on the INIT interface line in the program mode function indicates clear configuration memory (prepare to receive new configuration data) and low signal on the INIT interface line in the free running "awake" mode function indicates clear configuration memory and enter programming mode (prepare to receive new configuration data).

Normal operation of the current microcontroller is carried out in a cycle of two distinct stages or phases as illustrated in connection with FIG. 3. The cycle begins with the initial startup or reset of both the microcontroller 232 and the virtual microcontroller 220 at 304. Once both microcontrollers are started in synchronism, the data phase 310 is entered in which serialized data is sent from the microcontroller to the virtual microcontroller. At the start of this phase the internal start of instruction (SOI) signal signifies the beginning of this phase will commence with the next low to high transition of the system clock. In the current embodiment, this data phase lasts four system clock cycles, but this is only intended to be exemplary and not limiting. The SOI signal further indicates that any I/O data read on the previous instruction is now latched into a register and can be serialized and transmitted to the virtual microcontroller. Upon the start of the data phase 310, any such I/O read data (eight bits of data in the current embodiment) is serialized into two four bit nibbles that are transmitted using the Data0 and Data1 lines of the current interface data portion 242. One bit is transmitted per data line at the clock rate of the system clock. Thus, all eight bits are transmitted in the four clock cycles of the data transfer phase.

At the end of the four clock cycle data transfer phase in the current embodiment, the control phase 318 begins. During this control phase, which in the current embodiment may be as short as two microcontroller clock periods (or as long as about fourteen clock periods, depending upon the number of cycles required to execute an instruction), the microcontroller 232 can send interrupt requests, interrupt data, and watchdog requests. Additionally, the virtual microcontroller 220 can issue halt (break) commands. If a halt command is issued, it is read by the microcontroller at the next SOI signal. Once the control phase ends, the data transfer phase repeats. If there is no data to transfer, data1 and data2 remain idle (e.g., at a logic low state). To simplify the circuitry, I/O bus data are sent across the interface on every instruction, even if it is not a bus transfer. Since the virtual microcontroller 220 is operating in synchronization with microcontroller 232 and executing the same instructions, the emulation system knows that data transferred during non I/O read transfers can be ignored.

Figure 4:
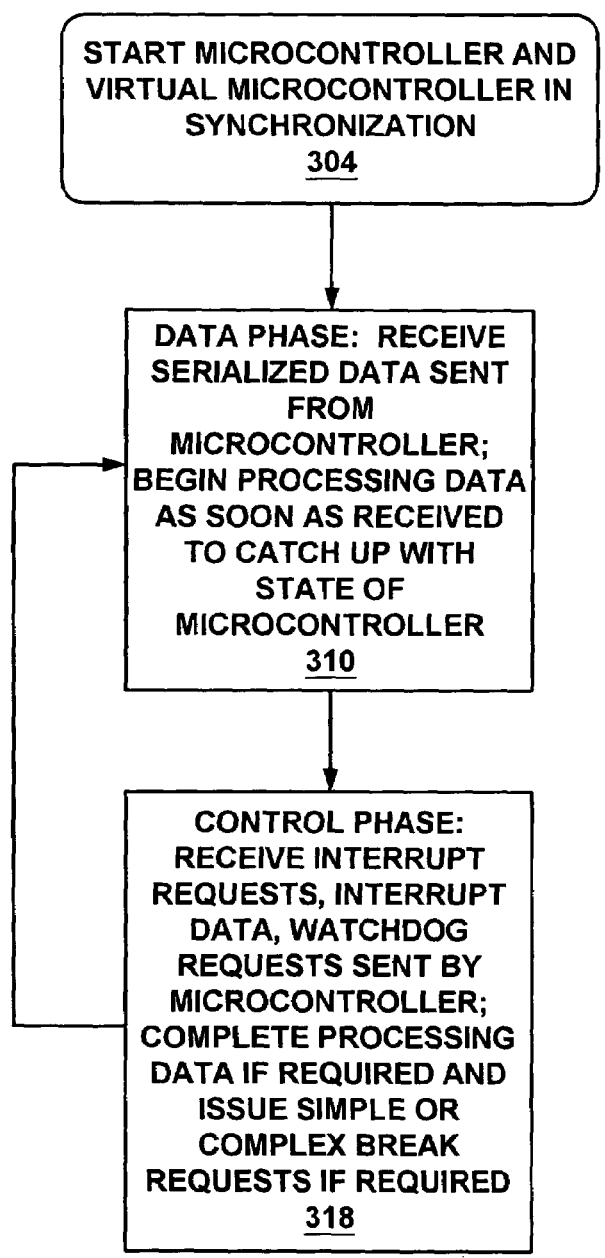
FIG. 4 is an illustration of the operational phases of an In-Circuit Emulation system viewed from a virtual microcontroller perspective in accordance with an embodiment of the present invention.

FIG. 4 shows this operational cycle from the perspective of the virtual microcontroller 220. During the data transfer phase 310, the serialized data is received over Data0 and Data1. It should be noted that prior to receipt of this I/O data, the microcontroller 232 has already had access to this data for several clock cycles and has already taken action on the data. However, until receipt of the I/O read data during the data transfer phase 310, the virtual microcontroller 220 has not had access to the data. Thus, upon receipt of the I/O read data during the data phase 310, the virtual microcontroller 220 begins processing the data to catch up with the existing state of microcontroller 232. Moreover, once the I/O data has been read the host computer 210 or virtual microcontroller 220 may determine that a complex or simple breakpoint has been reached and thus need to issue a break request. Thus, the virtual microcontroller should be able to process the data quickly enough to make such determinations and issue a break request prior to the next SOI. Break requests are read at the internal SOI signal, which also serves as a convenient reference time marker that indicates that I/O data has been read and is available for transmission by the microcontroller 232 to the virtual microcontroller 220.

By operating in the manner described, any breakpoints can be guaranteed to occur in a manner such that both virtual microcontroller 220 and microcontroller 232 halt operation in an identical state. Moreover, although virtual microcontroller 220 and the microcontroller 232 operate on I/O data obtained at different times, both microcontrollers are in complete synchronization by the time each SOI signal occurs. Thus, virtual microcontroller 220 and microcontroller 232 can be said to operate in lock-step with respect to a common time reference of the SOI signal as well as with respect to execution of any particular instruction within a set of instructions being executed by both virtual microcontroller 220 and microcontroller 232.

In accordance with certain embodiments of the invention, a mechanism is provided for allowing FPGA 220 of base station 218 and microcontroller 232 to stop at the same instruction in response to a breakpoint event (a break or halt). The FPGA 220 has the ability monitor the microcontroller states of microcontroller 232 for a breakpoint event, due to its lock-step operation with microcontroller 232. In the process of executing an instruction, an internal start of instruction cycle (SOI) signal is generated (by both microcontrollers) that indicates that the device is about to execute a next instruction. If a breakpoint signal (a halt or break signal—the terms "halt" and "break" are used synonymously herein) is generated by the FPGA, the execution of the microcontroller 232 can be stopped at the SOI signal point before the next instruction starts.

Although the SOI signal is labeled as a signal indicating the start of an instruction, the SOI signal is used for multiple purposes in the present microcontroller. It is not required that the SOI signal actually indicate a start of instruction for many purposes, merely that there be a convenient time reference on which to base certain actions. For example, any reference signal that always takes place prior to execution of an instruction can be used as a time reference for reading a halt command. Accordingly, any such available or generated reference signal can be used equivalently as a "halt read" signal without departing from the present invention. That not withstanding, the SOI signal is conveniently used in the current embodiment and will be used as a basis for the explanation that follows, but should not be considered limiting.

Logic within the FPGA 220 of base station 218 allows not only for implementation of simple breakpoint events, but also for producing breakpoints as a result of very complex events. By way of example, and not limitation, a breakpoint can be programmed to occur when a program counter reaches 0x0030, an I/O write is happening and the stack pointer is about to overflow. Other such complex breakpoints can readily be programmed to assist in the process of debugging. Complex breakpoints are allowed, in part, also because the virtual microcontroller 220 has time to carry out complex computations and comparisons after receipt of I/O data transfers from the microcontroller 232 and before the next instruction commences. After the receipt of I/O data from the microcontroller 232, the FPGA 220 of base station 218 has a relatively long amount of computation time to determine if a breakpoint event has occurred or not. In the event a breakpoint has occurred, the microcontroller 232 can be halted and the host processor 210 is informed.

An advantage of this process is that the FPGA 220 and the microcontroller 232 can be stopped at the same time in response to a breakpoint event. Another advantage is that complex and robust breakpoint events are allowed while still maintaining breakpoint synchronization between the two devices. These advantages are achieved with minimal specialized debugging logic (to send I/O data over the interface) and without special bond-out circuitry being required in the microcontroller device under test 232.

Figure 3:
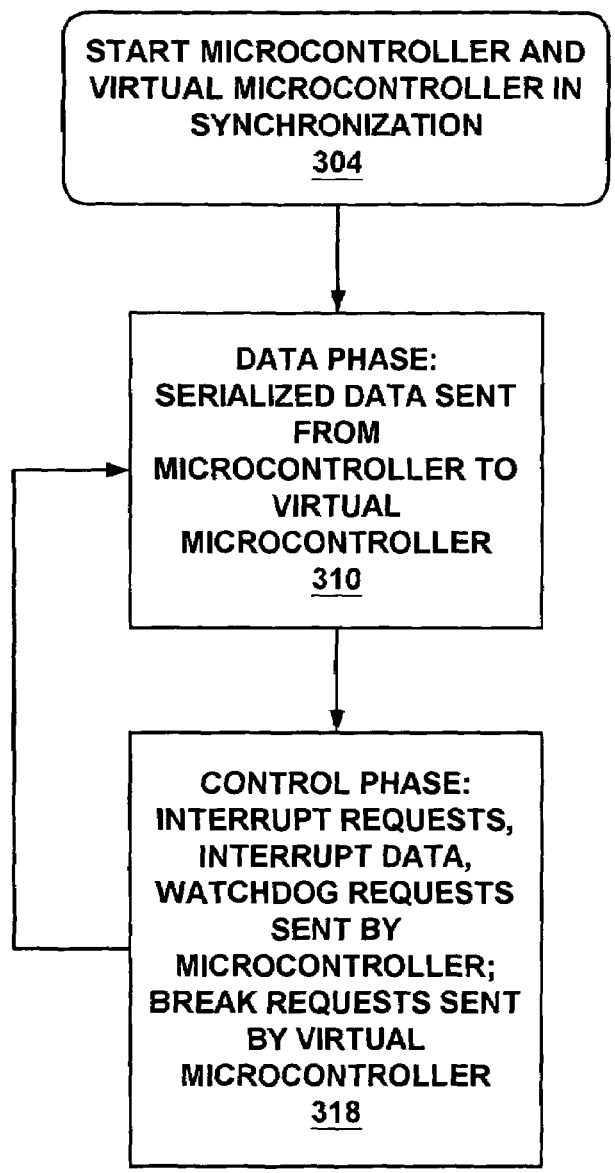
FIG. 3 is an illustration of the operational phases of an In-Circuit Emulation system in accordance with an embodiment of the present invention.
Figure 5:
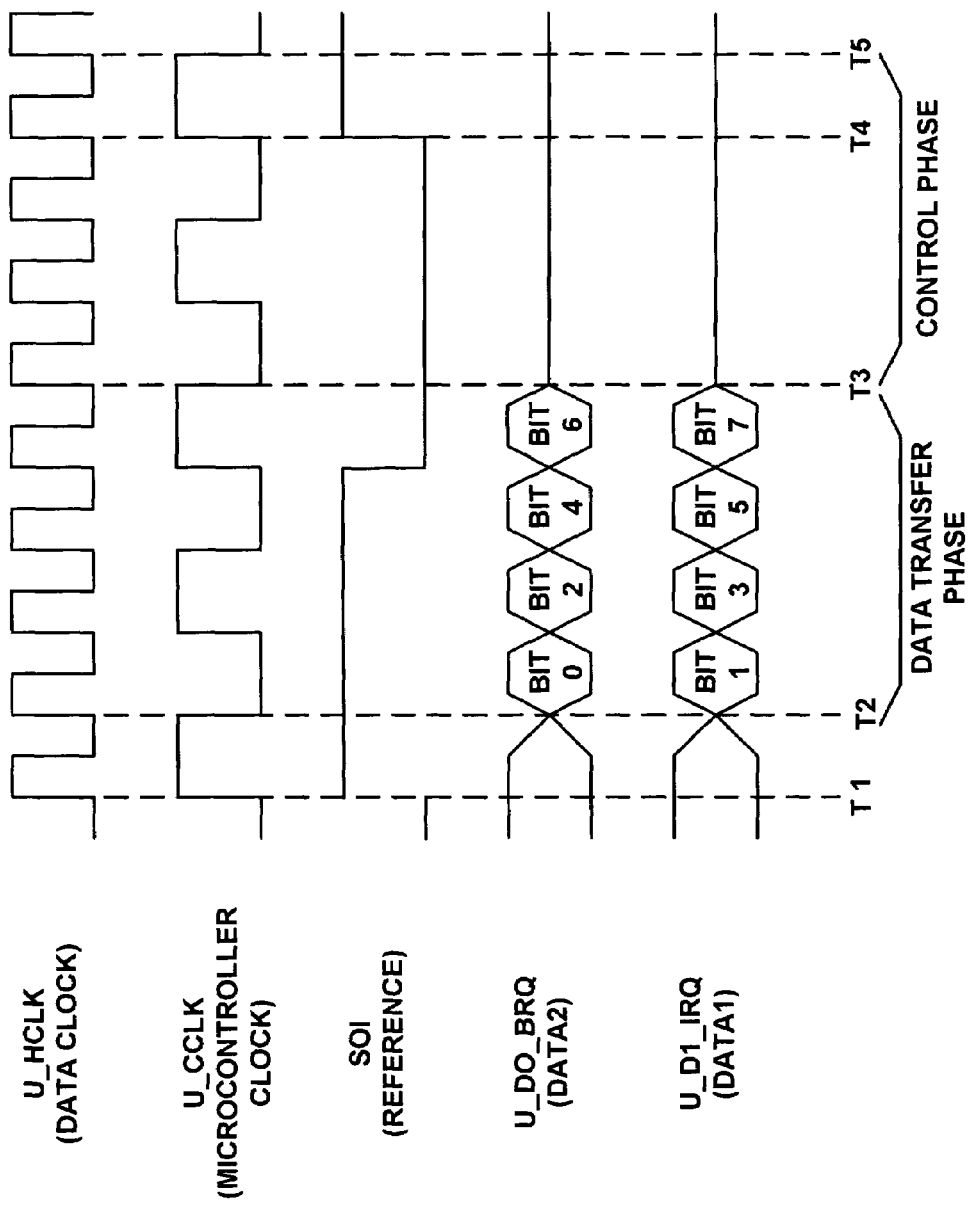
FIG. 5 is an exemplary timing diagram illustrating a data and control phase of operation in accordance with an embodiment of the present invention.

A transfer of I/O data as previously described with reference to FIGS. 3-4 is illustrated with reference to the timing diagram of FIG. 5. After the microcontroller 232 completes an I/O read instruction, it sends the read data back to the base station 218 to the virtual microcontroller, since the virtual microcontroller 220 of the present embodiment implements only the core processor functions (and not the I/O functions). The ICE system can expect the incoming data stream for an I/O read to commence with the first positive edge of U_HCLK (the debug or system clock) when SOI signal for the following instruction is at a predetermined logic level (e.g., a logic high). Thus, at time T1, the SOI signal makes a transition to a logic high and one system clock cycle later at time T2, the data transfer phase 310 begins. This timing allows the ICE system to get the read data to the emulated accumulator of base station 218 before it is needed by the next instructions execution. Note that the first SOI pulse shown in FIG. 5 represents the first SOI following the I/O read instruction (but could be any suitable reference time signal). Transfer of the data from the microcontroller 232 is carried out using the two data lines (data2 and data1, shown as U_D0_BRK and U_D1_IRQ) with each line carrying four bits of an eight bit word. During this data transfer phase 310, an eight bit transfer representing the I/O read data can take place from the microcontroller 232 to the base station 210 in the four clock cycles between T2 and T3. The control phase 318 starts at time T3 and continues until the beginning of the next data transfer phase 310. The SOI signal at T4 indicates that the next data transfer phase is about to start and serves as a reference time to read the data2 line to detect the presence of any halt signal from the virtual microcontroller 220. The current control phase 318 ends at T5 and the next data transfer phase 310 begins.

The base station 218 only transmits break (halt) commands to the microcontroller 232 during the control phase. After the microcontroller 232 is halted in response to the break command, the interface can be used to implement memory/register read/write commands. The halt command is read at the SOI signal transition (T1 or T4). The microcontroller 232 uses the interface to return register information when halted, and to send I/O read, interrupt vector and watchdog timer information while running.

In the case of an interrupt, if an interrupt request is pending for the microcontroller 232, the system asserts U_D1_IRQ as an interrupt request during the control phase of the microcontroller 232. Since the interrupt signal comes to the virtual microcontroller 220 from the microcontroller 232 during the control phase, the virtual microcontroller 220 knows the timing of the interrupt signal going forward. That is, the interrupt signal is the synchronizing event rather than the SOI signal. In case of an interrupt, there is no SOI, because the microcontroller 232 performs special interrupt processing including reading the current interrupt vector from the interrupt controller. Since program instructions are not being executed during the interrupt processing, there is no data/control phase. The virtual microcontroller 220 expects the interrupt vector to be passed at a deterministic time across the interface during this special interrupt processing and before execution of instructions proceeds. Since the virtual microcontroller 220 of the current embodiment does not implement an interrupt controller, interrupt vectors are read from the interrupt controller upon receipt of an interrupt request over the interface. The interrupt vector data is passed over the interface using the two data lines as with the I/O read data, following the assertion of an internal microcontroller IVR_N (active low) signal during the control phase. In the current embodiment, an interrupt cycle is approximately 10 clock cycles long. Since the interrupt service cycle is much longer than the time required to transfer the current interrupt vector, the data is easily transferred using the two data lines, with no particular timing issues.

If the microcontroller 232 undergoes a watchdog reset, it asserts the IRQ (interrupt) and BRQ (break) lines indefinitely. The ICE detects this condition and further detects that the microcontroller clock has stopped. This is enough to establish that a watchdog reset has occurred. The ICE applies an external reset, and notifies the ICE software in the host computer 210.

Method for Performing a Sleep Operation

Figure 6:
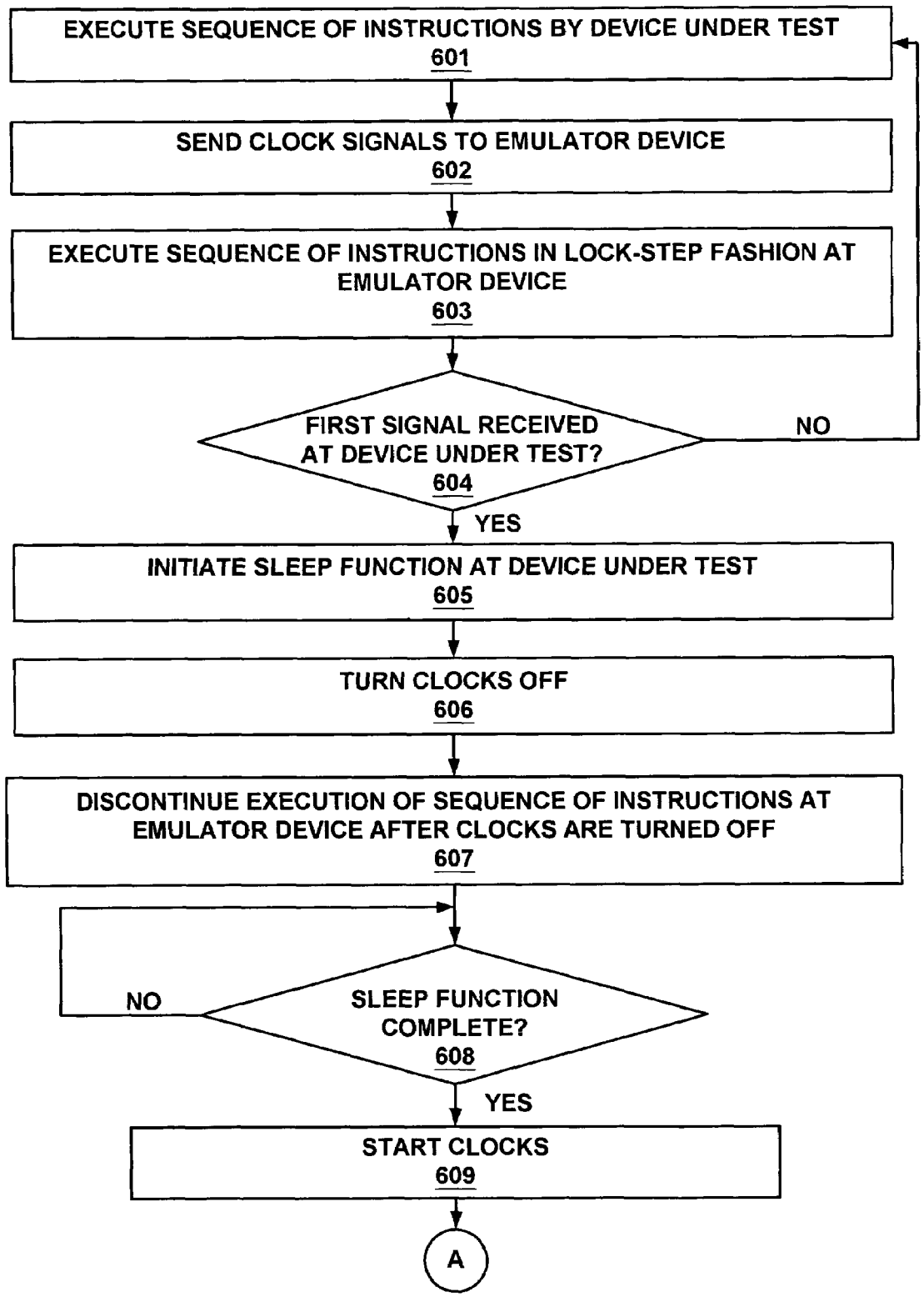
FIG. 6 is a flow chart that illustrates a method for performing a sleep operation in accordance with an embodiment of the present invention.
Figure 6:
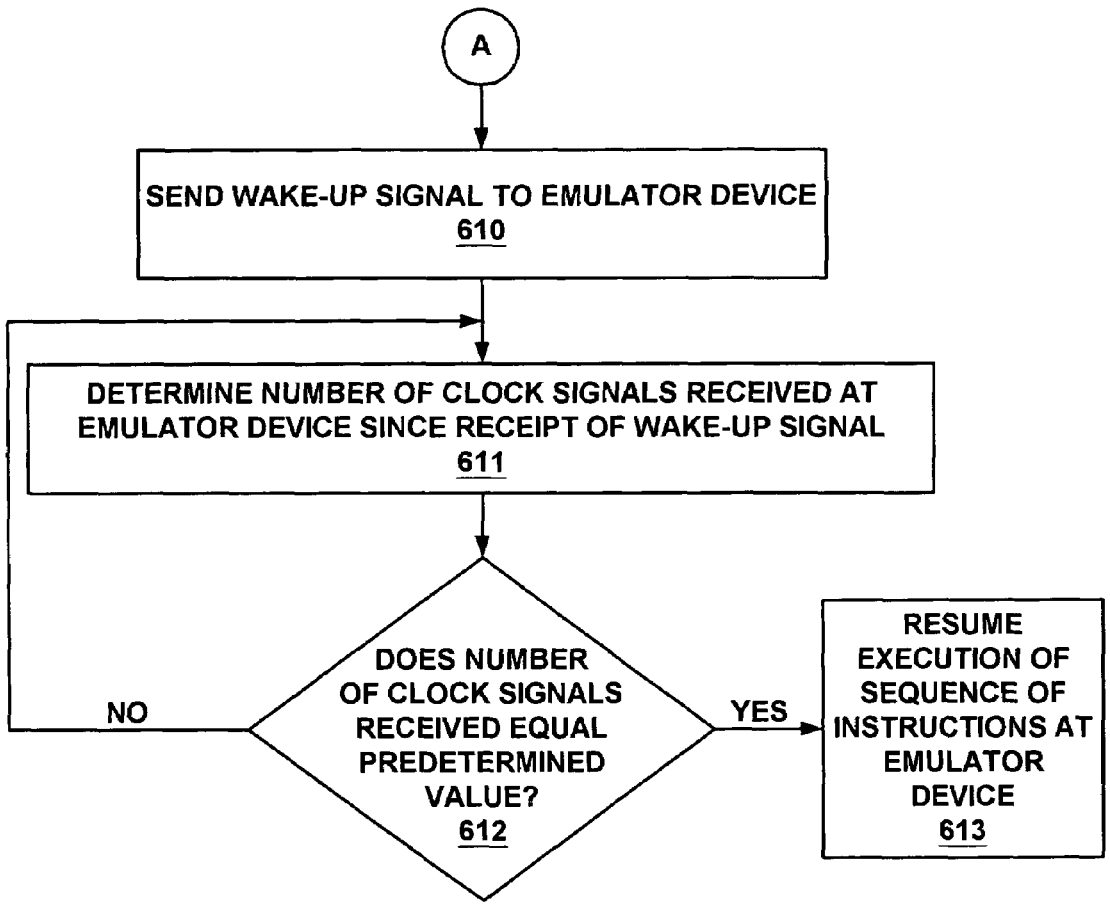

Referring now to FIG. 6, a method for performing a sleep operation is disclosed for a system that includes a device under test and that includes an emulator device that emulates the functions of the device under test. During operation of the device under test and the emulator device, a sequence of instructions are executed by the device under test as shown by step 601. The device under test conveys clock signals to the emulator device as shown by step 602. The emulator device executes the sequence of instructions in lock-step fashion as shown by step 603. In the present embodiment, the device under test is microcontroller 232 of FIG. 1 and the emulator device is virtual microcontroller (FPGA) 220 of FIGS. 1-2 that operate in lock-step fashion as shown in FIGS. 3-5.

When the sleep function is to be initiated, the operating program sends a first signal to the device under test. In one embodiment, the first signal is generated internally within microcontroller 232 of FIG. 1 and the first signal is sent to a register within microcontroller 232 that is used for initiating the sleep function. However, alternatively, other sources could generate the first signal.

As shown by steps 604-605, upon receiving the first signal at the device under test, the sleep function is initiated by the device under test. In the current embodiment the sleep function is a standard function performed by microcontroller 232 in which execution of instructions are halted. The sleep function is commonly used to conserve power.

As shown by step 606 the clocks are turned off. In the embodiment shown in FIGS. 1-2, microcontroller 232 is operable upon initiating the sleep function to shut down the clocks. In the present embodiment microcontroller 232 is operable to shut down the microcontroller CPU clock and the data clock.

Referring to step 607, upon turning off the clocks as shown in step 606, the emulator device discontinues execution of the sequence of instructions. More particularly, with reference to FIG. 1, FPGA 220 ceases execution of the sequence of instructions that are performed in lock-step with microcontroller 232 when clock signals are no longer received. In the present invention, FPGA ceases performing the core processing functions of microcontroller 232 (which are performed in lock-step). However, other communications and operations can still be conducted such as, for example, communication with host computer 210 shown in FIGS. 1-2.

As shown by steps 608-609 when the device under test has completed the sleep function, the device under test turns back on the clocks (step 609) and sends a second signal, referred to as a "wake-up signal" to the emulator device (step 610). This wake-up signal is simply an indication that the emulator device is to wake up. With reference to FIG. 1, in the present embodiment, the wake-up signal is a pulse on interface 242.

As shown by step 611, a determination is made as to the number of clock signals received at the emulator device since the wake-up signal was received. With reference to FIG. 1, in the present embodiment, FPGA 220 initiates a counter that counts the number of clock signals received.

The execution of instructions at the emulator device is resumed as shown by steps 612-613 when the determined number of clock signals received at the emulator device since the wake-up signal was received equals a predetermined value. More particularly, with reference to FIG. 1, in the present embodiment, FPGA 220 resumes execution of the set of instructions that are performed in lock-step with microcontroller 232 (e.g., the core processing functions of microcontroller 232).

In the present embodiment, upon receiving the signal sent in step 610 a counter is reset. The counter is incremented each time that a clock signal is received. When the number of received clock signals equals the predetermined value, execution of code resumes. In the present embodiment, a predetermined value of seven is used. However, other values could also be used. In the present embodiment, microcontroller 232 resumes execution of instructions after the predetermined number of clock signals have been sent. Thereby, both the device under test and the emulator device resume execution of code in lock-step fashion.

Method for Performing a Stall Operation

Figure 7:
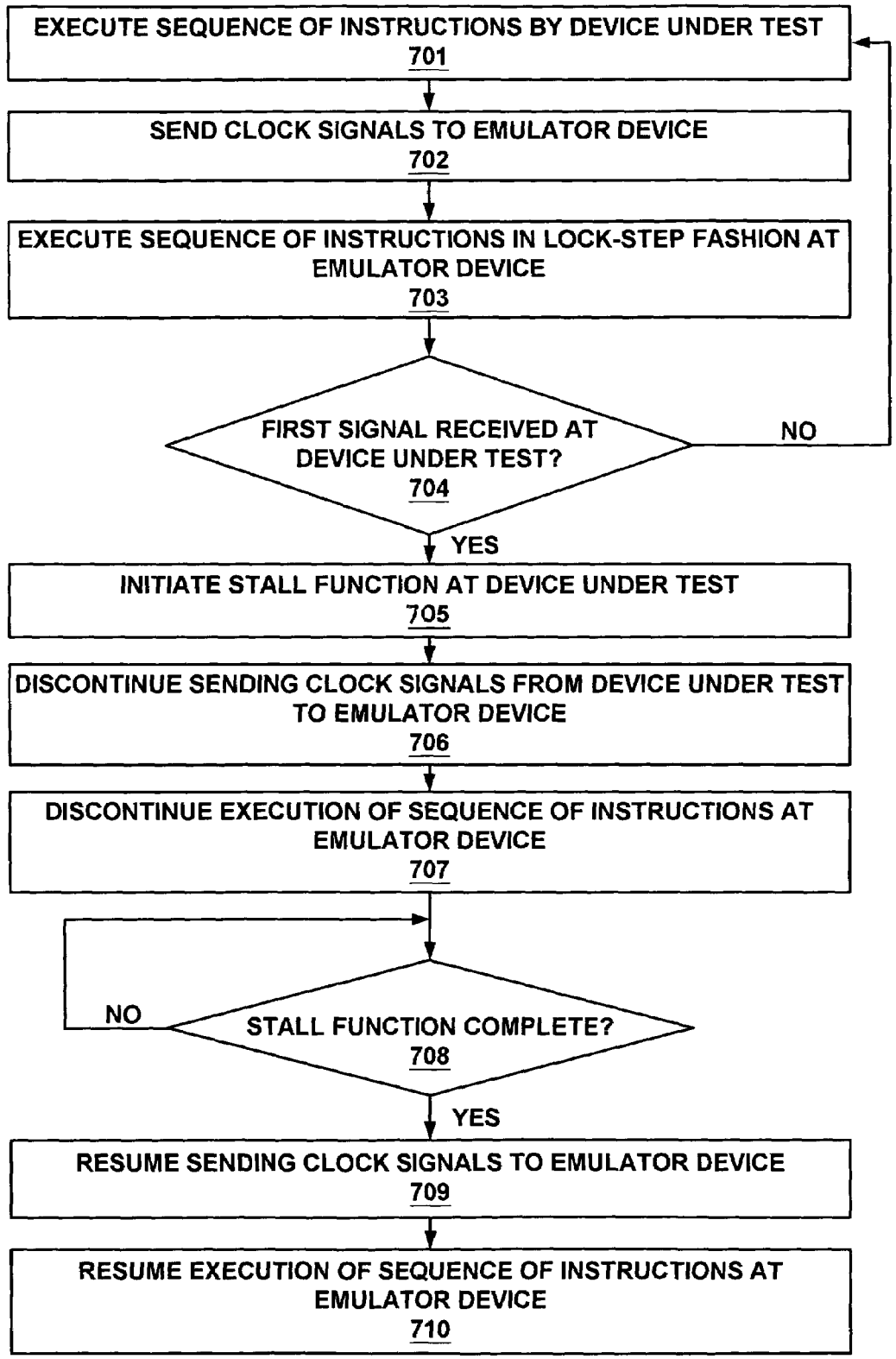
FIG. 7 is a flow chart that illustrates a method for performing a stall operation in accordance with an embodiment of the present invention.

Referring now to FIG. 7, a method 700 for performing a stall operation is disclosed for a system that includes a device under test and that includes an emulator device that emulates the functions of the device under test. During operation of the device under test and the emulator device, instructions are executed by the device under test as shown by step 701. The device under test conveys clock signals to the emulator device as shown by step 702. The emulator device executes the instructions in lock-step fashion as shown by step 703. In the present embodiment, the device under test is microcontroller 232 of FIG. 1 and the emulator device is virtual microcontroller (FPGA) 220 of FIGS. 1-2 that operate in lock-step fashion as shown in FIGS. 3-5.

When the stall function is to be initiated, the operating program sends a first signal to the device under test. As shown by steps 704-705, upon receiving the first signal at the device under test, the stall function is initiated by the device under test. In one embodiment, the first signal is generated internally within microcontroller 232 of FIG. 1 and the first signal is sent to a register within microcontroller 232 that is used for initiating the stall function. However, alternatively, other sources could generate the first signal.

As shown by step 706 the device under test discontinues sending clock signals to the emulator device. In the embodiment shown in FIGS. 1-2, microcontroller 232 is operable upon initiating the stall function to bring the microcontroller clock signal transmitted over the second clock interface line to low and maintain a low signal. Thereby, clock signals are no longer sent to virtual microcontroller (FPGA) 220. However, in the present embodiment, the microcontroller CPU clock continues to run as the stall function is carried out by microcontroller 232.

Referring to step 707, the emulator device discontinues execution of instructions. More particularly, with reference to FIG. 1, in the present embodiment, FPGA 220 ceases execution of the set of instructions that are performed in lock-step with microcontroller 232 when clock signals are no longer received over the second clock interface line. In the present invention, the FPGA ceases performing the core processing functions of microcontroller 232 (which are performed in lock-step). However, other communications and operations can still be conducted such as, for example, communication with host computer 210 shown in FIGS. 1-2.

As shown by steps 708-709 when the stall function has been completed by the device under test, the device under test resumes sending clock signals to the emulator device. In the embodiment shown in FIGS. 1-2, microcontroller 232 is operable when the stall function is completed to resume operation of the microcontroller CPU clock. Thereby, clock signals are sent from microcontroller 232 to virtual microcontroller (FPGA) 220.

The emulator device is operable upon receiving the clock signals to resume execution of the instructions as shown by step 710. More particularly, with reference to FIG. 1, in the present embodiment, FPGA 220 resumes execution of the set of instructions that are performed in lock-step with microcontroller 232 (e.g., the core processing functions of microcontroller 232) upon receiving the clock signals. In the present embodiment, execution of instructions that are to be performed in lock-step resumes upon the first received clock signal. However, alternatively execution of instructions that are performed in lock-step can be resumed after a predetermined number of clock cycles.

The device under test also resumes execution of instructions upon resumption of generation of clock signals. More particularly, in the embodiment shown in FIGS. 1-2, microcontroller 232 is operable when the stall function is completed to resume operation of microcontroller CPU clock. Microcontroller 232 then immediately begins to execute instructions. Accordingly, both microcontroller 232 and FPGA device 220 resume execution of instructions immediately upon resumption of operation of the CPU clock of microcontroller 232. Thereby, both the device under test and the emulator device resume execution of instructions in lock-step fashion.

Although the embodiments of the current invention have been explained in terms of providing in-circuit emulation of the core processing functions of a microcontroller, the present invention can be realized for any complex electronic device for which in-circuit emulation is needed including, but not limited to, microprocessors and other complex large scale integration devices without limitation. Moreover, although the mechanism for use of the interface between the host processor and the FPGA has been described in the environment of an ICE system, this should not be considered limiting since this interface mechanism can be used for other systems requiring FPGA programming and communication functions over a single interface.

Those skilled in the art will recognize that the present invention has been described in terms of exemplary embodiments based upon use of a programmed processor. However, the invention should not be so limited, since the present invention could be implemented using hardware component equivalents such as special purpose hardware and/or dedicated processors which are equivalents to the invention as described and claimed. Similarly, general purpose computers, microprocessor based computers, micro-controllers, optical computers, analog computers, dedicated processors and/or dedicated hard wired logic may be used to construct alternative equivalent embodiments of the present invention.

Those skilled in the art will appreciate that the program steps and associated data used to implement the embodiments described above can be implemented using disc storage as well as other forms of storage such as for example Read Only Memory (ROM) devices, Random Access Memory (RAM) devices; optical storage elements, magnetic storage elements, magneto-optical storage elements, flash memory, core memory and/or other equivalent storage technologies without departing from the present invention. Such alternative storage devices should be considered equivalents.

The present invention, as described in embodiments herein, is implemented using a programmed processor executing programming instructions that are broadly described above in flow chart form that can be stored on any suitable electronic storage medium or transmitted over any suitable electronic communication medium. However, those skilled in the art will appreciate that the processes described above can be implemented in any number of variations and in many suitable programming languages without departing from the present invention. For example, the order of certain operations carried out can often be varied, additional operations can be added or operations can be deleted without departing from the invention. Such variations are contemplated and considered equivalent.

While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations as fall within the scope of the appended claims.

The invention claimed is:

1. A method for performing a sleep operation in a system that includes a device under test and an emulator device, said method comprising:
   a) executing instructions on said device under test;
   b) emulating the functions of said device under test by operating said emulator device in lock-step fashion with said device under test;
   c) performing a sleep operation, comprising:
      c1) upon receiving a first signal from an operating program that indicates that a sleep function is to be performed, initiating said sleep function at said device under test;
      c2) in response to said initiating said sleep function, turning off one or more clock of said device under test; and
      c3) discontinuing execution of instructions that are performed in lock-step by said emulator device upon turning off said clock;
   d) when said sleep function has been completed by said device under test, turning on said clock and sending a second signal from said device under test to said emulator device;
   e) receiving said second signal at said emulator device;
   f) determining the number of clock signals received at said emulator device since said second signal was received; and
   g) resuming execution of said instructions that are performed in lock-step at said emulator device when said determined number of clock signals received at said emulator device since said second signal was received equals a predetermined value.

2. The method of claim 1 wherein said clock comprises an internal CPU clock.

3. The method of claim 2 wherein said first signal is generated by said device under test and is transmitted internally to a register that indicates that a sleep function is to be performed.

4. The method of claim 1 wherein said device under test further comprises a microcontroller and wherein said first signal comprises a first bit, said first bit received at a register of said microcontroller to indicate that a sleep function is to be performed.

5. The method of claim 4 wherein said emulator device further comprises a Field Programmable Gate Array (FPGA) device.

6. A method for performing a stall operation in a system that includes a device under test and an emulator device, said method comprising:
   a) executing instructions on said device under test;
   b) emulating the functions of said device under test by operating said emulator device in lock-step fashion with said device under test; and
   c) performing a stall operation, comprising:
      c1) said device under test conveying clock signals to said emulator device;
      c2) upon receiving a first signal that indicates that a stall function is to be performed, initiating said stall function at said device under test;
      c3) upon receiving said first signal, discontinuing said sending of said clock signals from said device under test to said emulator device; and
      c4) discontinuing execution of said instructions that are performed in lock-step at said emulator device while said sending of said clock signals is discontinued.

7. The method according to claim 6 wherein said device under test is a microcontroller and wherein said emulator device includes a field programmable gate array (FPGA), said clock signals further comprising signals from said microcontroller central processing unit clock.

8. The method of claim 7 further comprising:
   resuming sending of said clock signals from said device under test to said emulator device when said stall function has been completed by said device under test, said emulator device operable upon receiving said clock signals to resume execution of said instructions that are performed in lock-step.

9. A method for performing a sleep operation, comprising:
   executing a sequence of instructions by a device under test, said device under test including at least one clock for generating clock signals;
   executing said sequence of instructions by an emulator device emulating the functions of said device under test, said emulator device executing said sequence of instructions in lock-step fashion with said device under test;
   receiving a first signal from an operating program at a register of said device under test that indicates that a sleep function is to be initiated;
   initiating said sleep function at said device under test upon receipt of said first signal;
   turning off said at least one clock of said device under test;
   discontinuing execution of instructions that are performed in lock-step by said emulator device upon said turning off of said clock;
   when said sleep function has been completed by said device under test, resuming generation of clock signals at said device under test and coupling said clock signals to said emulator device;

when said sleep function has been completed by said device under test, sending a second signal from said device under test to said emulator device;

receiving said second signal at said emulator device;

determining the number of clock signals received at said emulator device since said second signal was received; and resuming execution of said instructions that are performed in lock-step at said emulator device when said determined number of clock signals received at said emulator device since said second signal was received equals a predetermined value.

10. The method according to claim 9 wherein said device under test is a microcontroller and wherein said emulator device includes a field programmable gate array (FPGA).

11. The method of claim 10 wherein said at least one clock includes a microcontroller CPU clock.

12. The method of claim 9 wherein said first signal is a first bit, said sleep function initiated upon the receipt of said first bit at a register of said microcontroller.

13. A method for performing a stall operation, comprising:

executing a sequence of instructions by a device under test;

executing said sequence of instructions by an emulator device emulating the functions of said device under test, said emulator device executing said sequence of instructions in lock-step fashion with said device under test;

said device under test sending clock signals to said emulator device;

receiving a first signal at a register of said device under test that indicates that a stall function is to be initiated;

initiating said stall function at said device under test upon receipt of said first signal;

discontinuing said sending of said clock signals from said device under test to said emulator device upon initiation of a stall function at said device under test; and discontinuing execution of said sequence of instructions at said emulator device while said sending of said clock signals is discontinued.

14. The method according to claim 13 wherein said device under test is a microcontroller and wherein said emulator device includes a field programmable gate array (FPGA).

15. The method according to claim 14 wherein said clock signals further comprise signals from a central processing unit clock of said microcontroller.

16. The method of claim 15 further comprising:

resuming sending of said clock signals from said device under test to said emulator device when said stall function has been completed by said device under test, said emulator device operable upon receiving said clock signals to resume execution of said sequence of instructions.

17. The method of claim 16 wherein said sequence of instructions comprises the core processing functions of said microcontroller.

18. An in-circuit emulation system comprising:

a device under test that executes a sequence of instructions, said device under test operable upon receiving a first signal to initiate a stall function;

an emulator device for emulating the functions of said device under test, said emulator device operable so as to execute said sequence of instructions in lock-step fashion with said device under test, said emulator device configured for receiving clock signals sent by said device under test; and wherein said device under test sends clock signals to said emulator device, said device under test operable upon receiving said first signal to discontinue sending said clock signals to said emulator device, and said emulator device operable, upon said discontinuation of said clocks signals from said device under test, to discontinue execution of said sequence of instructions.

19. The in-circuit emulation system of claim 18 wherein said device under test is a microcontroller, said microcontroller operable to resume sending said clock signals to said emulator device when said stall function has been completed by said microcontroller, said emulator device operable upon receiving said clock signals to resume execution of said sequence of instructions.

20. The in-circuit emulation system of claim 19 wherein said clock signals further comprise signals from a central processing unit clock of said microcontroller.

21. The in-circuit emulation system of claim 20 wherein said emulator device comprises a field programmable gate array (FPGA).

22. An in-circuit emulation system comprising:

a device under test that executes a sequence of instructions, said device under test operable upon receiving a first signal from an operating program to initiate a sleep function at said device under test and to turn off a clock of said device under test responsive to said initiation, wherein said device under test comprises a microcontroller, said device under test operable when said sleep function has been completed by said device under test to turn on said at least one clock and to send a second signal to an emulator device; and said emulator device for emulating the functions of said device under test, said emulator device operable so as to execute said sequence of instructions in lock-step fashion with said device under test, said emulator device operable upon said turning off of said clock to discontinue execution of said sequence of instructions at said emulator device, wherein said emulator device operable upon receiving said second signal to determine the number of clock signals received at said emulator device since said second signal was received and said emulator device operable to resume execution of said sequence of instructions when said determined number of clock signals received at said emulator device since said second signal was received equals a predetermined value.

23. The in-circuit emulation system of claim 22 wherein said device under test is a microcontroller, and wherein said at least one clock further comprising a central processing unit clock of said microcontroller.

24. The in-circuit emulation system of claim 23 wherein said emulator device comprises a field programmable gate array (FPGA).

* * * * *